US009091927B2

(12) United States Patent
Tsuchimura et al.

(10) Patent No.: US 9,091,927 B2
(45) Date of Patent: Jul. 28, 2015

(54) POSITIVE RESIST COMPOSITION, AND RESIST FILM, RESIST-COATED MASK BLANK, RESIST PATTERN FORMING METHOD AND PHOTOMASK EACH USING THE COMPOSITION

(71) Applicant: FUJIFILM Corporation, Tokyo (JP)

(72) Inventors: Tomotaka Tsuchimura, Shizuoka (JP); Takeshi Inasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 6 days.

(21) Appl. No.: 14/073,322

(22) Filed: Nov. 6, 2013

(65) Prior Publication Data

US 2014/0072905 A1 Mar. 13, 2014

Related U.S. Application Data

(63) Continuation of application No. PCT/JP2012/062722, filed on May 11, 2012.

(30) Foreign Application Priority Data

May 12, 2011 (JP) ................................ 2011-107702

(51) Int. Cl.

| | |
|---|---|
| ***G03F 7/004*** | (2006.01) |
| ***G03F 1/20*** | (2012.01) |
| ***G03F 1/22*** | (2012.01) |
| ***G03F 1/78*** | (2012.01) |
| ***C08F 257/00*** | (2006.01) |
| ***G03F 7/039*** | (2006.01) |
| ***G03F 1/76*** | (2012.01) |
| *G03F 7/20* | (2006.01) |

(52) U.S. Cl.

CPC ................ *G03F 1/20* (2013.01); *C08F 257/00* (2013.01); *G03F 1/22* (2013.01); *G03F 1/76* (2013.01); *G03F 1/78* (2013.01); *G03F 7/039* (2013.01); *G03F 7/0392* (2013.01); *G03F 7/0397* (2013.01); *G03F 7/2039* (2013.01); *G03F 7/0045* (2013.01); *G03F 7/0046* (2013.01); *G03F 7/2037* (2013.01)

(58) Field of Classification Search

CPC ............... G03F 1/20; G03F 1/22; G03F 1/78; G03F 7/0392; G03F 7/0397; C08F 257/00

USPC ...................... 430/270.1, 4, 5, 326, 905, 942; 525/219, 359.2, 359.3, 359.4, 359.6, 525/385, 390

See application file for complete search history.

(56) References Cited

U.S. PATENT DOCUMENTS

| | | | | |
|---|---|---|---|---|
| 6,492,087 | B1 | 12/2002 | Brainard | |
| 2006/0172224 | A1 | 8/2006 | Cameron et al. | |
| 2008/0090179 | A1 | 4/2008 | Takeda et al. | |
| 2009/0004600 | A1 | 1/2009 | Akita et al. | |
| 2009/0202940 | A1 | 8/2009 | Hatakeyama et al. | |
| 2011/0294047 | A1 | 12/2011 | Koitabashi et al. | |
| 2011/0294070 | A1* | 12/2011 | Hatakeyama et al. | 430/285.1 |
| 2012/0301817 | A1* | 11/2012 | Inasaki et al. | 430/5 |

FOREIGN PATENT DOCUMENTS

| | | | |
|---|---|---|---|
| JP | 2000239538 | A | 9/2000 |
| JP | 200599558 | A | 4/2005 |
| JP | 2006146242 | A | 6/2006 |
| JP | 200895009 | A | 4/2008 |
| JP | 2008162101 | A | 7/2008 |
| JP | 2008-304590 | A | 12/2008 |
| JP | 20093242 | A | 1/2009 |
| JP | 2009086354 | A | 4/2009 |
| JP | 2009211050 | A | 9/2009 |
| JP | 201153365 | A | 3/2011 |
| WO | 2005023880 | A1 | 3/2005 |

OTHER PUBLICATIONS

International Search Report (PCT/ISA/210) dated Jun. 12, 2012 in International Application No. PCT/JP2012/062722.

Written Opinion (PCT/ISA/237) dated Jun. 12, 2012 in International Application No. PCT/JP2012/062722.

Office Action, Issued by the Japan Patent Office, Dated Oct. 28, 2014, In counterpart Japanese Application No. 2011-107702.

* cited by examiner

*Primary Examiner* — John Chu

(74) *Attorney, Agent, or Firm* — Sughrue Mion, PLLC

(57) ABSTRACT

A positive resist composition contains: (A) a polymer compound having a structure where a hydrogen atom of a phenolic hydroxyl group is replaced by an acid labile group represented by the following formula (I):

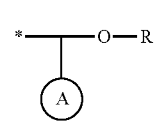

(I)

wherein R represents a monovalent organic group; A represents a group having a polycyclic hydrocarbon ring structure or a group having a polycyclic heterocyclic structure; and * represents a bonding position to an oxygen atom of the phenolic hydroxyl group.

13 Claims, No Drawings

POSITIVE RESIST COMPOSITION, AND RESIST FILM, RESIST-COATED MASK BLANK, RESIST PATTERN FORMING METHOD AND PHOTOMASK EACH USING THE COMPOSITION

CROSS REFERENCE TO RELATED APPLICATION

This is a continuation of International Application No. PCT/JP2012/062722 filed on May 11, 2012, and claims priority from Japanese Patent Application No. 2011-107702 filed on May 12, 2011, the entire disclosures of which are incorporated herein by reference.

TECHNICAL FIELD

The present invention relates to a positive resist composition suitably usable in the ultramicrolithography process such as production of VLSI or a high-capacity microchip as well as in other photofabrication processes and capable of forming a highly defined pattern by using an electron beam (EB), an extreme-ultraviolet ray (EUV) or the like, and a resist film, a resist-coated mask blank, a resist pattern forming method and a photomask each using the composition. More specifically, the present invention relates to a positive resist composition for use in the process using a substrate having a specific underlying film, and a resist film, a resist-coated mask blank, a resist pattern forming method and a photomask each using the composition. The positive resist composition of the present invention can be suitably applied also to a nanoimprint mold structure and a fabrication method thereof.

BACKGROUND ART

In the microfabrication using a resist composition, with an increase in the integration degree of an integrated circuit, formation of an ultrafine pattern is required. To meet this requirement, the exposure wavelength tends to become shorter, such as from g-line to i-line or further to excimer laser light, and, for example, development of a lithography technique using an electron beam is proceeding at present. As the formed pattern becomes finer, thin film formation of the resist film is also proceeding so as to prevent a problem of pattern collapse. With respect to the resin used in a resist composition for forming a conventional resist film as thick as having a film thickness of 0.2 to 1.0 μm, a resin having an acetal structure where a hydrogen atom of a phenolic hydroxyl group is replaced, for example, by an acid labile group containing a specific ring structure is described in JP-A-2000-239538 (the term "JP-A" as used herein means an "unexamined published Japanese patent application"), JP-A-2006-146242 and International Publication No. 05/023880.

In order to form an ultrafine pattern, thin film formation of the resist is necessary, but this incurs deterioration of the dry etching resistance. Also, in electron beam lithography, the effect of electron scattering (forward scattering) in the resist film is recently reduced by increasing the accelerating voltage of the electron beam (EB). However, in this case, the electron energy trapping ratio of the resist film decreases, giving rise to reduction in the sensitivity, and the effect of scattering (back scattering) of electrons reflected in the resist substrate increases. Above all, in the case of forming an isolated pattern having a large exposure area, the effect of back scattering is large, and the resolution of the isolate pattern is impaired.

Particularly, in the case of patterning on a photomask blank used for semiconductor exposure, a light-shielding film containing a heavy atom is present below the resist, and the effect of back scattering attributable to the heavy atom is more serious. Therefore, in the case of forming an isolated pattern on a photomask blank, among others, resolution is highly likely to be decreased.

As one of the methods to solve these problems, use of a resin having a polycyclic aromatic skeleton such as naphthalene is being studied (see, for example, JP-A-2008-95009 and JP-A-2009-86354), but the problem about the resolution of an isolated pattern is unsolved. In JP-A-2005-99558, as one of the methods to enhance the resolution of an isolated pattern, a resin containing a group for adjusting the solubility is used, but the resolution of an isolated pattern has not yet reached a satisfactory level.

Also, the microfabrication using a resist composition is not only used directly to produce an integrated circuit but also applied, in recent year, to the fabrication or the like of a so-called imprint mold structure (see, for example, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basics and Developments of Technology and Application of Nanoimprint—Fundamental Technology of Nanoimprint and Deployment of Leading-Edge Technology), Frontier Shuppan (issued June, 2006)). Therefore, it becomes an important task to satisfy high sensitivity, high resolution property (for example, high resolution, excellent pattern profile and small line edge roughness (LER)) and good dry etching resistance all at the same time, and this needs to be solved.

SUMMARY OF INVENTION

An object of the present invention is to provide a positive resist composition capable of forming a pattern satisfying high sensitivity, high resolution property (for example, high resolution, excellent pattern profile and small line edge roughness (LER)) and good dry etching resistance all at the same time, and a resist film, a resist-coated mask blank, a resist pattern forming method and a photomask each using the composition.

In particular, the object of the present invention is to provide a positive resist composition capable of forming a pattern satisfying high sensitivity, high resolution property (for example, high resolution, excellent pattern profile and small line edge roughness (LER)) and good dry etching resistance all at the same time in the formation of a fine pattern by exposure using an electron beam or an extreme ultraviolet ray, and a resist film, a resist-coated mask blank, a resist pattern forming method and a photomask each using the composition.

As a result of intensive studies, the present inventors have found that the above-described object can be attained by a positive resist composition using a polymer compound having a specific structure.

That is, the present invention is as follows.

[1] A positive resist composition, comprising:

(A) a polymer compound having a structure where a hydrogen atom of a phenolic hydroxyl group is replaced by an acid labile group represented by the following formula (I):

(I)

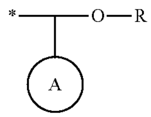

wherein R represents a monovalent organic group;

A represents a group having a polycyclic hydrocarbon ring structure or a group having a polycyclic heterocyclic structure; and

* represents a bonding position to an oxygen atom of the phenolic hydroxyl group.

[2] The positive resist composition as described in [1] above, wherein the group represented by A in formula (I) has a structure represented by the following formula (III) as the polycyclic hydrocarbon ring structure or polycyclic heterocyclic structure:

(III)

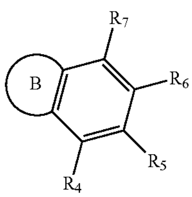

wherein B represents an aliphatic hydrocarbon ring, an aliphatic heterocyclic ring, an aromatic hydrocarbon ring or an aromatic heterocyclic ring; and each of $R_4$ to $R_7$ independently represents a hydrogen atom or a substituent.

[3] The positive resist composition as described in [1] above, wherein the polymer compound (A) contains a repeating unit represented by the following formula (II):

(II)

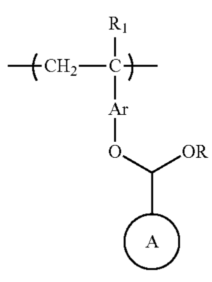

wherein $R_1$ represents a hydrogen atom, an alkyl group or a halogen atom;

Ar represents a divalent aromatic group;

R represents a monovalent organic group; and

A represents a group having a polycyclic hydrocarbon ring structure or a group having a polycyclic heterocyclic structure.

[4] The positive resist composition as described in [3] above, wherein the group represented by A in formula (II) has a structure represented by the following formula (III) as the polycyclic hydrocarbon ring structure or polycyclic heterocyclic structure:

(III)

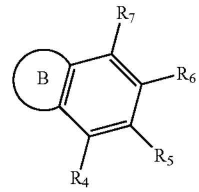

wherein B represents an aliphatic hydrocarbon ring, an aliphatic heterocyclic ring, an aromatic hydrocarbon ring or an aromatic heterocyclic ring; and each of $R_4$ to $R_7$ independently represents a hydrogen atom or a substituent.

[5] The positive resist composition as described in any one of [1] to [4] above, wherein the polymer compound (A) further contains a repeating unit represented by the following formula (VII):

(VII)

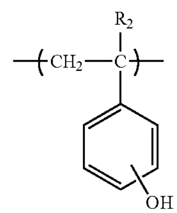

wherein $R_2$ represents a hydrogen atom, an alkyl group or a halogen atom.

[6] The positive resist composition as described in any one of [1] to [5] above, wherein a polydispersity of the polymer compound (A) is from 1.0 to 1.2.

[7] The positive resist composition as described in any one of [1] to [6] above, which is for electron beam or extreme-ultraviolet exposure.

[8] A resist film, which is formed from the positive resist composition as described in any one of [1] to [7] above.

[9] A resist-coated mask blank, which is coated with the resist film as described in [8] above.

[10] A resist pattern forming method, comprising:

exposing the resist film as described in [8] above, so as to form an exposed film; and developing the exposed film.

[11] A resist pattern forming method, comprising:

exposing the resist-coated mask blank as described in [9] above, so as to form an exposed resist-coated mask blank; and developing the exposed resist-coated mask blank.

[12] The resist pattern forming method as described in [10] or [11] above, wherein the exposure is performed using an electron beam or an extreme-ultraviolet ray.

[13] A photomask, which is obtained by exposing and developing the resist-coated mask blank as described in [9] above.

DESCRIPTION OF EMBODIMENTS

The mode for carrying out the present invention is described in detail below.

Incidentally, in the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the description of the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The positive resist composition of the present invention contains (A) a polymer compound having a structure where a hydrogen atom of a phenolic hydroxyl group is replaced by an acid labile group represented by the later-described formula (I).

The positive resist composition of the present invention is preferably for electron beam or extreme-ultraviolet exposure.

The positive resist composition of the present invention is preferably a chemical amplification positive resist composition.

The positive resist composition of the present invention is described in detail below.

[1] (A) Polymer Compound

The positive resist composition of the present invention contains (A) a polymer compound having a structure where a hydrogen atom of a phenolic hydroxyl group is replaced by a acid labile group represented by the following formula (I). The structure above is an acid-decomposable acetal structure formed by bonding an acid labile group represented by the following formula (I) to an oxygen atom of a phenolic hydroxyl group.

In the present invention, the composition contains a polymer compound having a phenolic hydroxyl group, and a polymer compound where a part of the phenolic hydroxyl group is substituted with a group represented by the following formula (I) is used as the main component.

Incidentally, the acid labile group as used in the present invention means a group that causes a decomposition reaction by the action of an acid generated from (B) a compound capable of generating an acid upon irradiation with an actinic ray or radiation, which is described later.

Also, the phenolic hydroxyl group as used in the present application means a hydroxyl group formed by substituting a hydroxyl group for a hydrogen atom of an aromatic ring group (in other words, a hydroxyl group substituted directly on an aromatic ring).

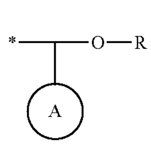

(I)

(wherein R represents a monovalent organic group, A represents a group having a polycyclic hydrocarbon ring structure or a group having a polycyclic heterocyclic structure, and * represents a bonding position to the oxygen atom of the phenolic hydroxyl group).

Formula (I) is a moiety having a function of controlling alkali developability of the polymer compound (A) containing a repeating unit having a phenolic hydroxyl group. Thanks to the group represented by formula (I), the structure where a hydrogen atom of a phenolic hydroxyl group is substituted for, decomposes by the action of an acid and generates a phenolic hydroxyl group.

The reason why a pattern satisfying high sensitivity, high resolution property (for example, high resolution, excellent pattern profile and small line edge roughness (LER)) and good dry etching resistance all at the same time can be formed by the positive resist composition containing the polymer compound (A) having a specific structure is not clearly known but is presumed as follows.

The group represented by formula (I) has a polycyclic hydrocarbon ring structure or a polycyclic heterocyclic structure and therefore, is considered to enable imparting of high dry etching resistance even to a thin resist film. Also, although details are not clear, the group represented by formula (I) is considered to contribute to increasing the generation efficiency of an acid generated upon irradiation with an actinic ray or radiation, and in turn, high sensitivity and high resolution property may be presumably obtained. Above all, in the exposure using an electron beam or an extreme-ultraviolet ray, the group represented by formula (I) is considered to contribute to efficiently acquiring a secondary electron generated in the system, and in turn, high sensitivity and high resolution property may be presumably achieved.

The group represented by formula (I) is described below.

In formula (I), R represents a monovalent organic group. Examples of the monovalent organic group represented by R include a linear or branched alkyl group (preferably an alkyl group having a carbon number of 1 to 30, more preferably a carbon number of 1 to 10, still more preferably a carbon number of 1 to 6), a cycloalkyl group (preferably a monocyclic or polycyclic cycloalkyl group having a carbon number of 3 to 30, more preferably a carbon number of 4 to 15), an aryl group (preferably a monocyclic or polycyclic aryl group having a carbon number of 6 to 30, more preferably a carbon number of 6 to 15), and an aralkyl group (preferably an aralkyl group having a carbon number of 7 to 30, more preferably a carbon number of 7 to 15), where a part of carbon atoms may be replaced by a heteroatom such as oxygen atom, sulfur atom and nitrogen atom. These groups may have a substituent, and examples of the substituent include an alkyl group (preferably having a carbon number of 1 to 6), a cycloalkyl group (preferably having a carbon number of 3 to 10), an aryl group (preferably having a carbon number of 6 to 15), a halogen atom (preferably a fluorine atom), a hydroxyl group, an alkoxy group (preferably having a carbon number of 1 to 6), an aryloxy group (preferably having a carbon number of 6 to 15), a carboxyl group, a carbonyl group, a thiocarbonyl group, an alkoxycarbonyl group (preferably having a carbon number of 2 to 7), and a group formed by a combination thereof (preferably having a total carbon number of 1 to 30, more preferably a total carbon number of 1 to 15).

The monovalent organic group represented by R is, in view of deprotection reaction, preferably an alkyl or cycloalkyl group which may have the above-described substituent, and more preferably an unsubstituted alkyl or cycloalkyl group.

Specific examples of the monovalent organic group of R include the following structures. In these specific examples, * represents a bonding position to the oxygen atom in formula (I).

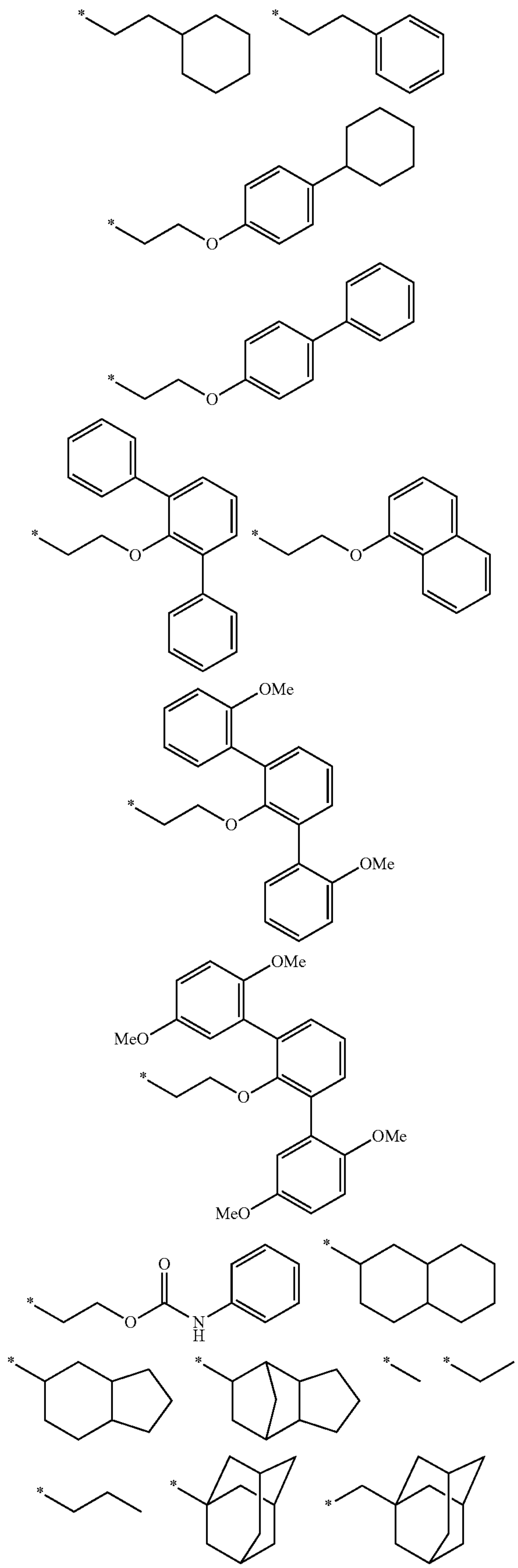

-continued

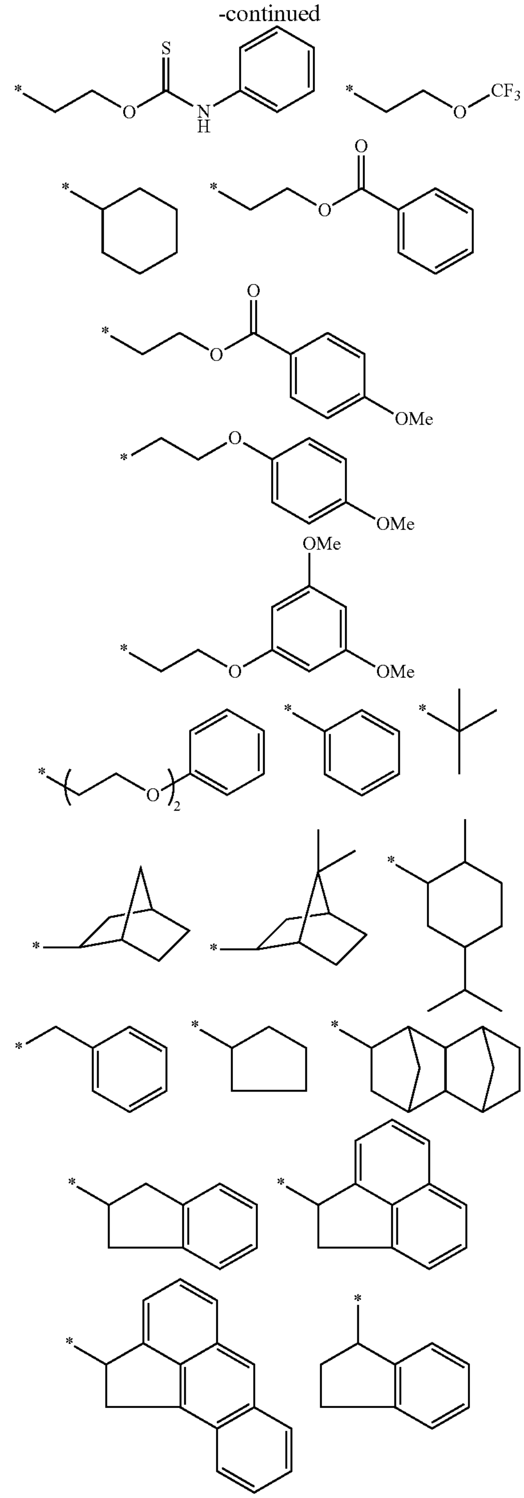

In formula (I), A represents a group having a polycyclic hydrocarbon ring structure or a group having a polycyclic heterocyclic structure.

In the present invention, the group having a polycyclic hydrocarbon ring structure is not particularly limited as long as it is a monovalent group having a polycyclic hydrocarbon ring structure, but the total carbon number thereof is preferably from 5 to 40, more preferably from 7 to 30.

The polycyclic hydrocarbon ring structure in the group having a polycyclic hydrocarbon ring structure means a structure having a plurality of monocyclic-type hydrocarbon groups, or a polycyclic-type hydrocarbon structure, and may be a crosslinked type.

The monocyclic-type hydrocarbon group is preferably a cycloalkyl group having a carbon number of 3 to 8 or an aryl group having a carbon number of 6 to 8, and examples thereof include a cyclopropyl group, a cyclopentyl group, a cyclohexyl group, a cyclobutyl group, a cyclooctyl group and a phenyl group. The structure having a plurality of monocyclic-type hydrocarbon groups has a plurality of these groups. The structure having a plurality of monocyclic-type hydrocarbon groups preferably has from 2 to 4 monocyclic-type hydrocarbon groups, more preferably 2 monocyclic hydrocarbon groups.

The polycyclic-type hydrocarbon ring structure is a structure composed of two or more hydrocarbon rings and, in view of dry etching resistance, a structure composed of 3 or more hydrocarbon rings is preferred. The polycyclic-type hydrocarbon ring structure is a structure composed of generally 10 or less hydrocarbon rings, preferably 6 or less hydrocarbon rings. The polycyclic-type hydrocarbon ring structure includes a structure having a carbon number of 5 or more, such as bicyclo, tricyclo and tetracyclo structures. A polycyclic cyclo-structure and a polycyclic aromatic structure each having a carbon number of 6 to 30 are preferred, and examples thereof include structures corresponding to an indenyl group, an indanyl group, a fluorenyl group, an acenaphthylene group, an adamantyl group, a decalino group, a norbornyl group, an isoboronyl group, a camphanyl group, an α-pinel group, an androstanyl group, a naphthyl group and an anthracenyl group.

The group having a polycyclic hydrocarbon ring structure is preferably a group having a structure corresponding to an indanyl group or a fluorenyl group, and in view of dry etching resistance, most preferably a group having a structure corresponding to a fluorenyl group. It is also preferred that the group having a polycyclic hydrocarbon ring structure is the above-described group itself. Among those groups, an indanyl group, a fluorenyl group are more preferred, and a fluorenyl group is most preferred.

In the present invention, the group having a polycyclic heterocyclic structure is not particularly limited as long as it is a monovalent group having a polycyclic heterocyclic structure, but the total carbon number thereof is preferably from 4 to 40, more preferably 6 to 30.

The polycyclic heterocyclic structure in the group having a polycyclic heterocyclic structure means a structure where in a structure having a plurality of monocyclic-type hydrocarbon groups, at least one monocyclic-type hydrocarbon group is a group formed by substituting a part of carbon atoms constituting the ring with a heteroatom such as oxygen atom (hereinafter, referred to as a "monocyclic-type heterocyclic group"), or a structure where in a polycyclic-type hydrocarbon ring structure, at least one ring of the polycyclic-type hydrocarbon ring is a ring formed by substituting a part of carbon atoms constituting the ring with a heteroatom such as oxygen atom (hereinafter, referred to as a "polycyclic-type heterocyclic structure"), and may be a crosslinked type.

The monocyclic-type hydrocarbon group includes those described above. The monocyclic-type heterocyclic group includes a group where in the monocyclic-type hydrocarbon group above, a part of carbon atoms forming the ring is replaced by a heteroatom such as oxygen atom. A group where the carbon atom is replaced by an oxygen atom, a sulfur atom or a nitrogen atom is preferred, and a group where the carbon atom is replaced by an oxygen atom is more preferred. The structure having a plurality of monocyclic-type hydrocarbon groups or monocyclic-type heterocyclic groups has, in total, preferably from 2 to 4 monocyclic-type hydrocarbon groups or monocyclic-type heterocyclic groups, more preferably 2 monocyclic-type hydrocarbon groups or monocyclic-type heterocyclic groups, where at least one is a monocyclic-type heterocyclic group and the number of monocyclic-type heterocyclic groups is preferably 1.

The polycyclic-type heterocyclic structure includes a structure where in the above-described polycyclic-type hydrocarbon ring structure, at least one ring in the polycyclic-type hydrocarbon ring is a ring formed by substituting a part of carbon atoms constituting the ring with a heteroatom such as oxygen atom, and the heteroatom is preferably an oxygen atom, a sulfur atom or a nitrogen atom, more preferably an oxygen atom. The number of heterocyclic rings in the polycyclic-type heterocyclic structure is preferably from 1 to 3, more preferably 1.

The polycyclic-type heterocyclic structure having at least one heterocyclic ring may be non-aromatic or aromatic but is preferably non-aromatic. The non-aromatic polycyclic-type heterocyclic structure includes a structure where out of the above-described polycyclic-type hydrocarbon ring structures, in the non-aromatic structure, at least one ring is a ring formed by substituting a part of carbon atoms constituting the ring with a heteroatom such as oxygen atom. The aromatic polycyclic-type heterocyclic structure includes an aromatic polycyclic-type heterocyclic structure containing at least one aromatic heterocyclic ring such as benzothiophene ring, benzofuran ring, benzopyrrole ring and benzimidazole ring.

The group having a polycyclic heterocyclic structure is preferably a group having a chroman ring, a benzofuran ring or a benzothiophene ring, and in view of deprotection reaction, most preferably a group having a chroman ring. It is also preferred that the group having a polycyclic heterocyclic structure is the above-described ring itself (that is, a monovalent group formed by using arbitrary one hydrogen atom in the ring as a bond). A monovalent group formed by using arbitrary one hydrogen atom in a chroman ring, a benzofuran ring or a benzothiophene ring as a bond is more preferred, and a monovalent group formed by using arbitrary one hydrogen atom in a chroman ring as a bond is most preferred.

The above-described ring structures may have a substituent, and examples of the substituent include an alkyl group (preferably having a carbon number of 1 to 6), a cycloalkyl group (preferably having a carbon number of 3 to 10), an aryl group (preferably having a carbon number of 6 to 15), a halogen atom (preferably a fluorine atom), a hydroxyl group, an alkoxy group (preferably having a carbon number of 1 to 6), an aryloxy group (preferably having a carbon number of 6 to 15), a carboxyl group, a carbonyl group, a thiocarbonyl group, an alkoxycarbonyl group (preferably having a carbon number of 2 to 7), and a group formed by a combination thereof (preferably having a total carbon number of 1 to 30, more preferably a total carbon number of 1 to 15).

Specific examples of the group represented by A in formula (I) include the followings. In specific examples, * represents a bonding position to the carbon atom adjacent to the oxygen atom in formula (I).

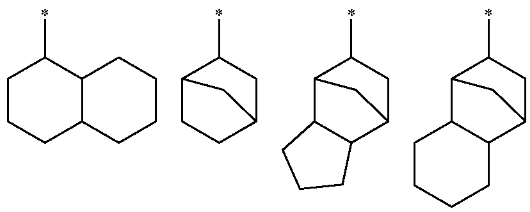
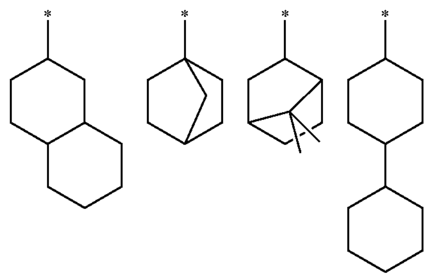
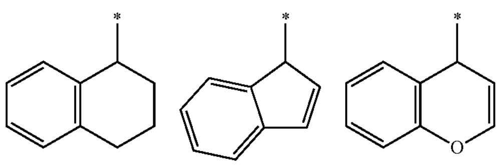
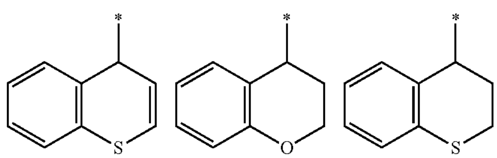
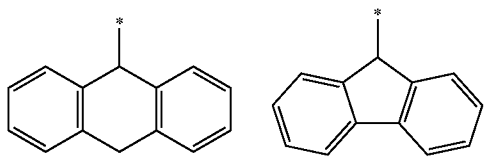
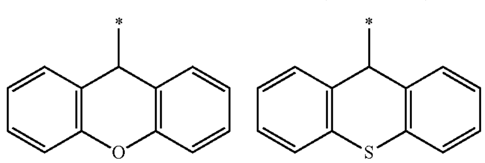
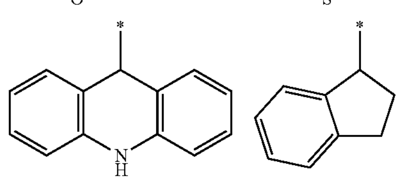
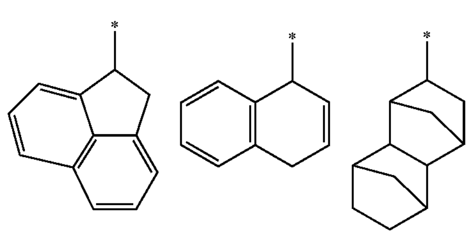
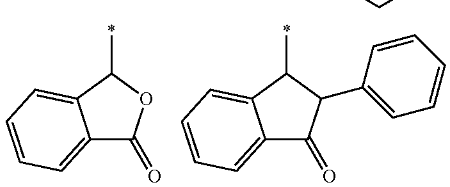
-continued
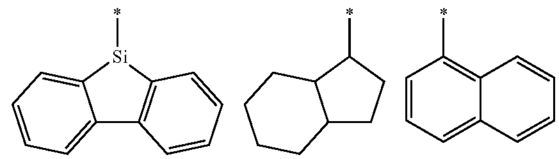
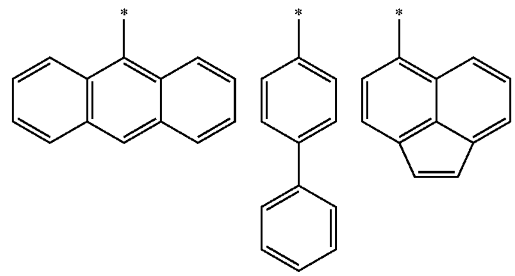
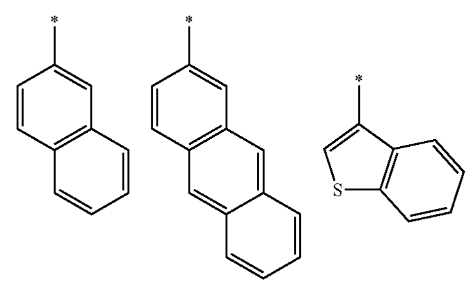
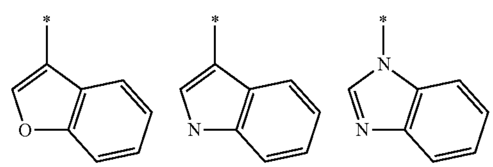
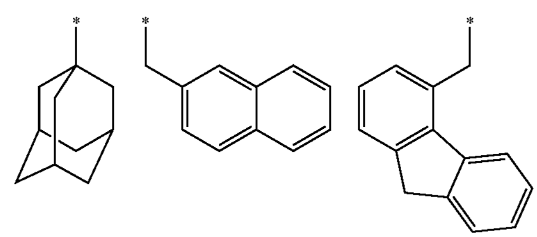
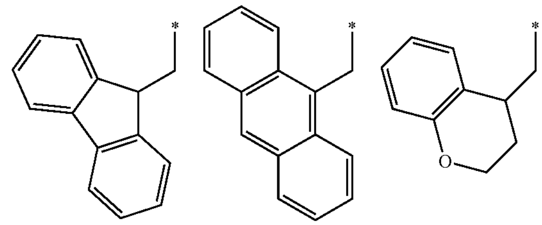
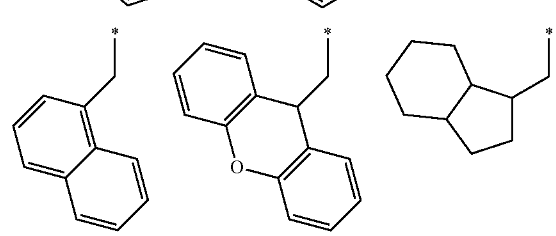

-continued

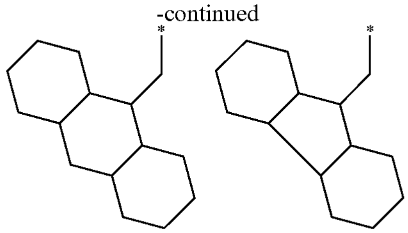

In view of sensitivity and resolution, the polymer compound (A) for use in the present invention preferably contains a repeating unit represented by the following formula (II). The repeating unit represented by the following formula (II) is a repeating unit having, in the side chain, a structure where the hydrogen atom of —ArOH in the repeating unit represented by —($CH_2$—C($R_1$)(ArOH))— is replaced by the acid labile group represented by formula (I).

(II)

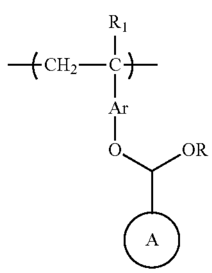

(wherein $R_1$ represents a hydrogen atom, an alkyl group or a halogen atom, Ar represents a divalent aromatic group, R represents a monovalent organic group, and A represents a group having a polycyclic hydrocarbon ring structure or a group having a polycyclic heterocyclic structure).

$R_1$ represents a hydrogen atom, an alkyl group or a halogen atom. The alkyl group of $R_1$ is preferably an alkyl group having a carbon number of 1 to 4. Examples of the substituent which may be substituted on the alkyl group of $R_1$ include a hydroxyl group, a halogen atom (preferably a fluorine atom), and an alkoxy group (preferably having a carbon number of 1 to 4). Examples of the halogen atom of $R_1$ include a chlorine atom, a bromine atom, a fluorine atom, and an iodine atom. $R_1$ represents preferably a hydrogen atom or an alkyl group, more preferably a hydrogen atom, a methyl group, a hydroxymethyl group, a trifluoromethyl group or an alkoxymethyl group, still more preferably a hydrogen atom or a methyl group, and most preferably a hydrogen atom.

Ar represents a divalent aromatic group. The divalent aromatic group represented by Ar is preferably an arylene group, more preferably an arylene group having a carbon number of 6 to 18, still more preferably a phenylene group or a naphthylene group, and most preferably a phenylene group.

The divalent aromatic group represented by Ar may have a substitution in addition to the group represented by —OCH(A)-OR, and the substituent includes the same substituents as in specific examples and preferred ranges of the substituent which may be substituted on R.

In the repeating unit represented by formula (II), when Ar is a benzene ring (phenylene group), the substitution position of the phenolic hydroxyl group with the hydrogen atom being replaced by an acid labile group represented by formula (I) may be a para-position, a meta-position or an ortho-position with respect to the bonding position of the benzene ring to the polymer main chain but is preferably a para-position or a meta-position, more preferably a para-position.

R and A in formula (II) have the same meanings as R and A in formula (I), and specific examples and preferred ranges thereof are also the same.

In view of dry etching resistance, the group represented by A in formula (I) or (II) preferably has a structure represented by the following formula (III) as the polycyclic hydrocarbon ring structure or polycyclic heterocyclic structure.

(III)

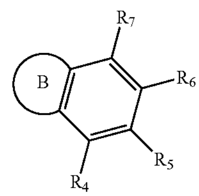

(wherein B represents an aliphatic hydrocarbon ring, an aliphatic heterocyclic ring, an aromatic hydrocarbon ring or an aromatic heterocyclic ring, and each of $R_4$ to $R_7$ independently represents a hydrogen atom or a substituent).

In the following description, the rings represented by B are classified into aliphatic or aromatic based on whether the ring adjacent to the benzene ring in formula (III) is an aliphatic ring or an aromatic ring. Also, the below-described name of the aliphatic ring represented by B is the name when the bond between two carbon atoms shared by the aliphatic ring represented by B and the benzene ring in formula (III) is a single bond.

The aliphatic hydrocarbon ring represented by B is preferably an aliphatic hydrocarbon ring having a carbon number of 3 to 20, more preferably a carbon number of 4 to 15, and may be monocyclic or polycyclic but, in view of dry etching resistance, is preferably polycyclic. Examples of the aliphatic hydrocarbon ring represented by B include a cyclopentane ring ((B-1) described later), a cyclohexane ring ((B-2) described later), a cycloheptane ring, a cyclooctane ring, and the later-described (B-3) to (B-7), (B-16) and (B-17), with a cyclopentane ring, a cyclohexane ring and the later-described (B-3), (B-16) and (B-17) being preferred.

The aliphatic heterocyclic ring represented by B is preferably an aliphatic heterocyclic ring having a carbon number of 2 to 20, more preferably a carbon number of 3 to 15, and may be monocyclic or polycyclic but, in view of dry etching resistance, is preferably polycyclic. The aliphatic heterocyclic ring represented by B includes a ring where in the above-described aliphatic hydrocarbon ring, a part of carbon atoms constituting the ring is replaced by a heteroatom such as oxygen atom, sulfur atom and nitrogen atom, and specific examples thereof include an oxirane ring, an oxetane ring, an oxolane ring ((B-8) described later)), thioxirane ring, a thioxetane ring, a thioxolane ring ((B-10) described later), and the later-described (B-9), (B-11) to (B-15), (B-18) and (B-19), with an oxetane ring, an oxolane ring and the later-described (B-9), (B-11) and (B-18) being preferred.

The aromatic hydrocarbon ring represented by B is preferably an aromatic hydrocarbon ring having a carbon number of 6 to 20, more preferably a carbon number of 6 to 15, and may be monocyclic or polycyclic but, in view of dry etching resistance, is preferably polycyclic. Examples of the aromatic hydrocarbon ring represented by B include a benzene ring ((B-21) described later), a naphthalene ring ((B-20) and (B-22) described later), an anthracene ring, and a phenanthrene ring, with a benzene ring and a naphthalene ring being preferred.

The aromatic heterocyclic ring represented by B is preferably an aromatic heterocyclic ring having a carbon number of 3 to 20, more preferably a carbon number of 4 to 15, and may be monocyclic or polycyclic but, in view of dry etching resistance, is preferably polycyclic. Examples of the aromatic heterocyclic ring represented by B include a ring where in the above-described aromatic hydrocarbon ring, a part of carbon atoms constituting the ring is replaced by a heteroatom such as oxygen atom, sulfur atom and nitrogen atom, and specific examples thereof include a chroman ring, a chromene ring, a xanthene ring, a benzofuran ring, a thianthrene ring and a phenoxathiin ring, with a chroman ring, a chromene ring and a xanthene ring being preferred, and a chroman ring and a chromene ring being more preferred.

Each ring represented by B may have a substituent, and the substituent includes the same substituents as in specific examples and preferred ranges of the substituent which may be substituted on R in formula (I) or (II).

In view of sensitivity and resolution, B is preferably a non-aromatic ring, that is, preferably an aliphatic hydrocarbon ring or an aliphatic heterocyclic ring, more preferably an aliphatic hydrocarbon ring.

Each of $R_4$ to $R_7$ independently represents a hydrogen atom or a substituent. Examples of the substituent represented by $R_4$ to $R_7$ include an alkyl group (preferably having a carbon number of 1 to 6), a cycloalkyl group (preferably having a carbon number of 3 to 10), an aryl group (preferably having a carbon number of 6 to 15), a halogen atom (preferably a fluorine atom), a hydroxyl group, an alkoxy group (preferably having a carbon number of 1 to 6), an aryloxy group (preferably having a carbon number of 6 to 15), a carboxyl group, a cyano group, an acyl group (preferably having a carbon number of 2 to 7), an acyloxy group (preferably having a carbon number of 2 to 7), an alkoxycarbonyl group (preferably having a carbon number of 2 to 7), and a group formed by a combination thereof (preferably having a total carbon number of 1 to 30, more preferably a total carbon number of 1 to 15), with an alkyl group, a cycloalkyl group and an aryl group being preferred, and an alkyl group being more preferred.

Each of $R_4$ to $R_7$ is preferably a hydrogen atom.

The group represented by A in formula (I) or (II) can have a structure represented by formula (III) by substituting a bond for an arbitrary hydrogen atom of the ring represented by B in formula (III) or an arbitrary hydrogen atom of $R_4$ to $R_7$. It is also preferred that the group represented by A in formula (I) or (II) is a monovalent group formed by substituting a bond for arbitrary one hydrogen atom of the ring represented by B in formula (III) or arbitrary one hydrogen atom of $R_4$ to $R_7$. In this case, a monovalent group formed by substituting a bond for arbitrary one hydrogen atom of the ring represented by B is preferred, and a monovalent group formed by substituting a bond for arbitrary one hydrogen atom on a carbon atom adjacent to the benzene ring of formula (III) is more preferred.

Specifically, the structure of the acid labile group represented by formula (I) is preferably represented by the following formula (V), and the repeating unit represented by formula (II) is preferably a repeating unit represented by the following formula (VI):

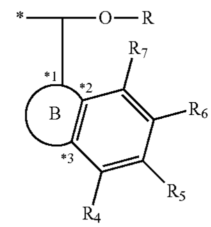

(V)

(wherein R represents a monovalent organic group, B represents an aliphatic hydrocarbon ring, an aliphatic heterocyclic ring, an aromatic hydrocarbon ring or an aromatic heterocyclic ring, each of $R_4$ to $R_7$ independently represents a hydrogen atom or a substituent, * represents a bonding position to the oxygen atom of the phenolic hydroxyl group, *1 represents a position of a carbon atom adjacent to the benzene ring in formula (V), and each of *2 and *3 represents a position of a carbon atom shared by the benzene ring in formula (V) and the ring represented by B).

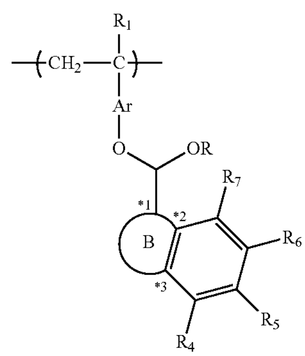

(VI)

(wherein $R_1$ represents a hydrogen atom, an alkyl group or a halogen atom, Ar represents a divalent aromatic group, R represents a monovalent organic group, B represents an aliphatic hydrocarbon ring, an aliphatic heterocyclic ring, an aromatic hydrocarbon ring or an aromatic heterocyclic ring, each of $R_4$ to $R_7$ independently represents a hydrogen atom or a substituent, *1 represents a position of a carbon atom adjacent to the benzene ring in formula (VI), and each of *2 and *3 represents a position of a carbon atom shared by the benzene ring in formula (VI) and the ring represented by B).

R in formulae (V) and (VI) has the same meaning as R in formula (I), and specific examples and preferred ranges thereof are also the same.

$R_1$ and Ar in formula (VI) have the same meaning as $R_1$ and Ar in formula (II), and specific examples and preferred ranges thereof are also the same.

B and $R_4$ to $R_7$ in formulae (V) and (VI) have the same meaning as B and $R_4$ to $R_7$ in formula (III), and specific examples and preferred ranges thereof are also the same. However, in formulae (V) and (VI), the structure represented by formula (III) is a monovalent group formed by substituting a bond for a hydrogen atom on the carbon atom indicated by *1 adjacent to the benzene ring in the formula.

B in formulae (V) and (VI) is preferably any one of the following ring structures. In these specific examples, the carbon atoms at *1 to *3 correspond to the carbon atoms at *1 to *3 in formulae (V) and (VI).

-continued (B-1)

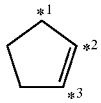

(B-2)

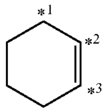

(B-3)

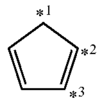

(B-4)

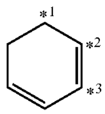

(B-5)

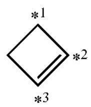

(B-6)

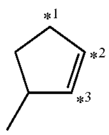

(B-7)

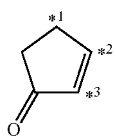

(B-8)

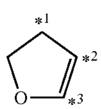

(B-9)

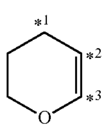

(B-10)

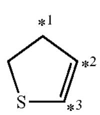

(B-11)

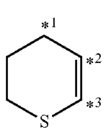

(B-12)

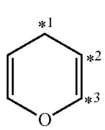

(B-13)

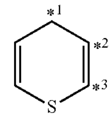

(B-14)

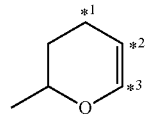

(B-15)

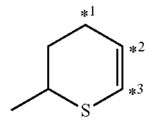

(B-16)

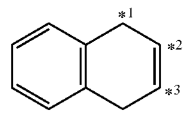

(B-17)

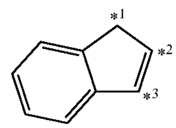

(B-18)

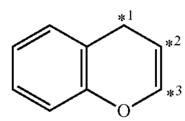

(B-19)

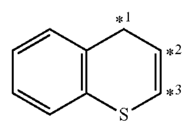

(B-20)

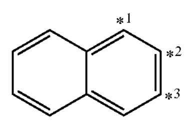

(B-21)

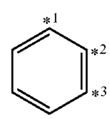

(B-22)

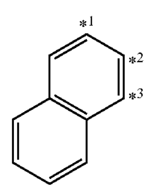

Among (B-1) to (B-22), in view of dry etching resistance, (B-1) to (B-3), (B-9), (B-11), (B-16), (B-17), (B-18), (B-20) and (B-21) are preferred as the ring represented by B, and (B-1), (B-9), (B-17) and (B-21) are more preferred.

Specific examples of the repeating unit having a structure where a hydrogen atom of a phenolic hydroxyl group is replaced by an acid labile group represented by formula (I), and the repeating unit represented by formula (II) or (VI), are illustrated below.

-continued
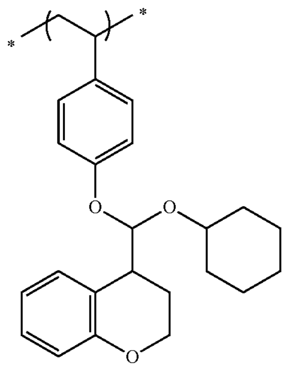
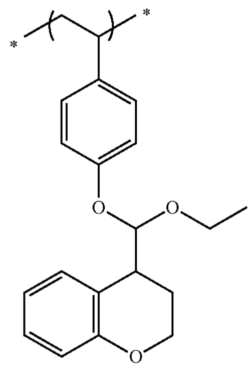
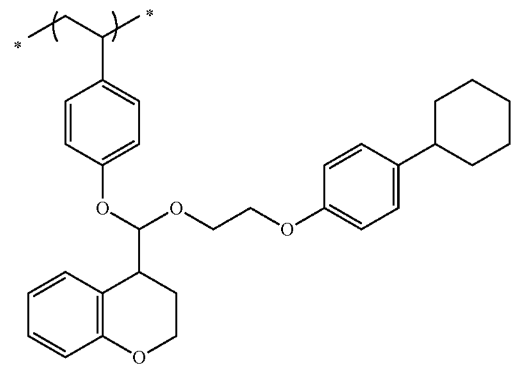
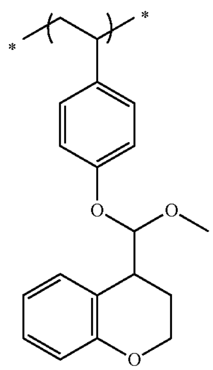
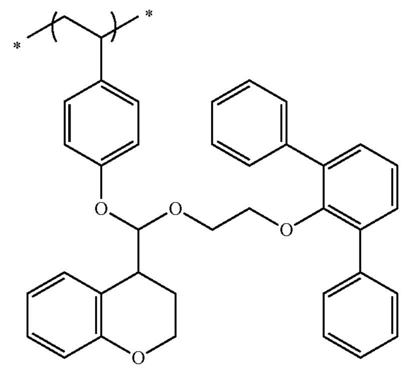
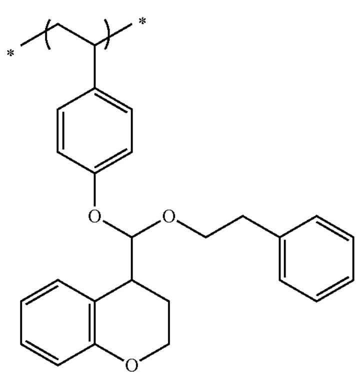
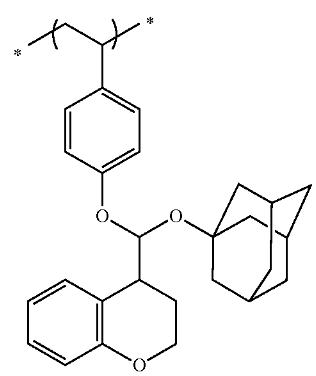
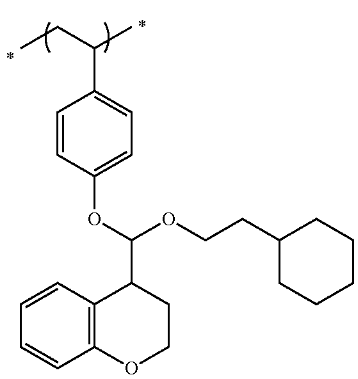
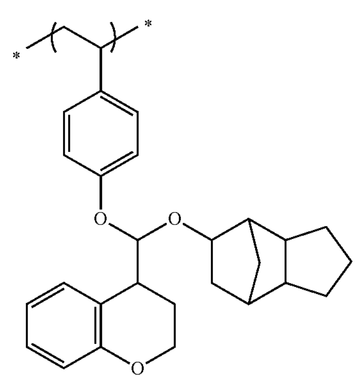

-continued
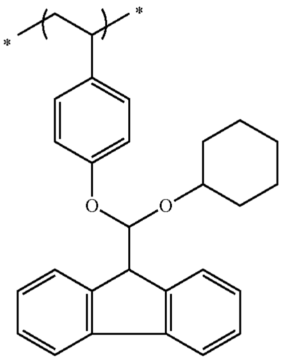
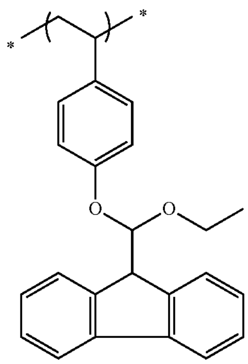
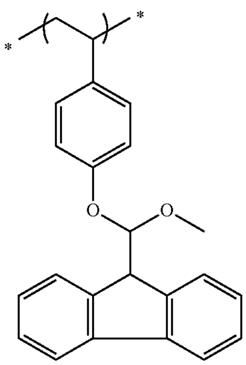
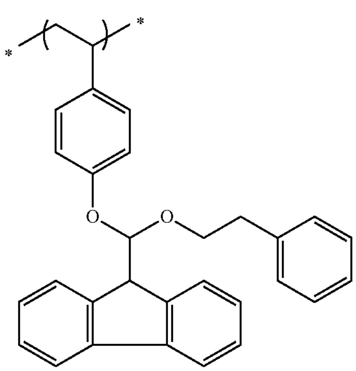
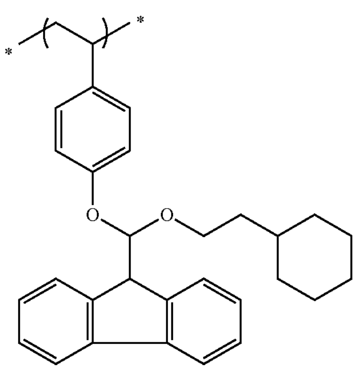
-continued
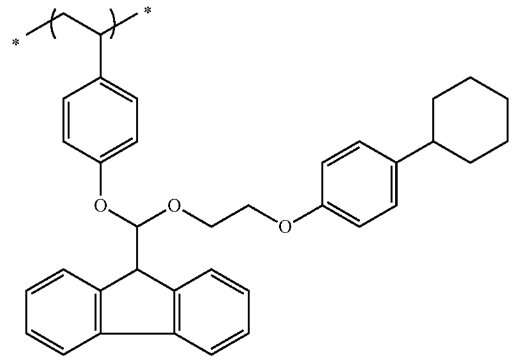
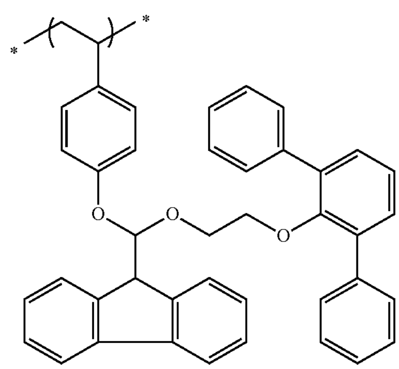
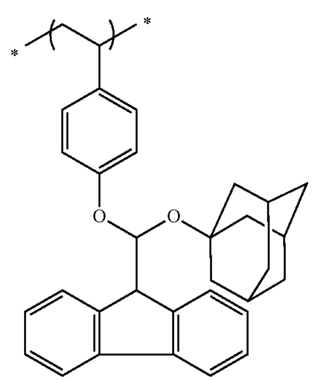
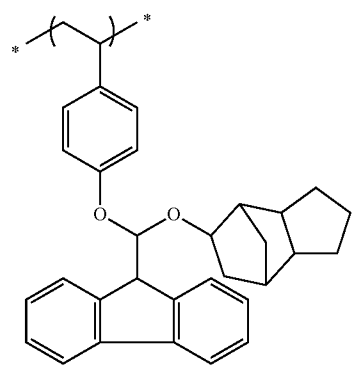

-continued
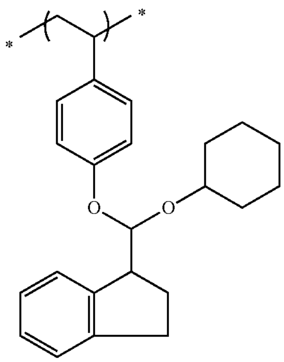
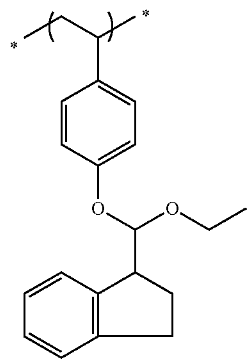
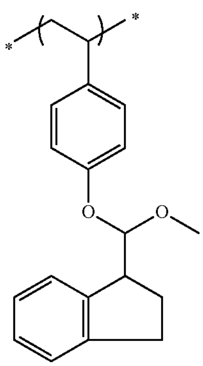
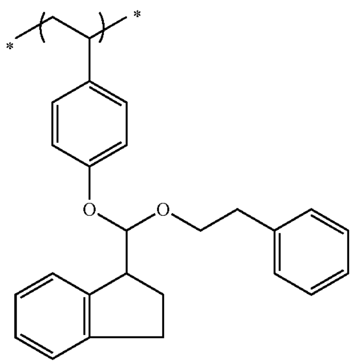
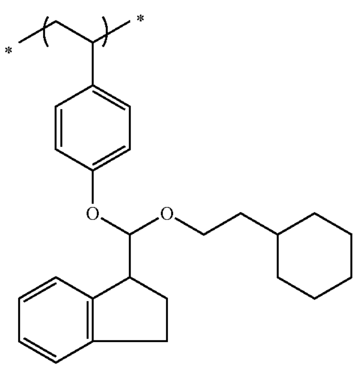
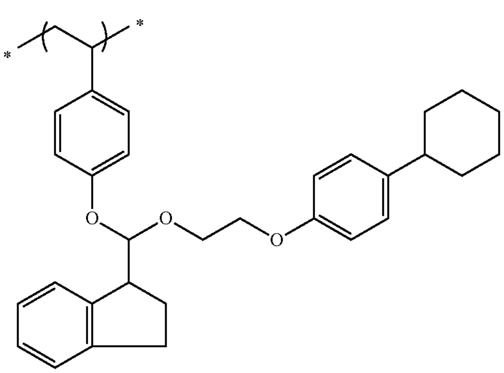
-continued
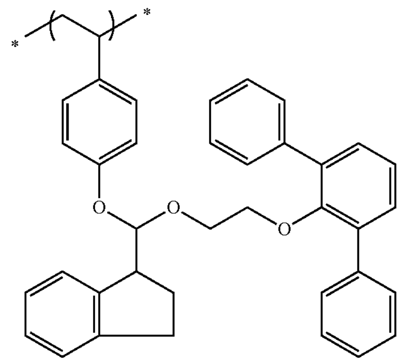
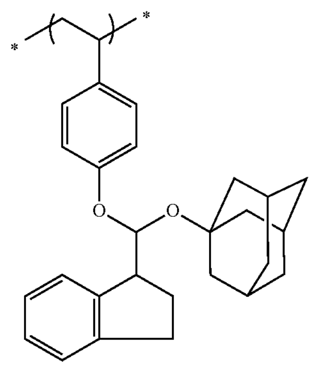
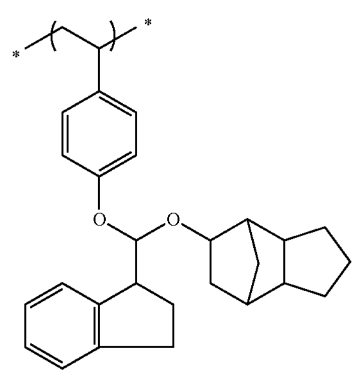
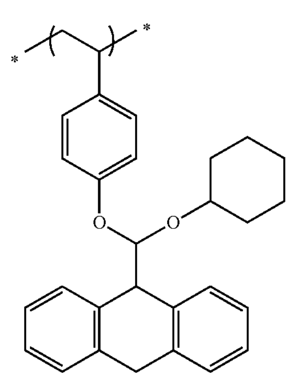
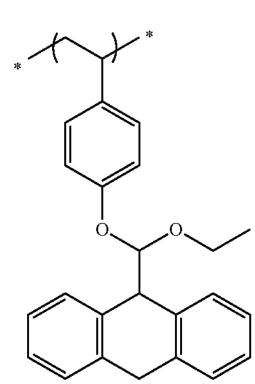

-continued
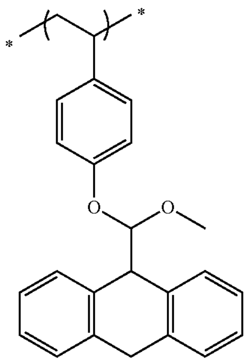
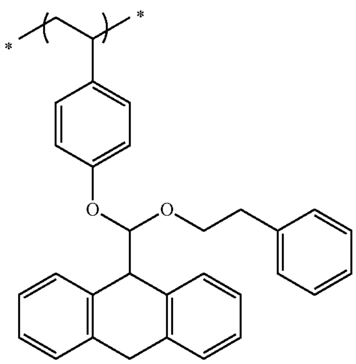
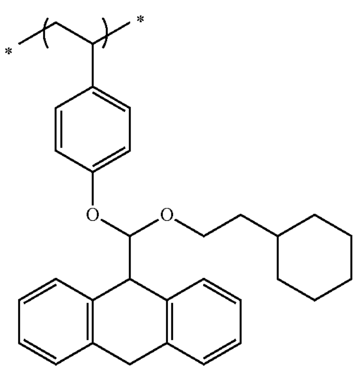
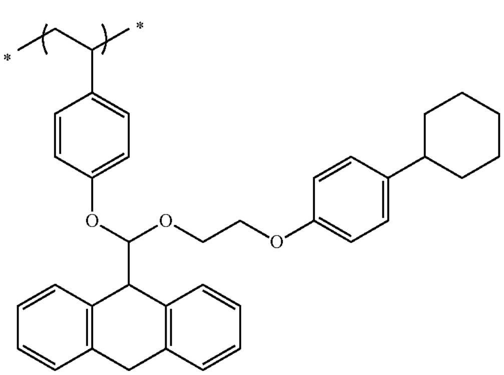
-continued
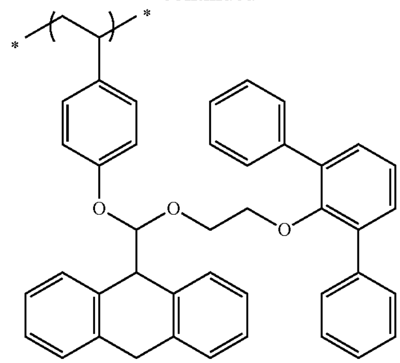
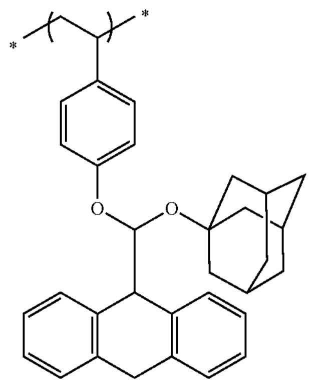
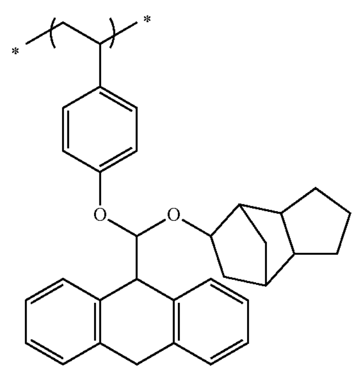
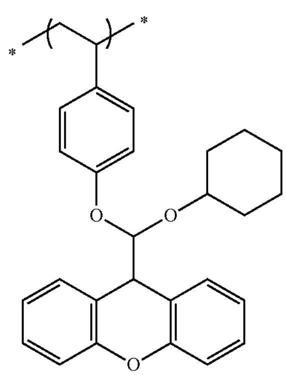
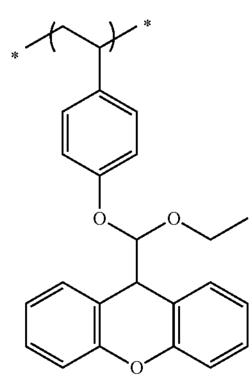

-continued
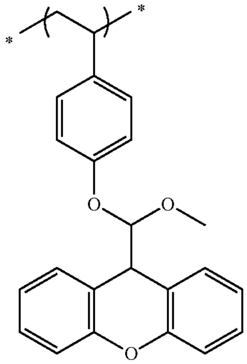
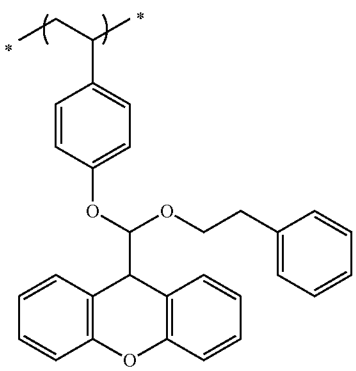
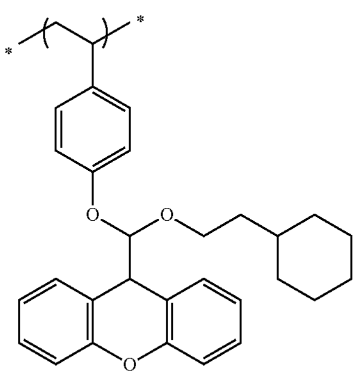
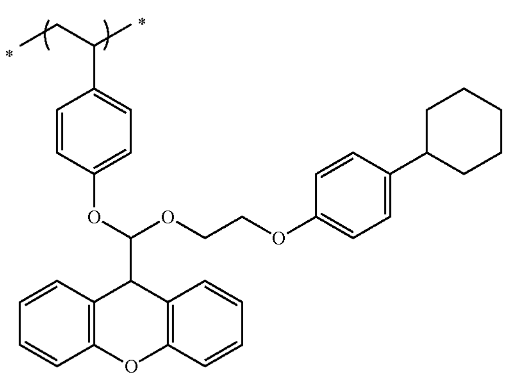
-continued
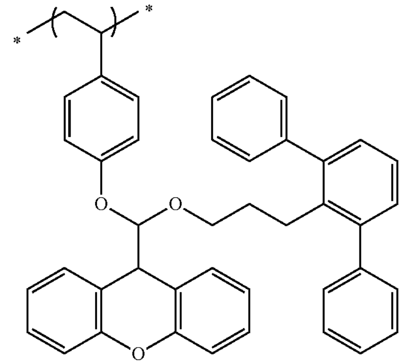
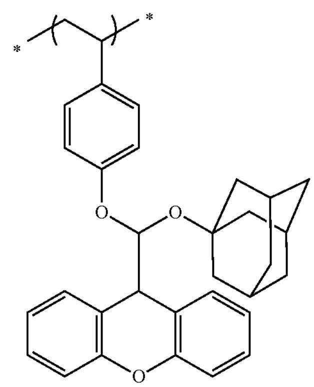
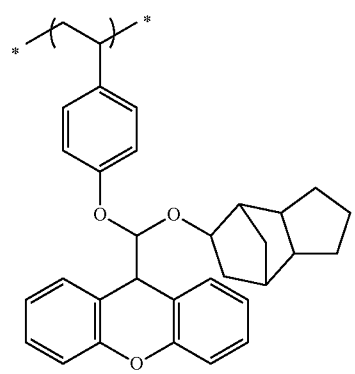
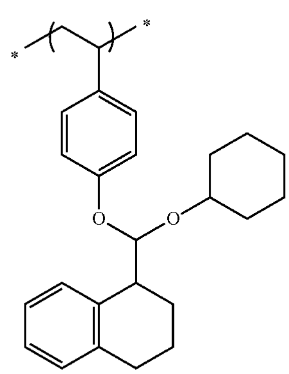
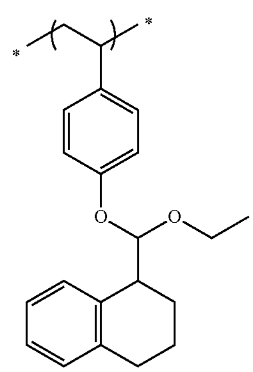

-continued
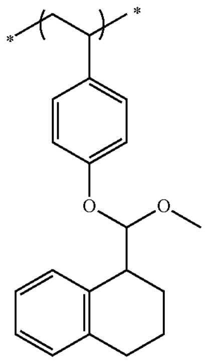
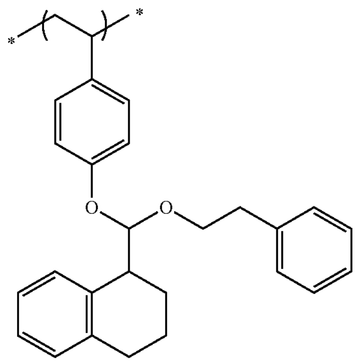
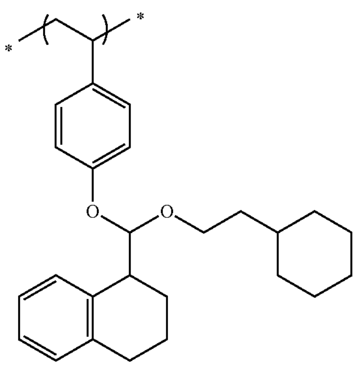
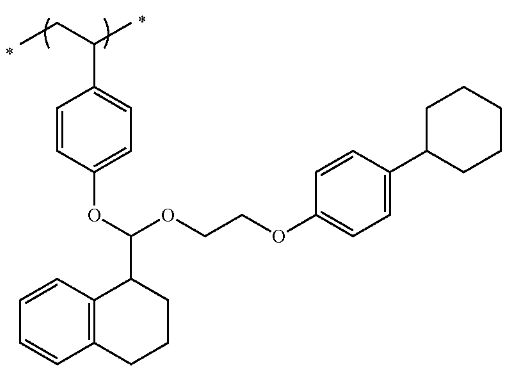
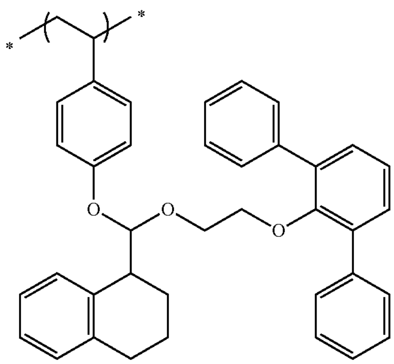
-continued
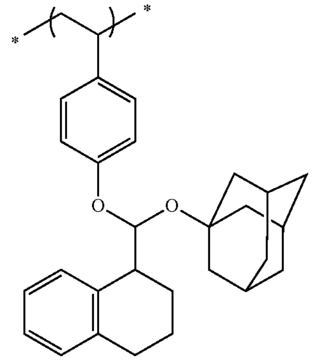
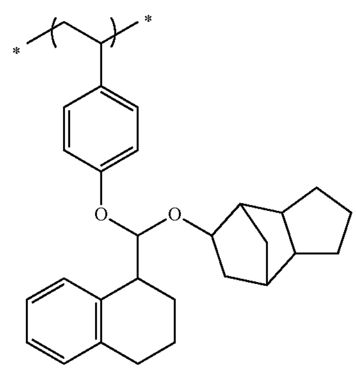
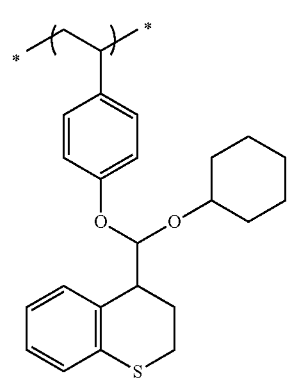
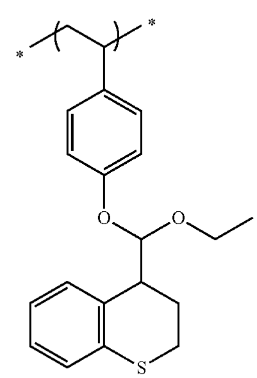
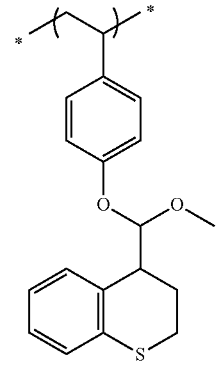

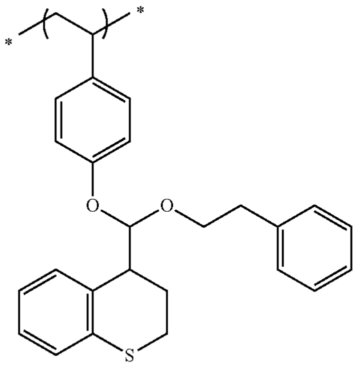
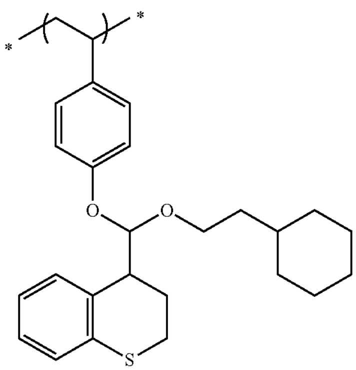
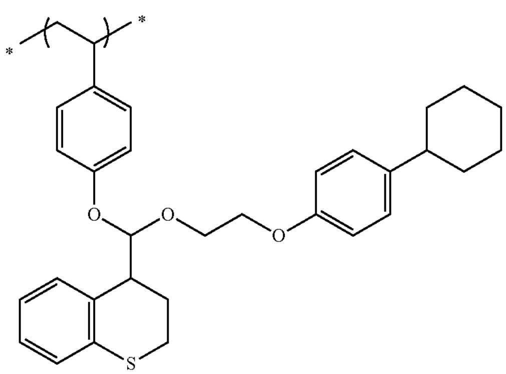
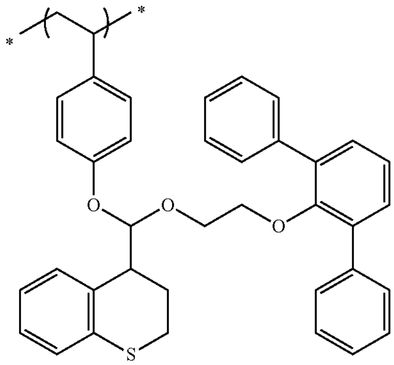
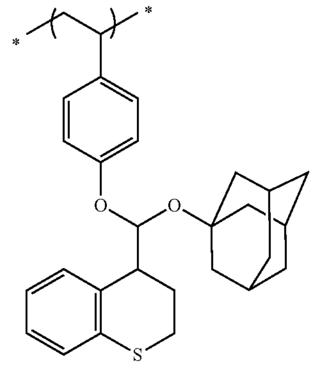
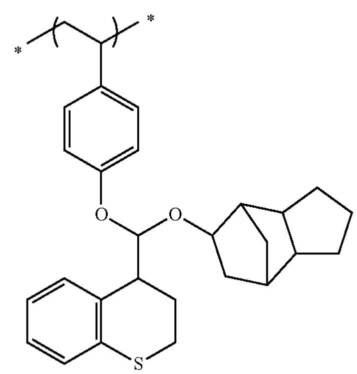
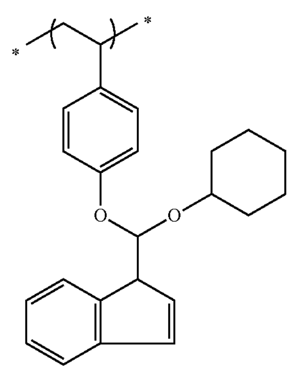
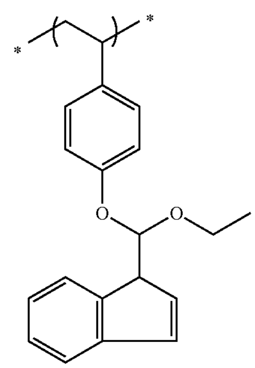
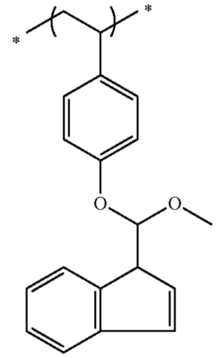
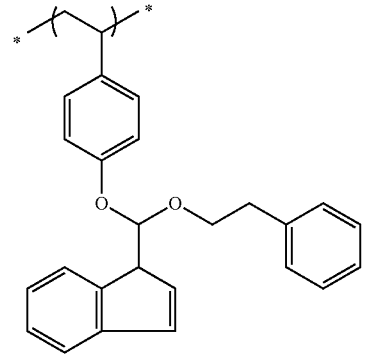

-continued
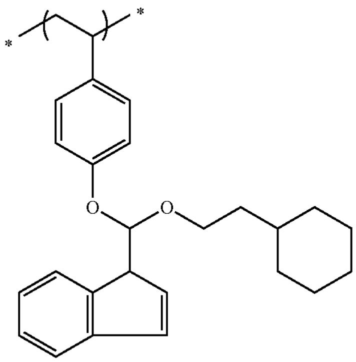
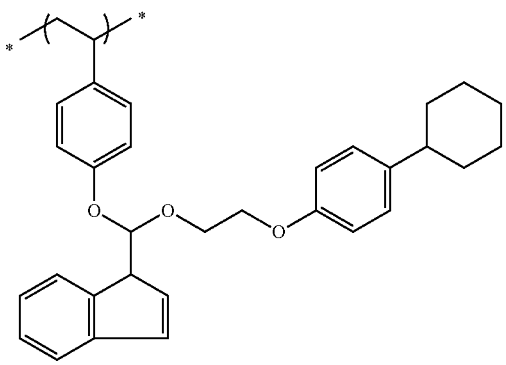
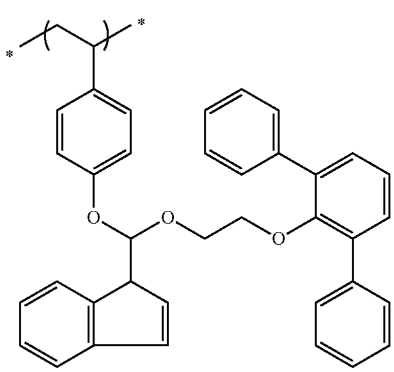
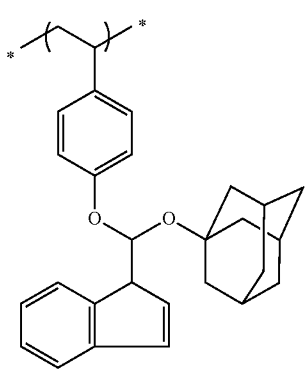
-continued
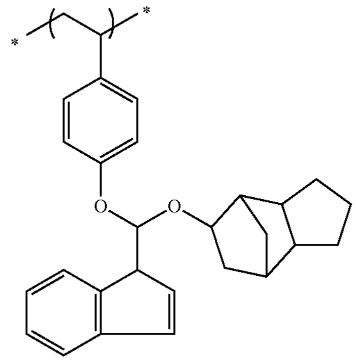
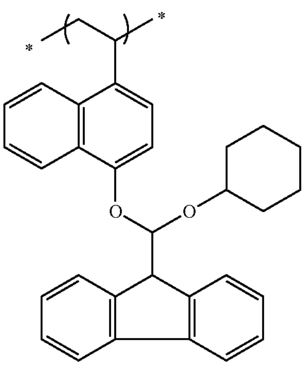
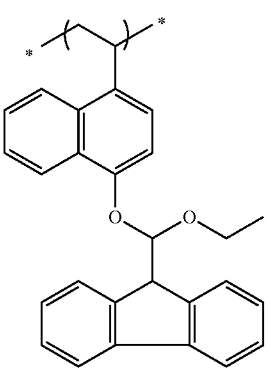
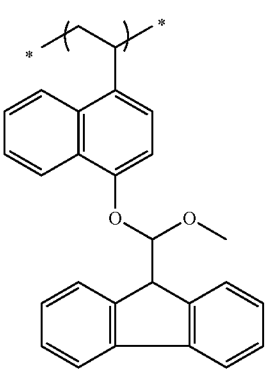

-continued
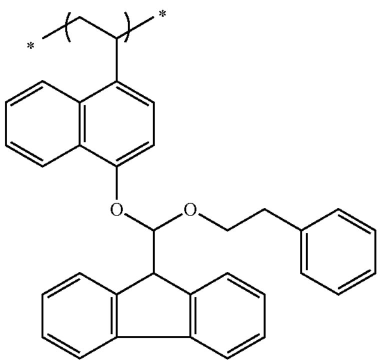
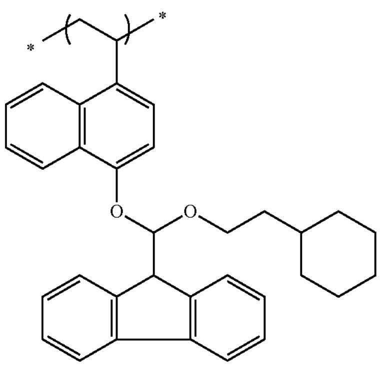
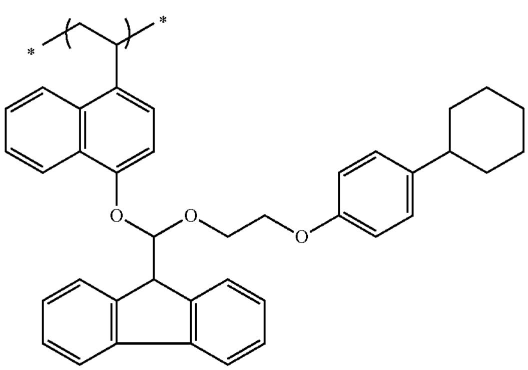
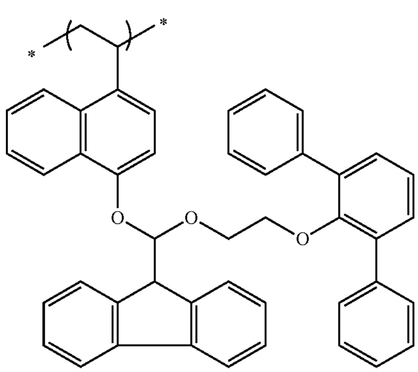
-continued
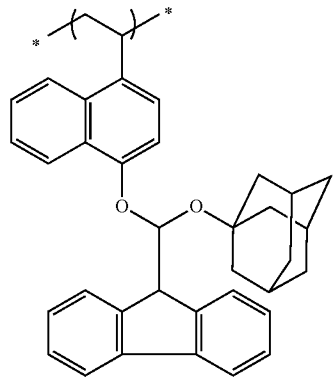
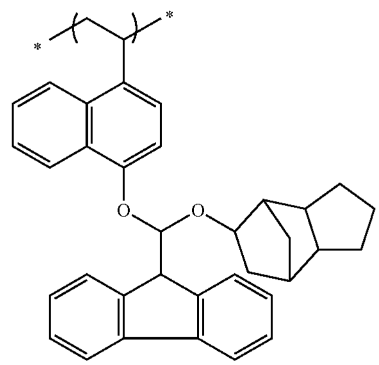
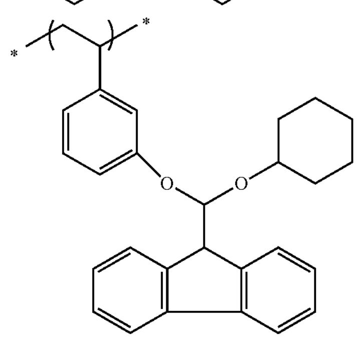
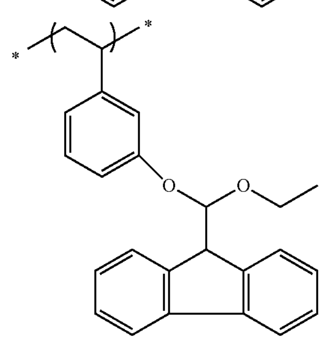
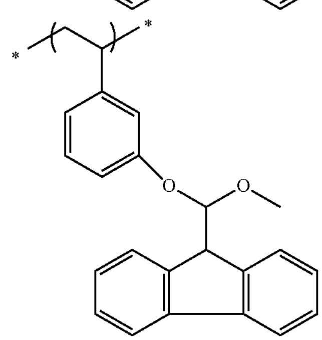

-continued
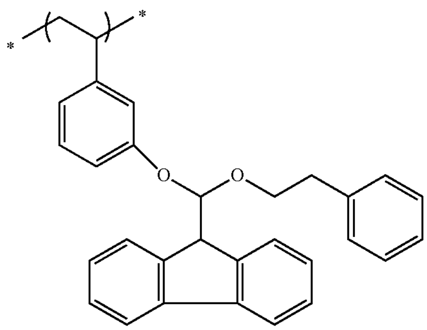
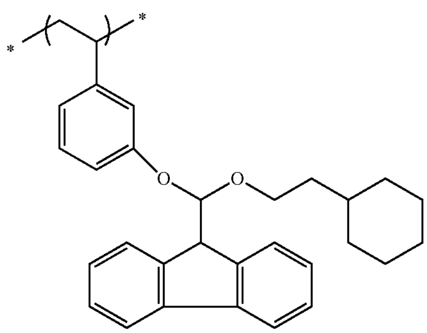
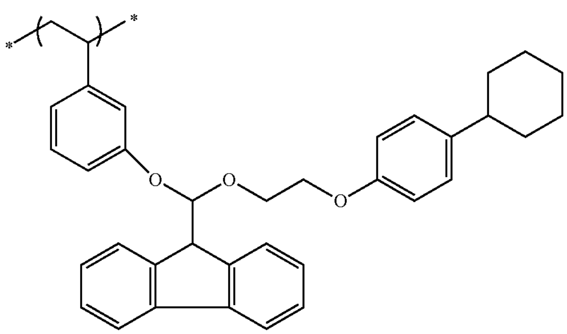
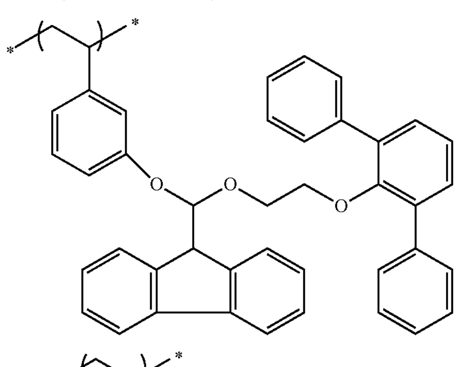
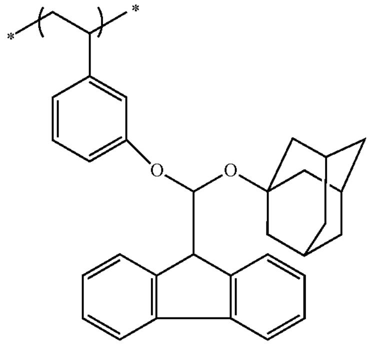
-continued
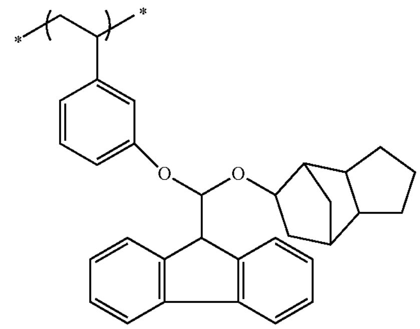
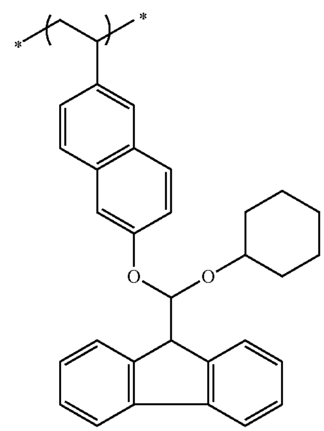
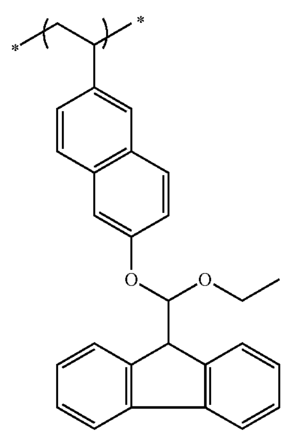
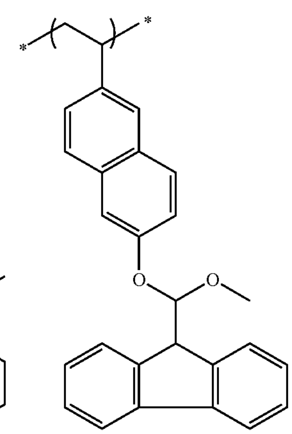
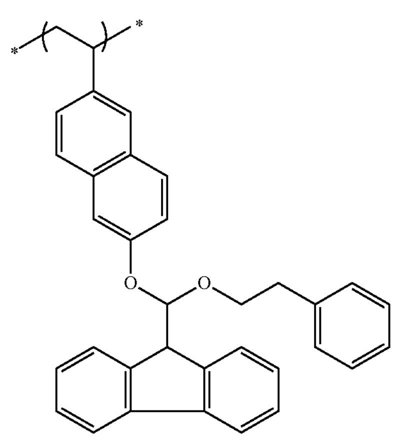

-continued
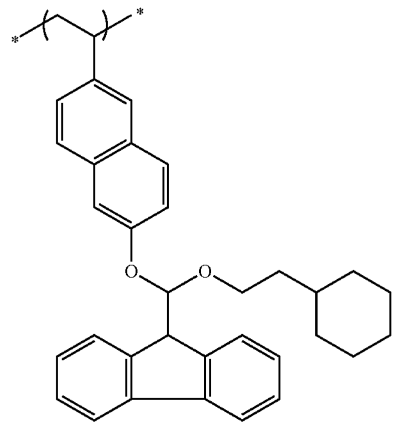
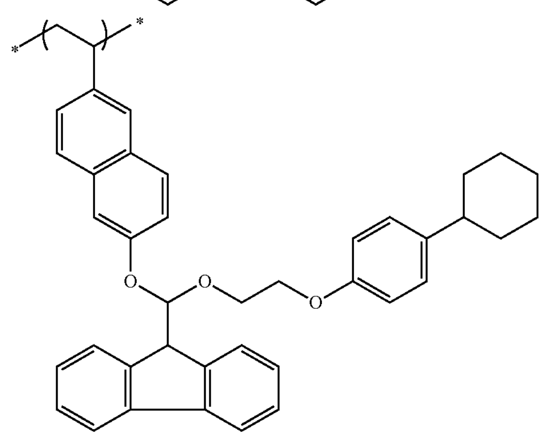
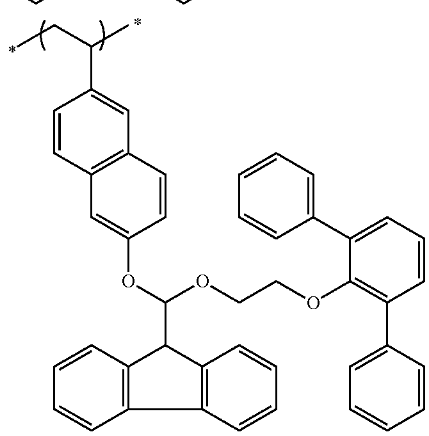
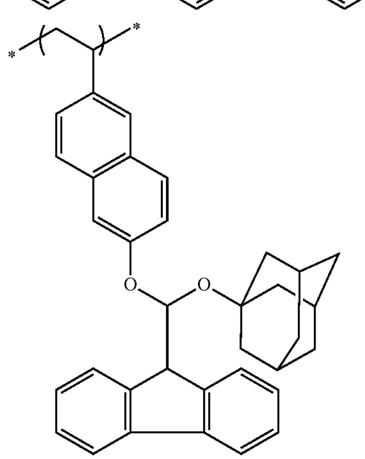
-continued
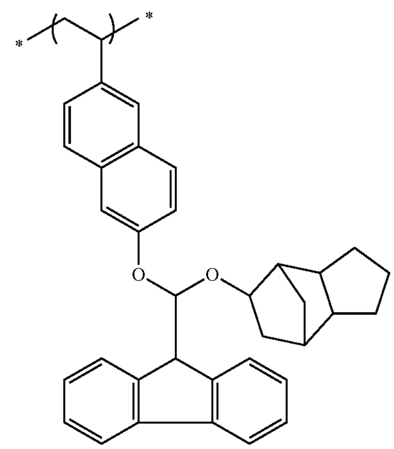
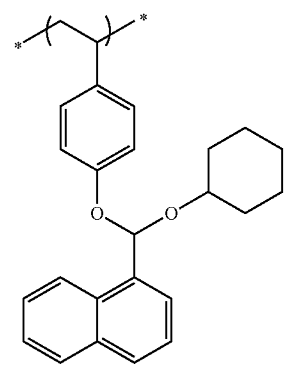
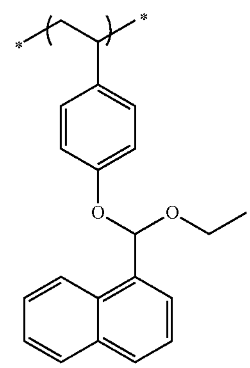
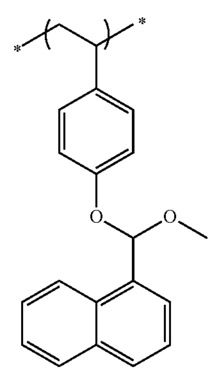
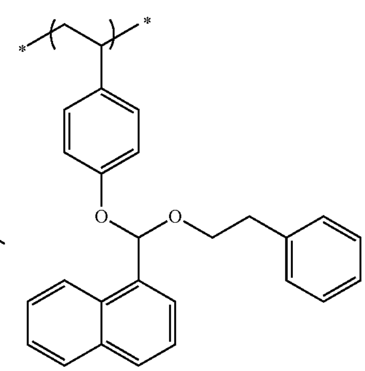
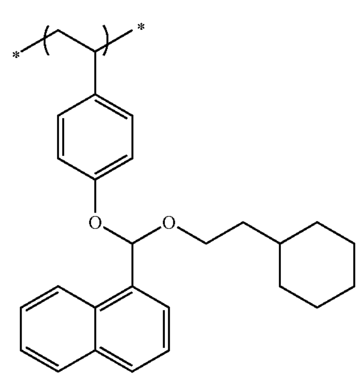

-continued
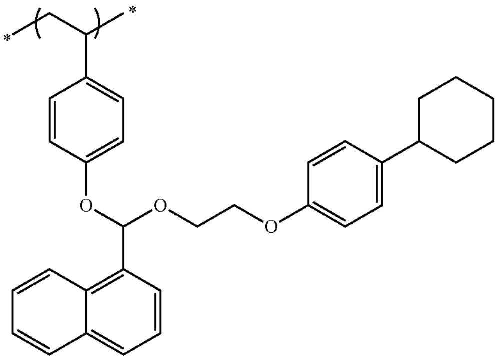
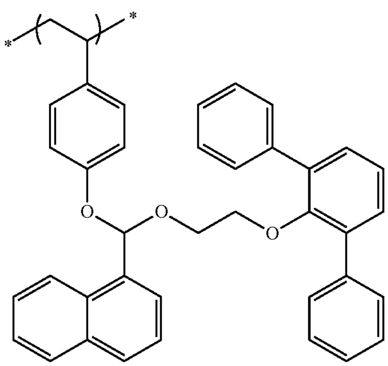
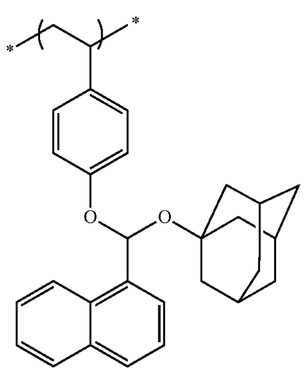
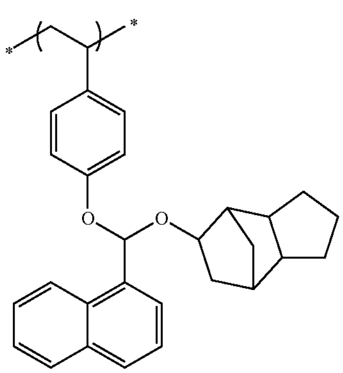
-continued
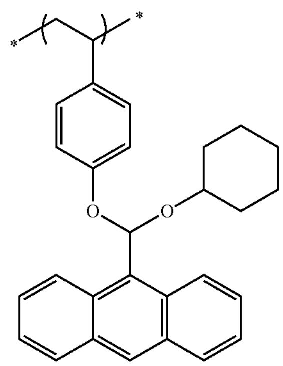
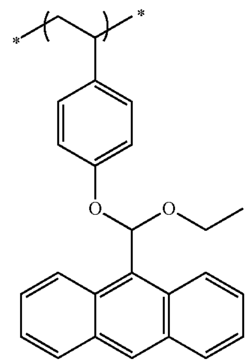
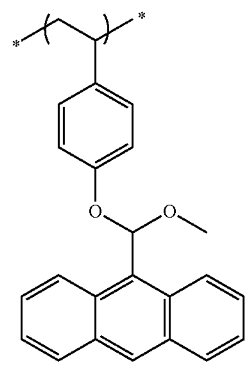
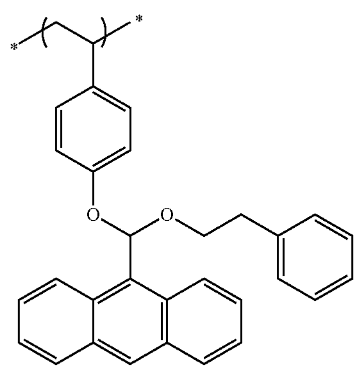
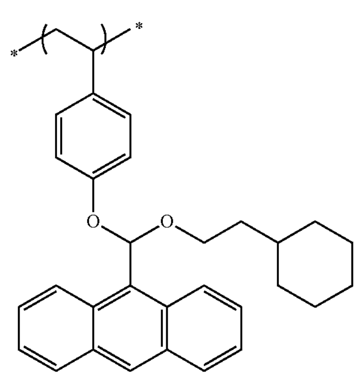

-continued
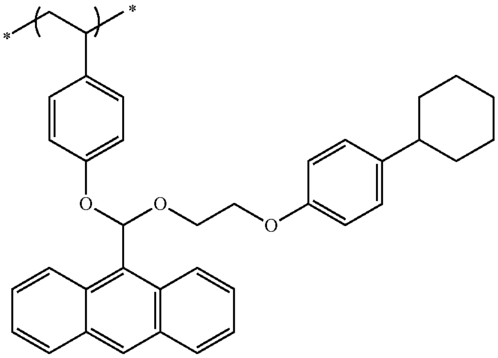
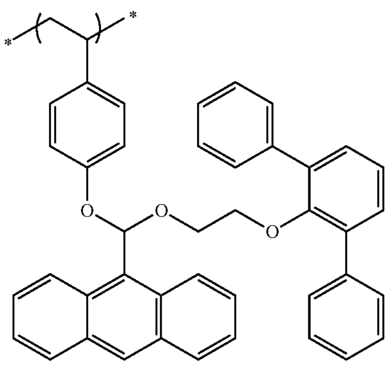
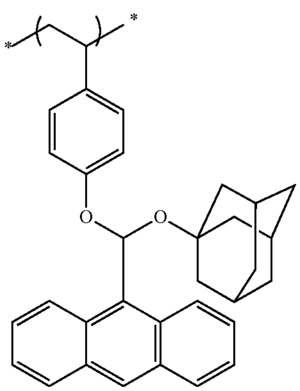
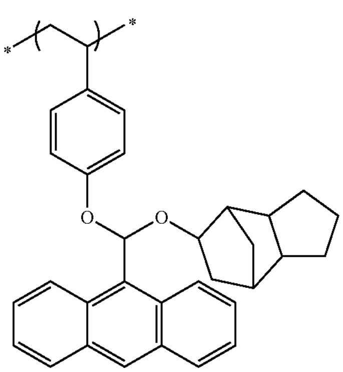
-continued
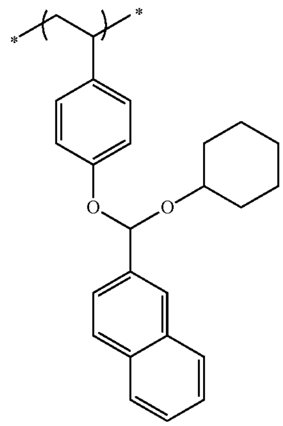
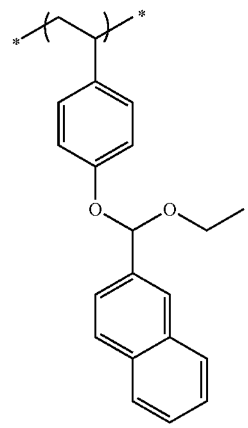
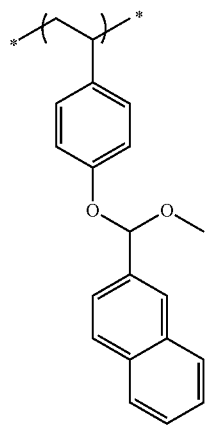
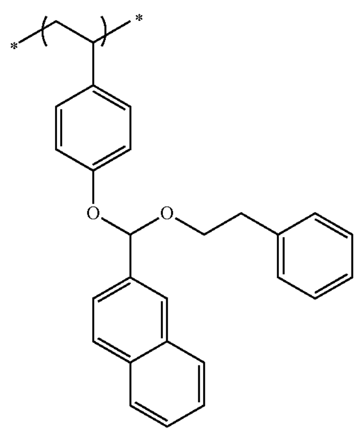
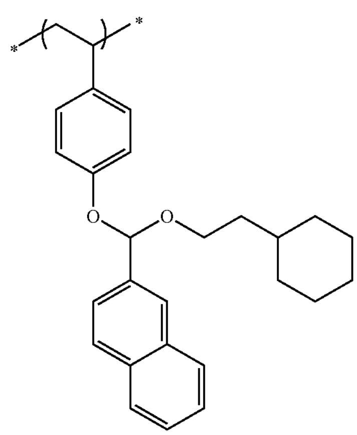

-continued
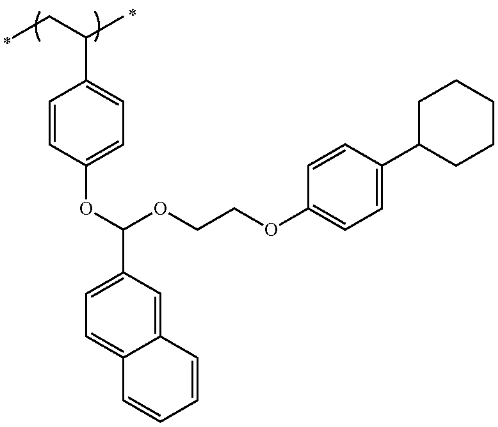
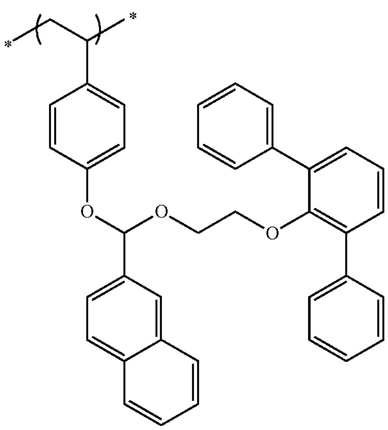
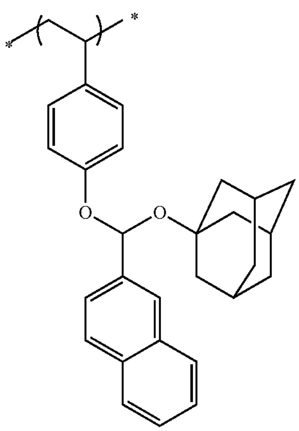
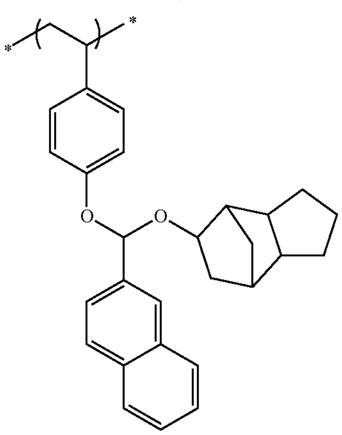
-continued
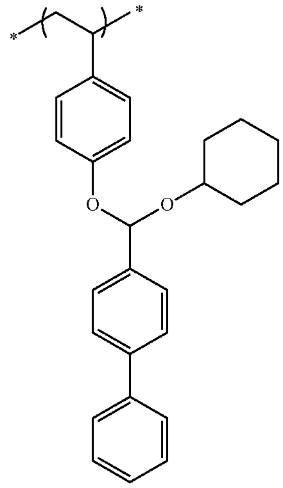
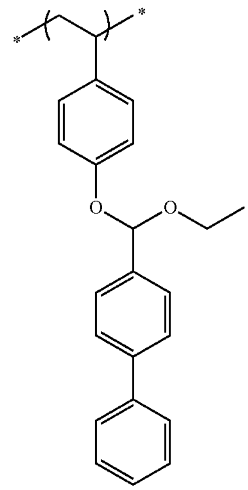
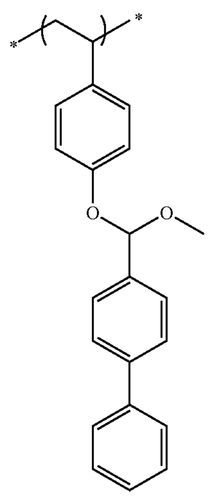
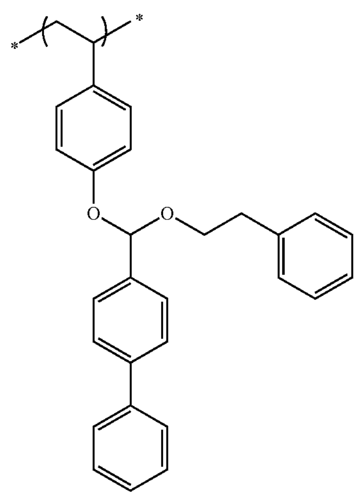
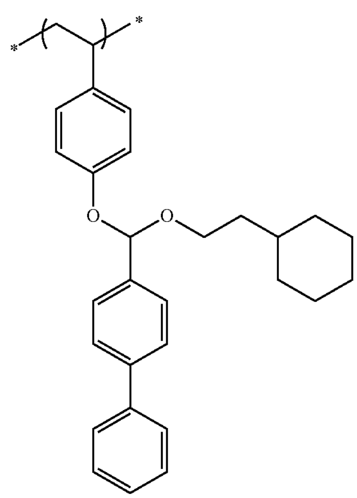

-continued
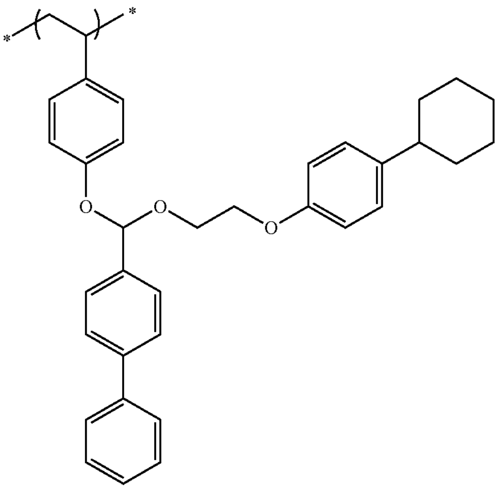
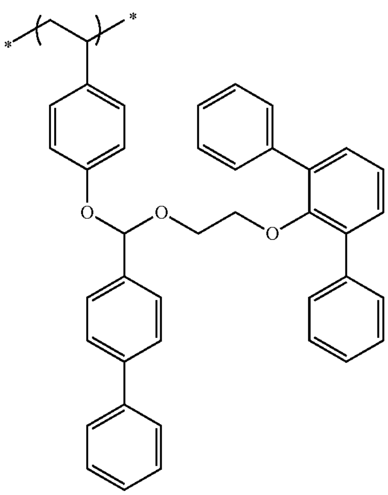
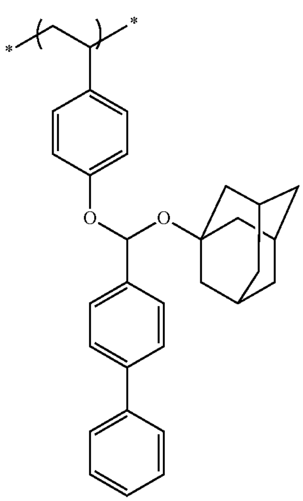
-continued
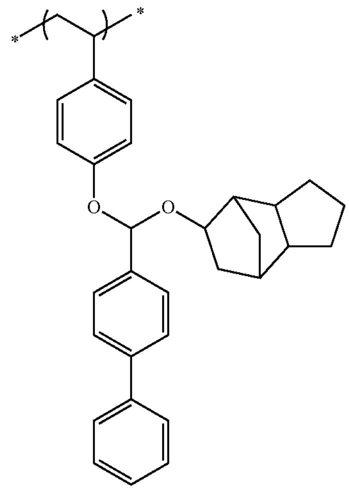
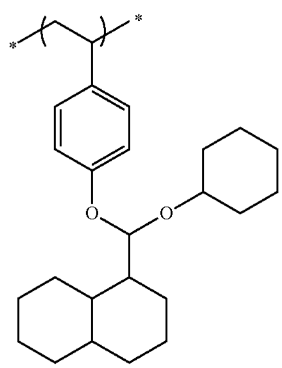
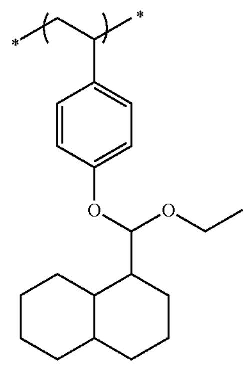
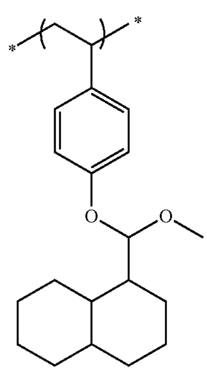
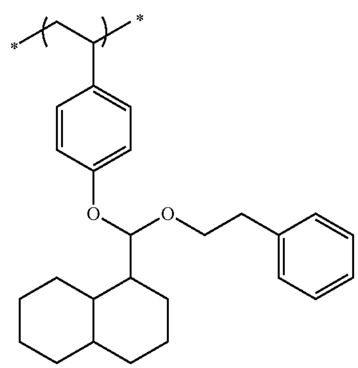
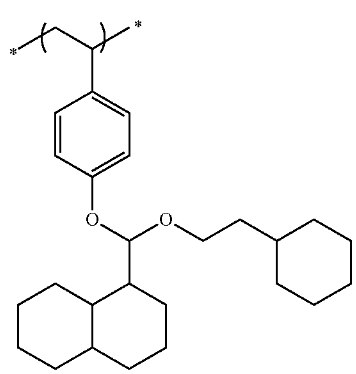

-continued
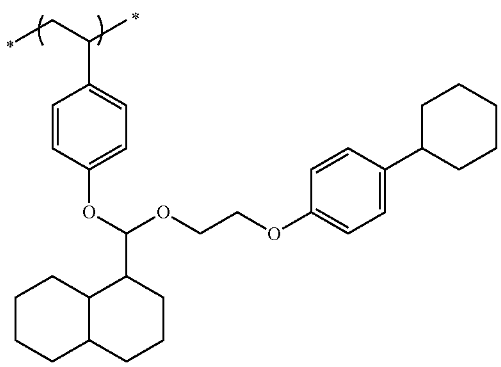
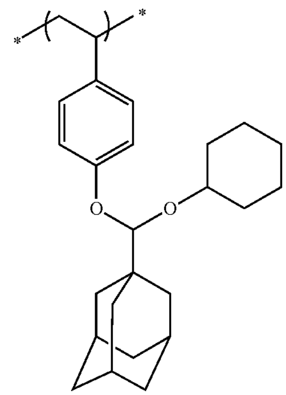
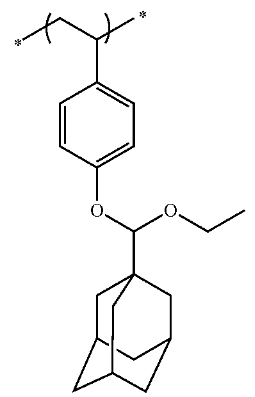
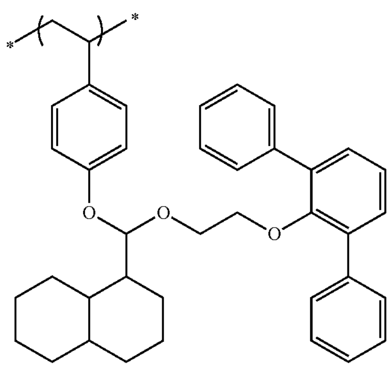
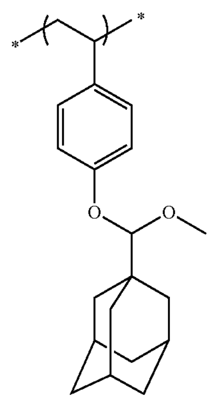
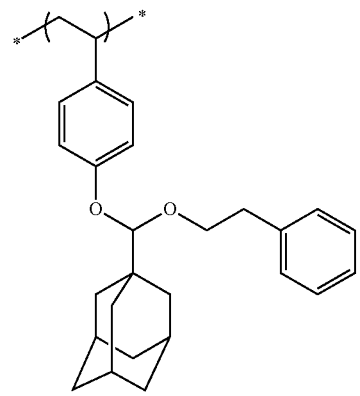
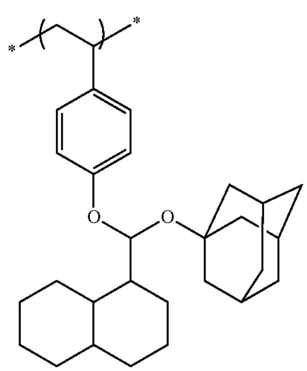
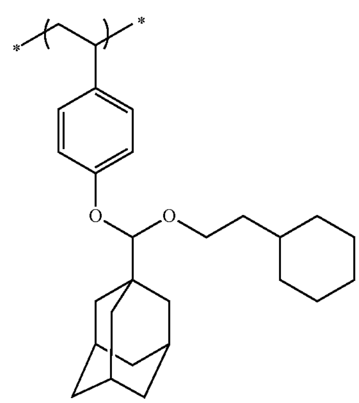
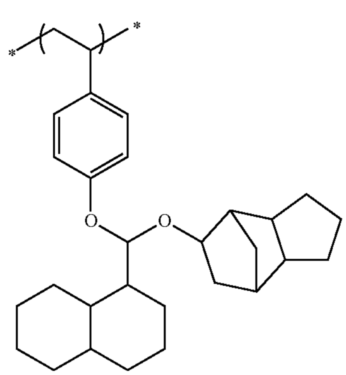
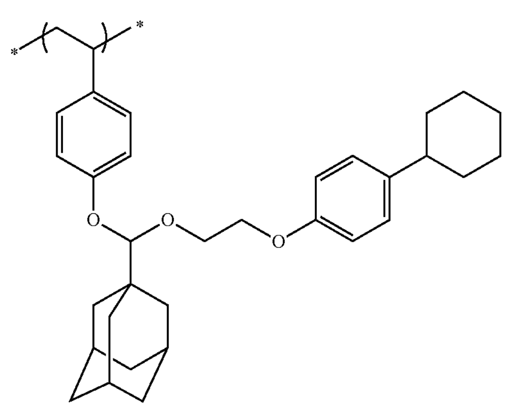

-continued
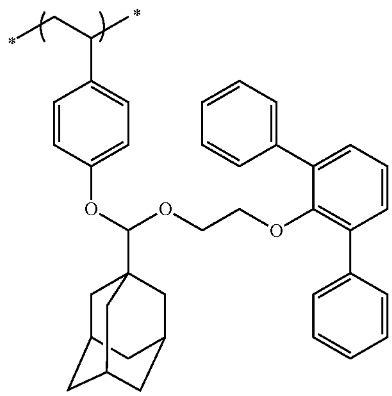
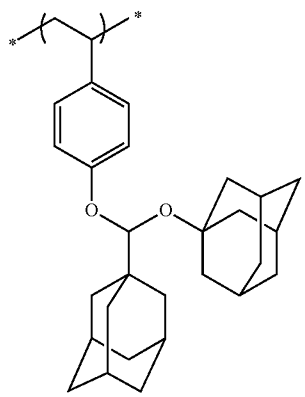
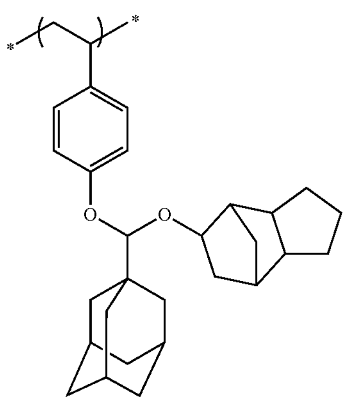
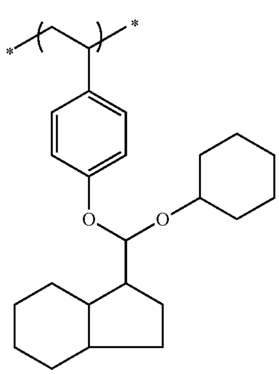
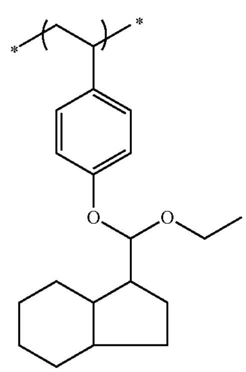
-continued
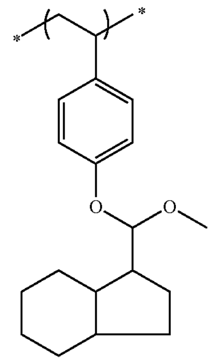
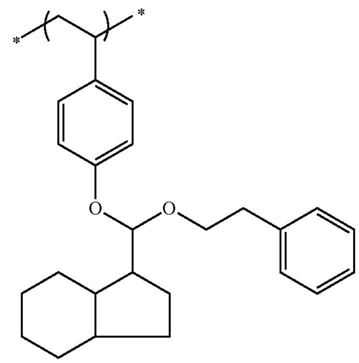
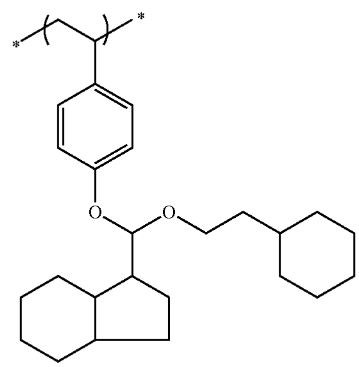
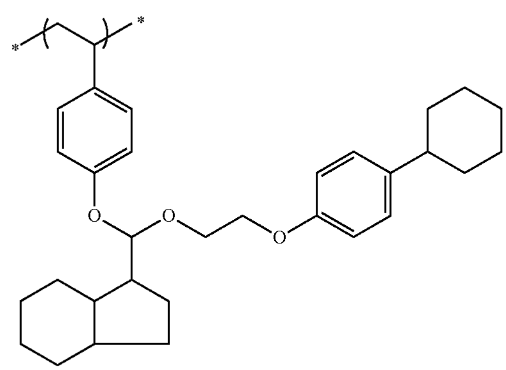
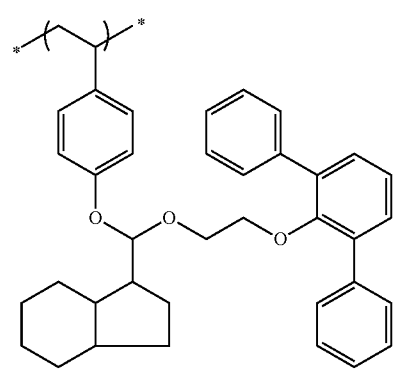

-continued
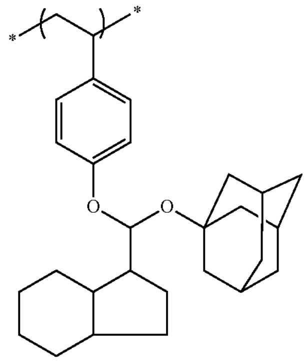
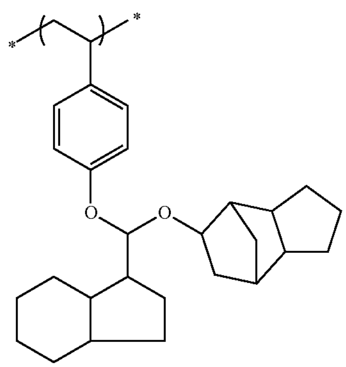
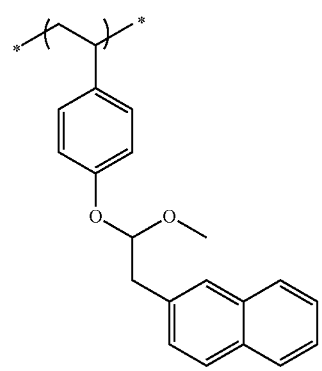
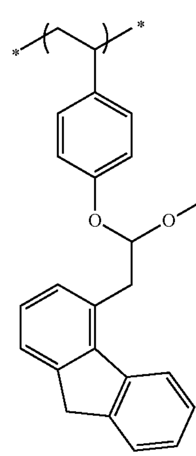
-continued
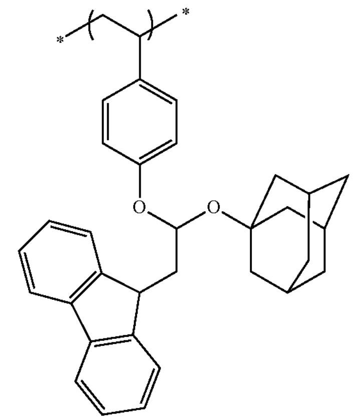
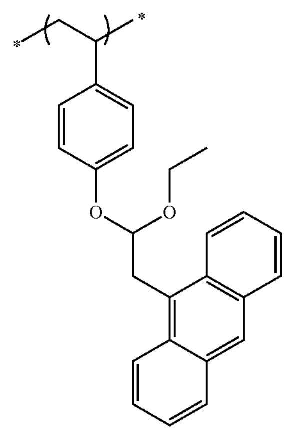
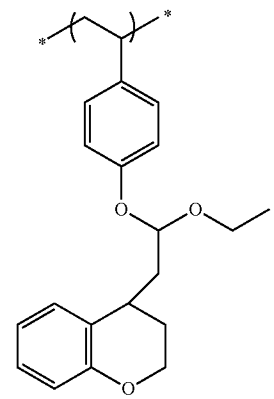
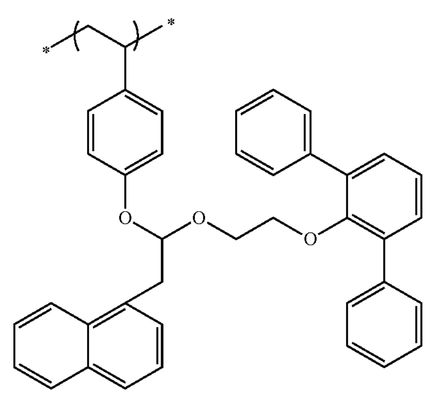
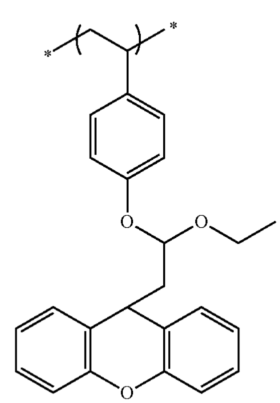

-continued

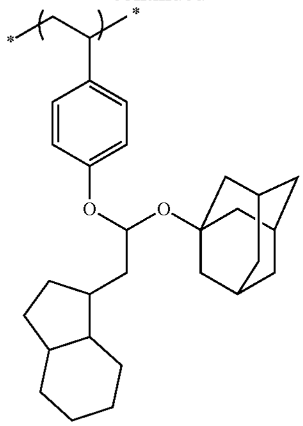

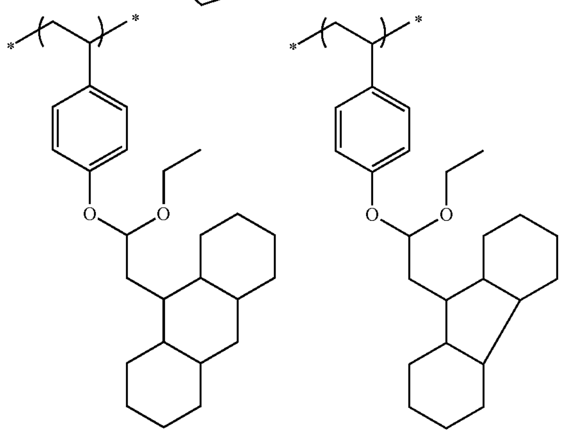

In the polymer compound (A) for use in the present invention, the content of the repeating unit having a structure where a hydrogen atom of a phenolic hydroxyl group is replaced by an acid labile group represented by formula (I), or the repeating unit represented by formula (II) or (VI), is generally from 1 to 50 mol %, preferably from 3 to 40 mol %, more preferably from 5 to 30 mol %, based on all repeating units in the polymer compound (A).

The polymer compound (A) for use in the present invention preferably further contains a repeating unit represented by the following formula (IV).

The repeating unit represented by the following formula (IV) is described below.

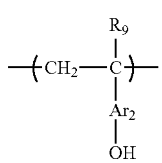

(IV)

(wherein $Ar_2$ represents an arylene group, and $R_9$ represents a hydrogen atom, an alkyl group or a halogen atom).

$R_9$ in formula (IV) has the same meaning as $R_1$ in formula (II), and preferred ranges are also the same.

$Ar_2$ in the repeating unit represented by formula (IV) represents an arylene group and may have a substituent in addition to —OH. The arylene group of $Ar_2$ is preferably an arylene group having a carbon number of 6 to 18, which may have a substituent, more preferably a phenylene group or a naphthylene group, which may have a substituent, still more preferably a phenylene group which may have a substituent. The substituent which may be substituted on $Ar_2$ includes the same substituents as in specific examples and preferred ranges of the substituent which may be substituted on R in formula (I). The arylene group represented by $Ar_2$ preferably has no substituent except for —OH.

In the repeating unit represented by formula (IV), when $Ar_2$ is a phenylene group, the bonding position of —OH to the benzene ring of $Ar_2$ may be a para-position, a meta-position or an ortho-position with respect to the bonding position of the benzene ring to the polymer main chain but is preferably a para-position or a meta-position.

The repeating unit represented by formula (IV) is a repeating unit having an alkali-soluble group and has a function of controlling alkali developability of the resist.

Preferred examples of the repeating unit represented by formula (IV) are illustrated below.

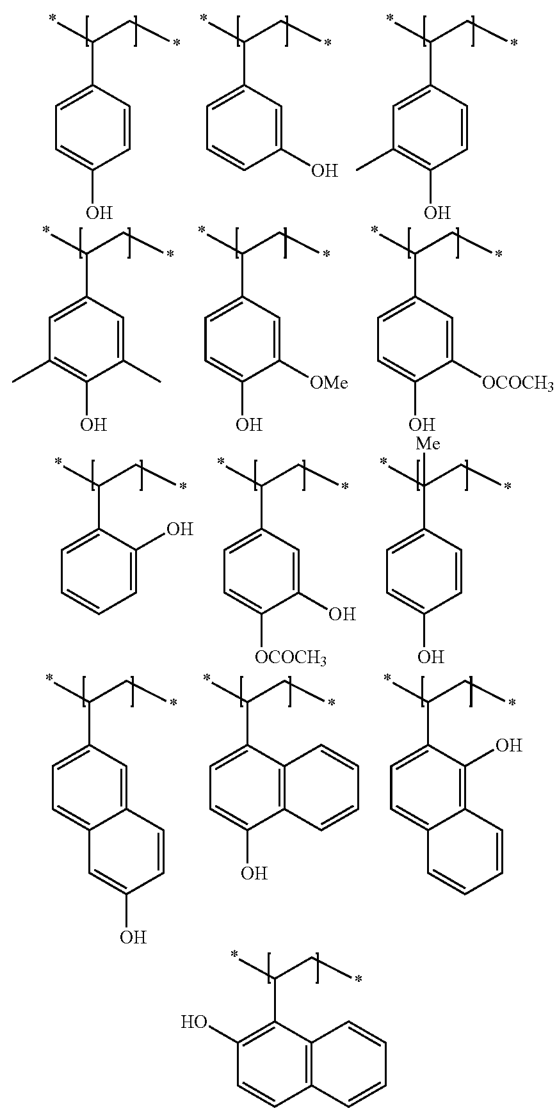

Among these, a preferred example of the repeating unit represented by formula (IV) is a repeating unit where $Ar_2$ is an unsubstituted phenylene group, and a repeating unit represented by the following formula (VII) is preferred. That is, the polymer compound (A) preferably further contains a repeating unit represented by the following formula (VII):

(VII)

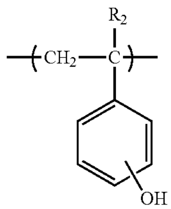

(wherein $R_2$ represents a hydrogen atom, an alkyl group or a halogen atom).

$R_2$ in formula (VII) has the same meaning as $R_1$ in formula (II), and preferred ranges thereof are also the same.

In the repeating unit represented by formula (VII), the bonding position of —OH to the benzene ring may be a para-position, a meta-position or an ortho-position with respect to the bonding position of the benzene ring to the polymer main chain but is preferably a para-position or a meta-position.

Specific examples of the repeating unit represented by formula (VII) include the followings.

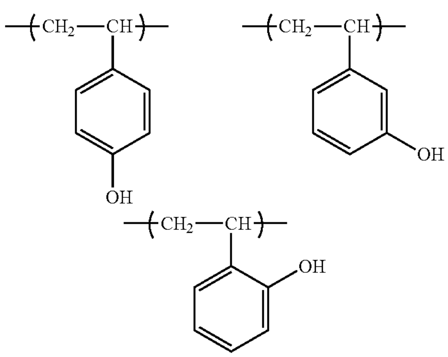

The content of the repeating unit represented by formula (IV) in the polymer compound (A) for use in the present invention is preferably from 30 to 95 mol %, more preferably from 40 to 90 mol %, still more preferably from 50 to 90 mol %, based on all repeating units in the polymer compound (A).

It is also preferred that the polymer compound (A) for use in the present invention further contains the following repeating unit as a repeating unit other than the repeating unit having a structure where a hydrogen atom of a phenolic hydroxyl group is replaced by an acid labile group represented by formula (I), the repeating unit represented by formula (II) or (VI), and the repeating unit represented by formula (IV) or (VII).

For example, in the positive resist composition of the present invention, the polymer compound (A) may further contain a repeating unit having a group capable of decomposing by the action of an acid to generate an alkali-soluble group (hereinafter, sometimes referred to as an "acid-decomposable group-containing repeating unit"), other than the repeating unit having a structure where a hydrogen atom of a phenolic hydroxyl group is replaced by an acid labile group represented by formula (I), and the repeating unit represented by formula (II) or (VI).

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a phenolic hydroxyl group, a carboxyl group, a fluorinated alcohol group (preferably 2-hydroxy-hexafluoroisopropyl group) and a sulfonic acid group.

The group preferred as the acid-decomposable group is a group where a hydrogen atom of the alkali-soluble group above is replaced by a group capable of leaving by the action of an acid.

Examples of the group capable of leaving by the action of an acid include $—C(R_{36})(R_{37})(R_{38})$, $—C(R_{36})(R_{37})(OR_{39})$ and $—C(R_{01})(R_{02})(OR_{39})$.

In the formulae, each of $R_{36}$ to $R_{39}$ independently represents an alkyl group, a cycloalkyl group, a monovalent aromatic ring group, a group formed by combining an alkylene group and a monovalent aromatic ring group, or an alkenyl group. $R_{36}$ and $R_{37}$ may combine with each other to form a ring.

Each of $R_{01}$ and $R_{02}$ independently represents a hydrogen atom, an alkyl group, a cycloalkyl group, a monovalent aromatic ring group, a group formed by combining an alkylene group and a monovalent aromatic ring group, or an alkenyl group.

The repeating unit capable of decomposing by the action of an acid to produce an alkali-soluble group is preferably a repeating unit represented by the following formula (VIII), because the reactivity is high and the sensitivity fluctuation during post baking or the process fluctuation during production is small. In the positive resist composition, the repeating unit represented by formula (VIII) is a repeating unit having, on the side chain, an acetal or ketal group which is a group capable of decomposing by the action of an acid and becoming an alkali-soluble group.

(VIII)

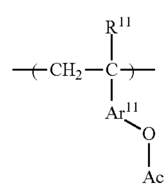

(wherein $R^{11}$ represents a hydrogen atom or a methyl group, $Ar^{11}$ represents an arylene group, Ac represents a group capable of leaving by the action of an acid, and —OAc represents an acetal or ketal group capable of decomposing by the action of an acid to produce an alkali-soluble group).

With respect to the repeating unit represented by formula (VIII), preferred compounds for use in the present invention are described below.

In formula (VIII), $R^{11}$ represents a hydrogen atom or a methyl group and is preferably a hydrogen atom.

In formula (VIII), $Ar^{11}$ represents an arylene group and may have a substituent. The arylene group of $Ar_{11}$ is preferably an arylene group having a carbon number of 6 to 18, which may have a substituent, more preferably a phenylene or naphthylene group, each of which may have a substituent, and most preferably a phenylene group which may have a substituent. Examples of the substituent which may be substituted on $Ar_{11}$ include an alkyl group, a halogen atom, a hydroxyl group, an alkoxy group, a carboxyl group and an alkoxycarbonyl group.

In the repeating unit represented by formula (VIII), when $Ar^{11}$ is a phenylene group, the bonding position of —OAc to the benzene ring of $Ar^{11}$ may be a para-position, a meta-position or an ortho-position with respect to the bonding position of the benzene ring to the polymer main chain but is preferably a para-position or a meta-position.

In formula (VIII), Ac is a group capable of leaving by the action of an acid, and —OAc represents an acetal or ketal group capable of decomposing by the action of an acid to produce an alkali-soluble group. Specifically, Ac is preferably a group represented by the following formula (IX):

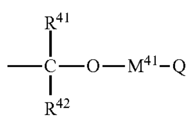

(IX)

In formula (IX), each of $R^{41}$ and $R^{42}$ independently represents a hydrogen atom, an alkyl group, a monocyclic cycloalkyl group, a monocyclic aryl group or a monocyclic aralkyl group.

$M^{41}$ represents a single bond or a divalent linking group.

Q represents an alkyl group, an alicyclic group which may contain a heteroatom, or an aromatic ring group which may contain a heteroatom.

Incidentally, at least two members of $R^{41}$, $R^{42}$, $M^{41}$ and Q may combine with each other to form a ring. This ring is preferably a 5- or 6-membered ring.

The alkyl group as $R^{41}$ and $R^{42}$ is, for example, an alkyl group having a carbon number of 1 to 8.

The monocyclic cycloalkyl group as $R^{41}$ and $R^{42}$ is, for example, a monocyclic cycloalkyl group having a carbon number of 3 to 15.

The monocyclic aryl group as $R^{41}$ and $R^{42}$ is, for example, a monocyclic aryl group having a carbon number of 6 to 15.

The monocyclic aralkyl group as $R^{41}$ and $R^{42}$ is, for example, a monocyclic aralkyl group having a carbon number of 6 to 20.

Each of $R^{41}$ and $R^{42}$ is preferably a hydrogen atom, a methyl group, a phenyl group or a benzyl group. Also, at least either one of $R^{41}$ and $R^{42}$ is preferably a hydrogen atom (that is, —OAc is an acetal group capable of decomposing by the action of an acid to produce an alkali-soluble group).

The divalent linking group as $M^{41}$ is, for example, an alkylene group (preferably an alkylene group having a carbon number of 1 to 8, e.g., methylene, ethylene, propylene, butylene, hexylene, octylene), a cycloalkenylene group (preferably a cycloalkylene group having a carbon number of 3 to 15, e.g., cyclopentylene, cyclohexylene), —S—, —O—, —CO—, —CS—, —$SO_2$—, —$N(R_0)$—, or a combination of two or more thereof, and a linking group having a total carbon number of 20 or less is preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

$M^{41}$ is preferably a single bond, an alkylene group, or a divalent linking group composed of a combination of an alkylene group and at least one of —O—, —CO—, —CS— and —$N(R_0)$—, more preferably a single bond, an alkylene group, or a divalent linking group composed of a combination of an alkylene group and —O—. Here, $R_0$ has the same meaning as $R_0$ above.

The alkyl group as Q is, for example, the same as the above-described alkyl group of $R^{41}$ and $R^{42}$.

The alicyclic group and aromatic ring group as Q include, for example, the above-described cycloalkyl group and aryl group of $R^{41}$ and $R^{42}$. However, the cycloalkyl group and aryl group as Q may be polycyclic. The carbon number thereof is preferably from 3 to 15. Incidentally, in the present invention, a group formed by combining plural aromatic rings through a single bond (for example, a biphenyl group and a terphenyl group) is also included in the aromatic group of Q.

Examples of the heteroatom-containing alicyclic group and heteroatom-containing aromatic ring group include thiirane, cyclothiolane, thiophene, furan, pyrrole, benzothiophene, benzofuran, benzopyrrole, triazine, imidazole, benzimidazole, triazole, thiadiazole, thiazole and pyrrolidone. Incidentally, in the present invention, a group formed by combining plural "heteroatom-containing aromatic rings" through a single bond (for example, a viologen group) is also included in the aromatic group of Q.

The alicyclic group and aromatic ring group as Q may have a substituent, and examples thereof include an alkyl group, a cycloalkyl group, a cyano group, a halogen atom, a hydroxyl group, an alkoxy group, a carboxyl group and an alkoxycarbonyl group.

($-M^{41}-Q$) is preferably a methyl group, an aryloxyethyl group, a cyclohexylethyl group or an arylethyl group.

Examples of the case where at least two members of $R^{41}$, $R^{42}$, $M^{41}$ and Q combine with each other to form a ring include a case where either $M^{41}$ or Q combine with $R^{41}$ to form a propylene group or a butylene group and thereby form a 5- or 6-membered ring containing oxygen atom.

In view of dry etching resistance, at least one of $R^{41}$, $R^{42}$, $M^{41}$ and Q preferably has an alicyclic or aromatic ring. Here, the alicyclic group and the aromatic ring group are the same, for example, as the above-described alicyclic group and aromatic ring group of Q.

As the repeating unit capable of decomposing by the action of an acid to produce an alkali-soluble group, a repeating unit represented by formula (X) is also preferred. In the positive resist composition, the repeating unit represented by formula (X) is a repeating unit capable of decomposing by the action of an acid to produce a carboxyl group as an alkali-soluble group in the side chain.

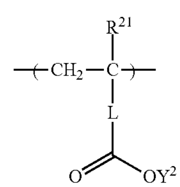

(X)

(wherein $R^{21}$ represents a hydrogen atom or a methyl group, L represents a single bond or a divalent linking group, and $Y^2$ represents a group capable of leaving by the action of an acid).

With respect to the repeating unit represented by formula (X), preferred compounds for use in the present invention are described below.

In formula (X), $R^{21}$ represents a hydrogen atom or a methyl group and is preferably a hydrogen atom.

In the case where L is a divalent linking group, examples thereof include an alkylene group, a cycloalkylene group, an arylene group, —O—, —$SO_2$—, —CO—, —N($R_N$)— and a combination of plural these members. Here, $R_N$ represents an aryl group, an alkyl group or a cycloalkyl group.

The alkylene group as L is preferably an alkylene group having a carbon number of 1 to 10.

The cycloalkylene group as L is preferably a cycloalkylene group having a carbon number of 5 to 10.

The arylene group as L is preferably an arylene group having a carbon number of 4 to 20.

The carbon number of the aryl group as $R_N$ is preferably from 4 to 20, more preferably from 6 to 14.

The carbon number of the alkyl group as $R_N$ is preferably from 1 to 8.

The carbon number of the cycloalkyl group as $R_N$ is preferably from 5 to 8.

Each of the groups of L may further have a substituent, and specific examples of the substituent are the same as those of the substituent which may be further substituted on the arylene group of $Ar^{11}$.

$Y^2$ represents a group capable of leaving by the action of an acid and specifically, is preferably a group represented by the following formula:

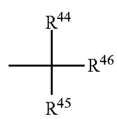

wherein each of $R^{44}$ to $R^{46}$ independently represents an alkyl group or a cycloalkyl group, and two members out of $R^{44}$ to $R^{46}$ may combine with each other to form a cycloalkyl group.

The alkyl group of $R^{44}$ to $R^{46}$ is preferably a linear or branched alkyl group having a carbon number of 1 to 4.

The cycloalkyl group of $R^{44}$ to $R^{46}$ is preferably a monocyclic cycloalkyl group having a carbon number of 3 to 8 or a polycyclic cycloalkyl group having a carbon number of 7 to 20.

The cycloalkyl group which may be formed by combining two members out of $R^{44}$ to $R^{46}$ with each other is preferably a monocyclic cycloalkyl group having a carbon number of 3 to 8 or a polycyclic cycloalkyl group having a carbon number of 7 to 20. Above all, a monocyclic cycloalkyl group having a carbon number of 5 to 6 is preferred. An embodiment where $R^{46}$ is a methyl group or an ethyl group and $R^{44}$ and $R^{45}$ are combined with each other to form the above-described cycloalkyl group, is more preferred.

It is also preferred that $Y^2$ is a group represented by the following formula:

$$—(CH_2)_{a1}—\overset{\displaystyle O}{\overset{\|}{C}}—O—R^{30}$$

In the formula, $R^{30}$ represents a tertiary alkyl group having a carbon number of 4 to 20, preferably from 4 to 15, a trialkylsilyl group with each alkyl group having a carbon number of 1 to 6, an oxoalkyl group having a carbon number of 4 to 20, or a group represented by —C($R^{44}$)($R^{45}$)($R^{46}$). Specific examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group. Specific examples of the trialkylsilyl group include a trimethylsilyl group, a triethylsilyl group, and a dimethyl-tert-butylsilyl group. Specific examples of the oxoalkyl group include a 3-oxocyclohexyl group, a 4-methyl-2-oxooxan-4-yl group, and a 5-methyl-2-oxooxolan-5-yl group. a1 is an integer of 1 to 6.

Specific examples of the repeating unit having a group capable of decomposing by the action of an acid to produce an alkali-soluble group are illustrated below, but the present invention is not limited thereto.

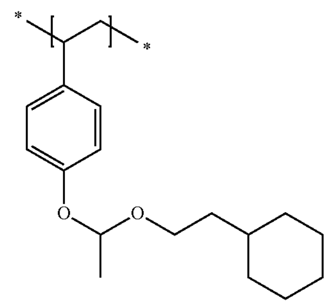

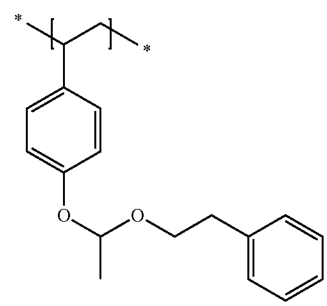

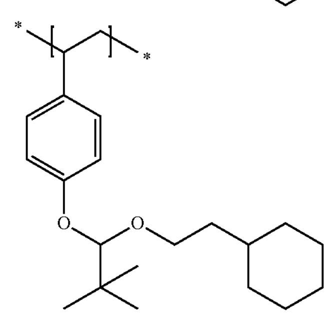

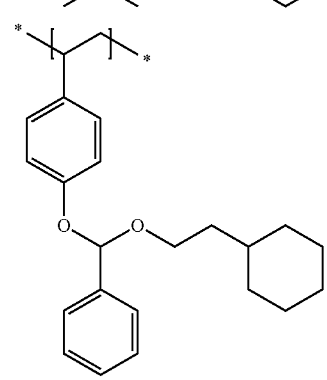

-continued
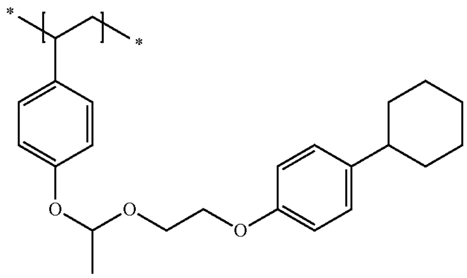
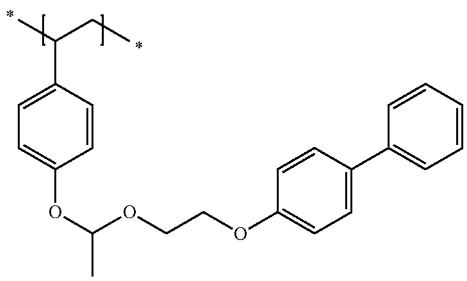
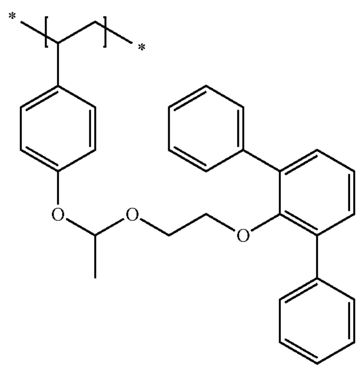
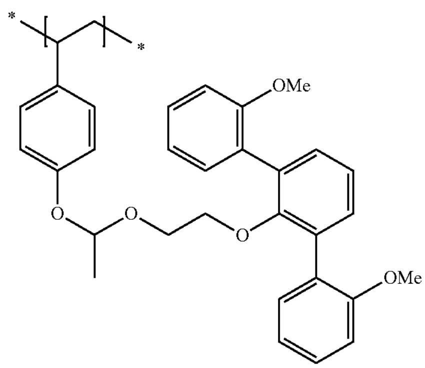
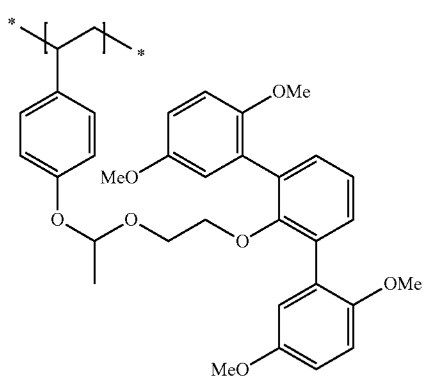
-continued
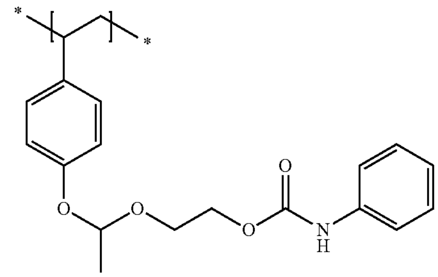
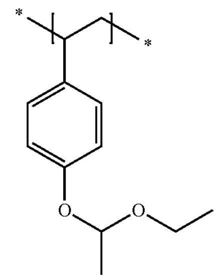
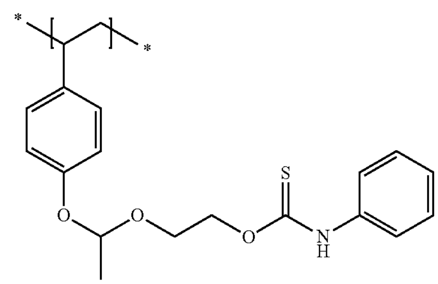
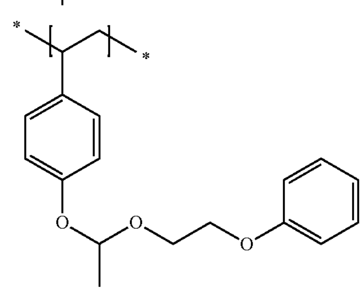
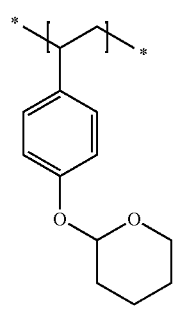
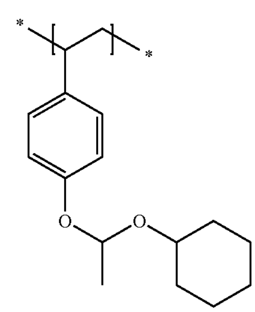
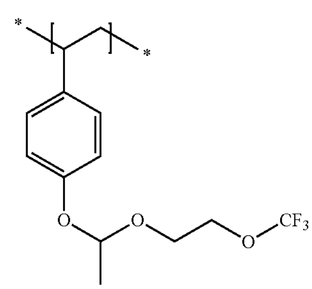

-continued
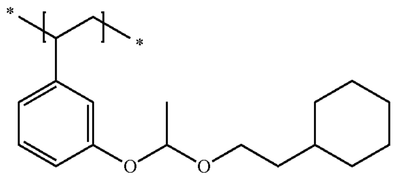
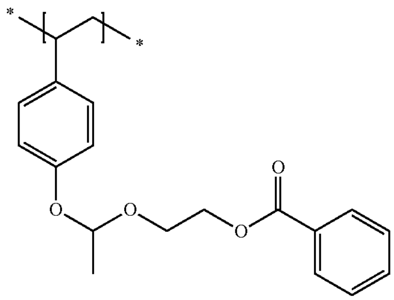
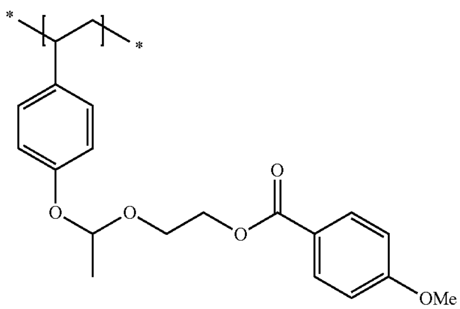
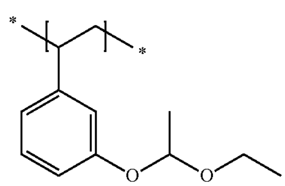
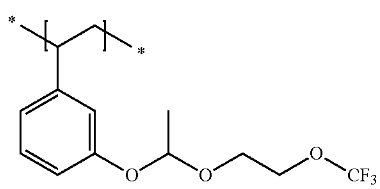
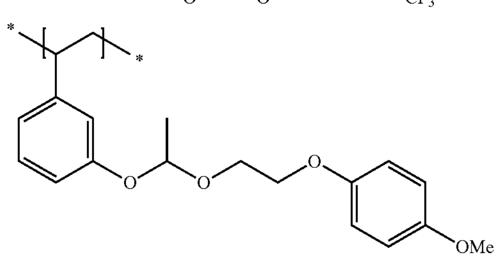
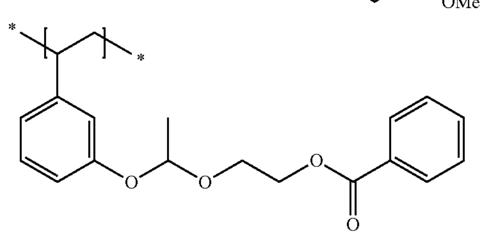
-continued
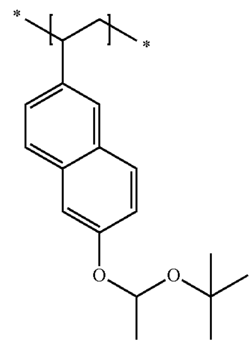
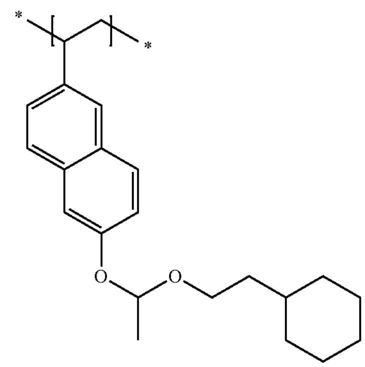
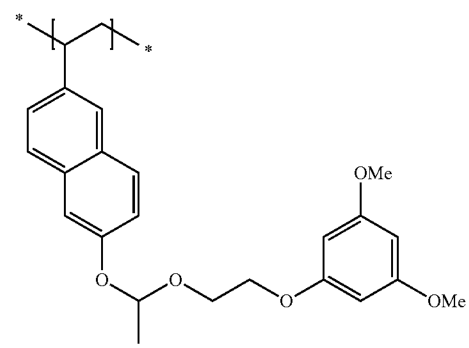
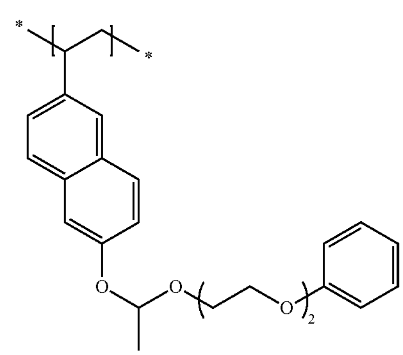

-continued
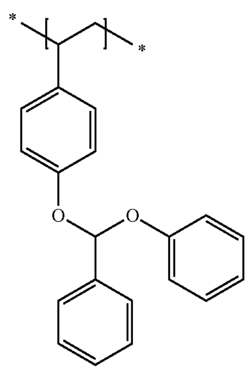
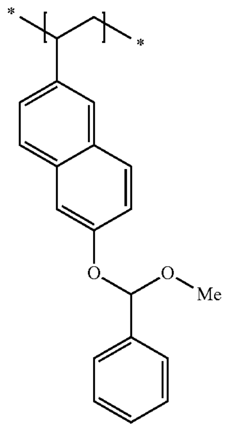
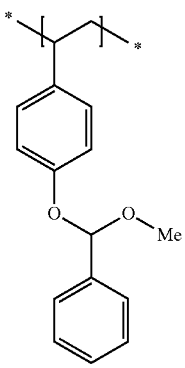
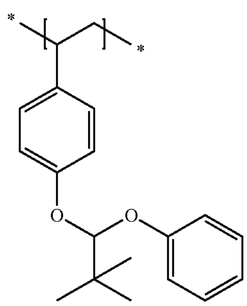
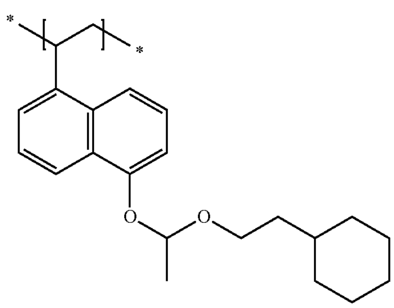
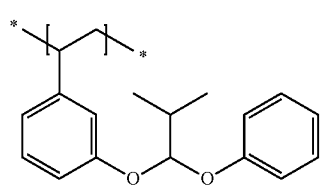
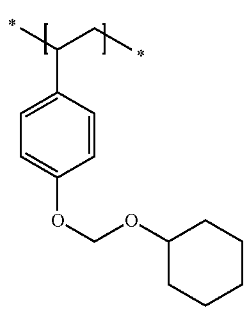
-continued
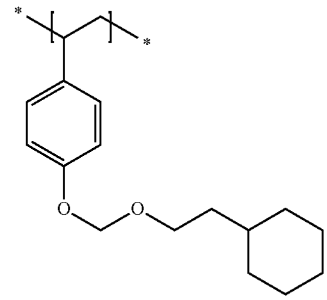
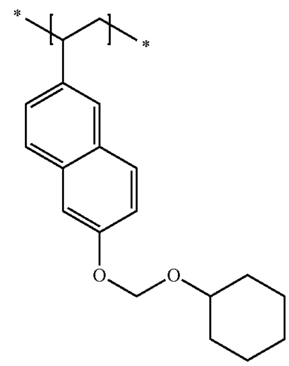
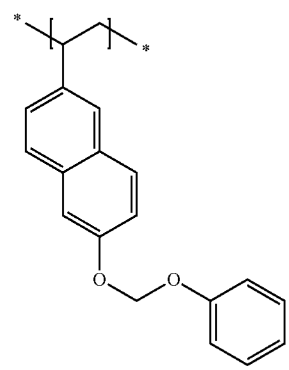
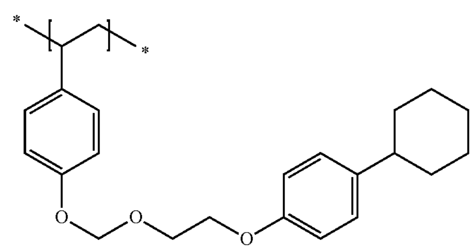
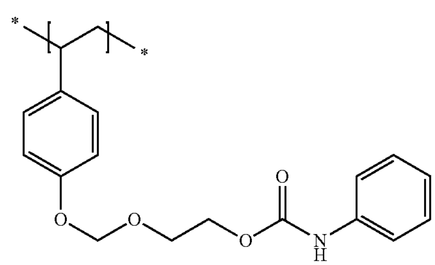
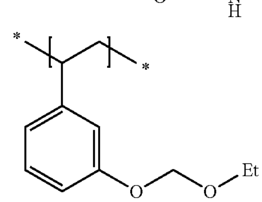

-continued

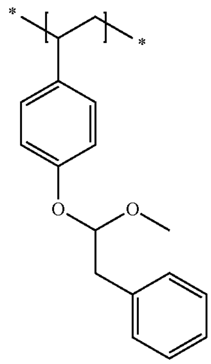

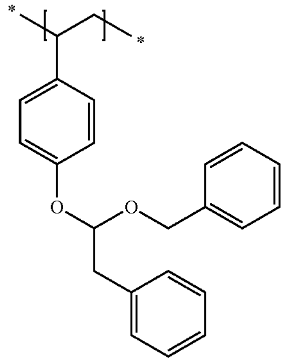

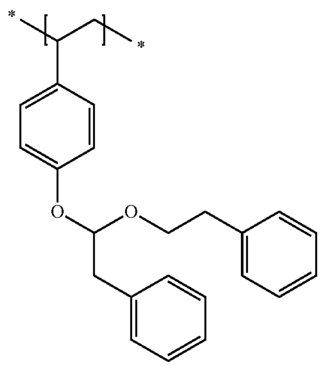

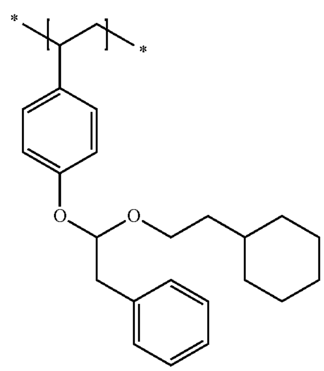

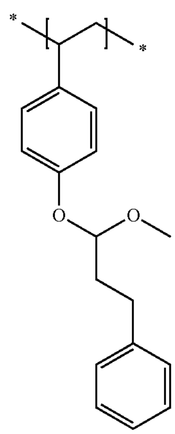

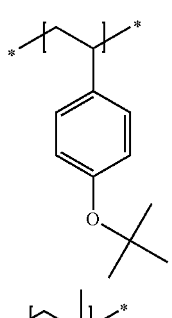

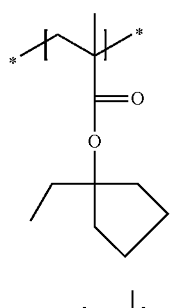

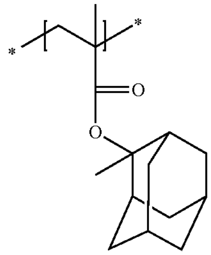

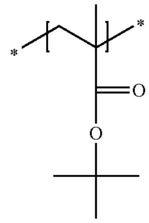

The polymer compound (A) for use in the present invention may or may not contain a repeating unit capable of decomposing by the action of an acid to generate an alkali-soluble group, other than the repeating unit having a structure where a hydrogen atom of a phenolic hydroxyl group is replaced by an acid labile group represented by formula (I), and the repeating unit represented by formula (II) or (VI), but in the case of containing the repeating unit, the content thereof is preferably from 3 to 60 mol %, more preferably from 5 to 50 mol %, still more preferably from 7 to 40 mol %, based on all repeating units in the polymer compound (A).

It is also preferred that the polymer compound (A) for use in the present invention further contains the following repeating unit as a repeating unit other than the above-described repeating units.

For example, the polymer compound (A) for use in the present invention may further contain a repeating unit having a group capable of decomposing by the action of an alkali developer to increase the dissolution rate in an alkali developer. Examples of such a group include a group having a lactone structure, and a group having a phenyl ester structure. The repeating unit having a group capable of decomposing by the action of an alkali developer to increase the dissolution rate in an alkali developer is preferably a repeating unit represented by the following formula (AII):

(AII)

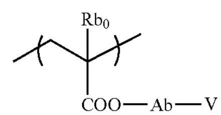

In formula (AII), V represents a group capable of decomposing by the action of an alkali developer to increase the dissolution rate in an alkali developer, $Rb_0$ represents a hydrogen atom or a methyl group, and Ab represents a single bond or a divalent organic group.

V as a group capable of decomposing by the action of an alkali developer is a group having an ester bond and preferably a group having a lactone structure. As for the group having a lactone structure, any group may be used as long as it has a lactone structure, but the group is preferably a 5- to 7-membered ring lactone structure, and a 5- to 7-membered ring lactone structure to which another ring structure is fused to form a bicyclo structure or a spiro structure is preferred.

Ab is preferably a single bond or a divalent linking group represented by $-AZ—CO_2—$ (wherein AZ is an alkylene group or an aliphatic ring group). AZ is preferably a methylene group, an ethylene group, a cyclohexylene group, an adamantylene group or a norbornylene group.

Specific examples are illustrated below. In formulae, Rx represents H or $CH_3$.

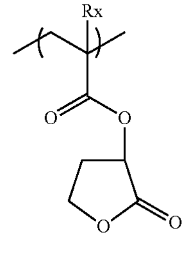

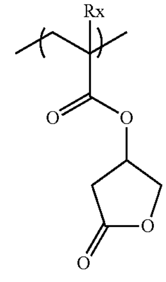

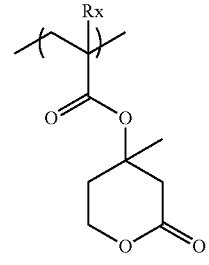

-continued
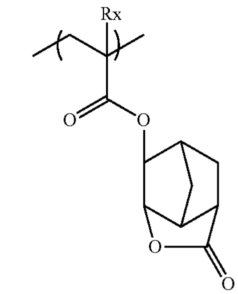
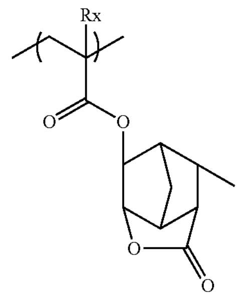
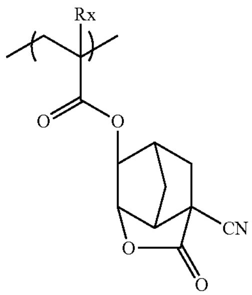
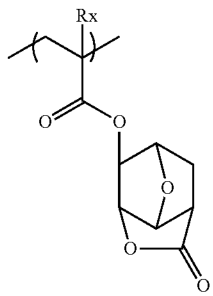
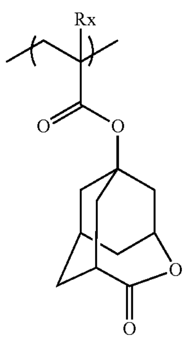
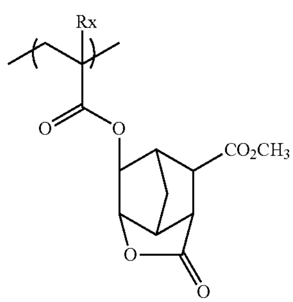
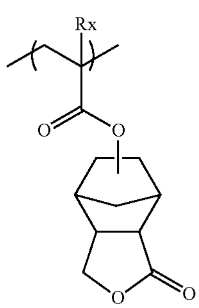
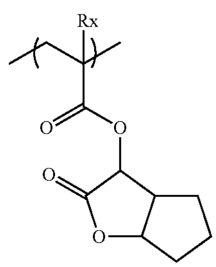
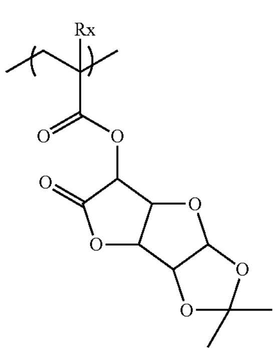
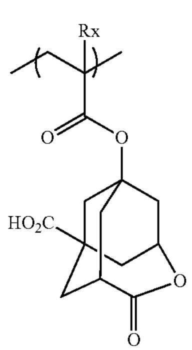
-continued
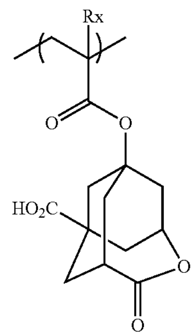
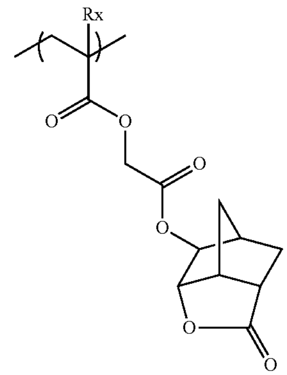
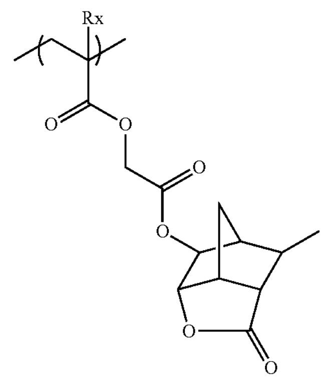
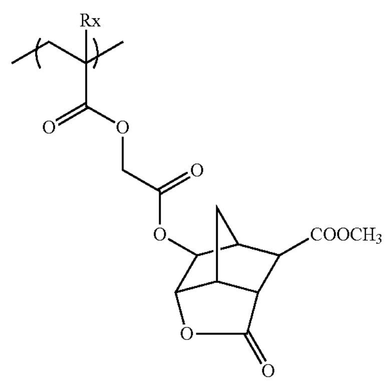
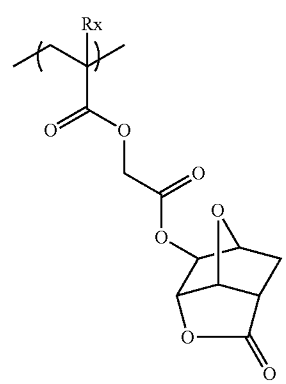

-continued
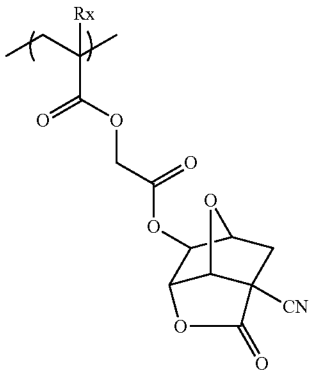
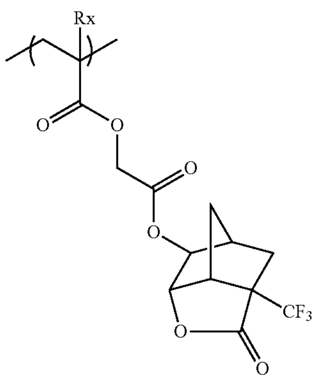
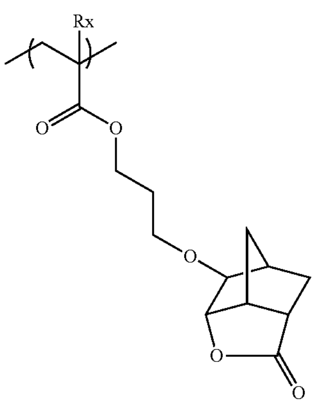
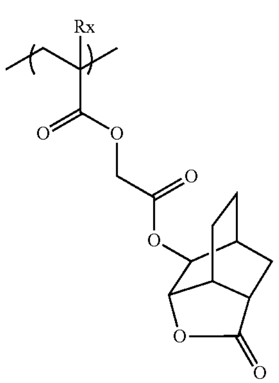
-continued
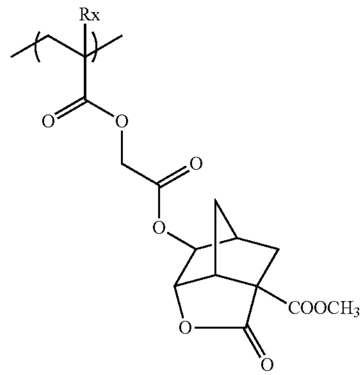
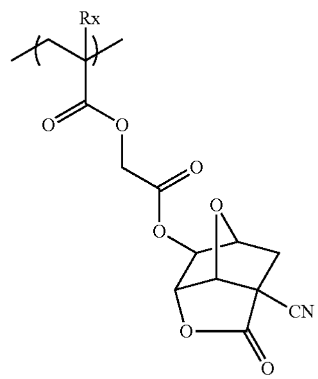
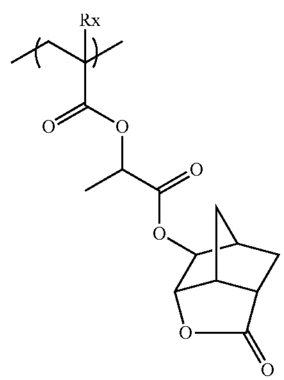
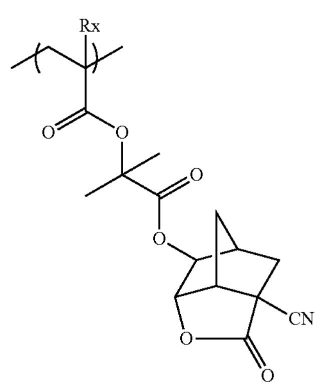

-continued

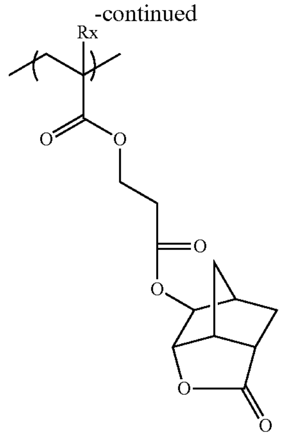

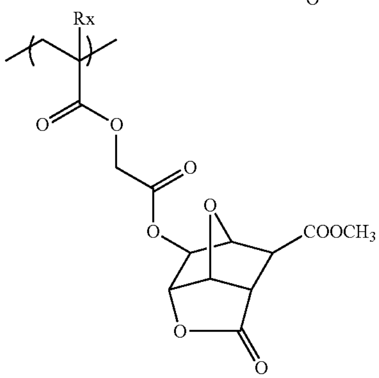

The polymer compound (A) for use in the present invention may or may not contain a repeating unit having a group capable of decomposing by the action of an alkali developer to increase the dissolution rate in an alkali developer, but in the case of containing the repeating unit having the group above, the content thereof is preferably from 5 to 60 mol %, more preferably from 10 to 50 mol %, still more preferably from 10 to 40 mol %, based on all repeating units in the polymer compound (A).

The polymer compound (A) for use in the present invention preferably further contains a repeating unit having, in the side chain, a group capable of generating an acid upon irradiation with an actinic ray or radiation (hereinafter, sometimes referred to as a "photoacid generating group"), because excellent sensitivity is obtained. In this case, the later-described compound (B) capable of generating an acid by an actinic ray or radiation is not an independent compound but becomes one constituent component in the polymer compound (A) for use in the present invention. That is, in one preferred embodiment of the present invention, the polymer compound (A) further contains a repeating unit having, in the side chain, a group capable of generating an acid upon irradiation with an actinic ray or radiation and the polymer compound (A) and the later-described compound (B) are an identical compound.

Examples of the repeating unit having a photoacid generating group include the repeating units described in paragraph [0028] of JP-A-9-325497, the repeating units described in paragraphs [0038] to [0041] of JP-A-2009-93137, and a repeating unit represented by the following formula (XI). In this case, the repeating unit having a photoacid generating group can be thought to come under the compound (B) capable of generating an acid upon irradiation with an actinic ray or radiation for use in the present invention.

The repeating unit represented by formula (XI) is described below.

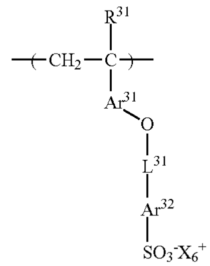

(XI)

In formula (XI), $R^{31}$ represents a hydrogen atom or a methyl group, $Ar^{31}$ represents an arylene group, $L^{31}$ represents a divalent organic group, $Ar^{32}$ represents an unsubstituted aromatic ring or an aromatic ring substituted with an alkyl group or an alkoxy group, and $X_a^+$ represents an onium cation.

Preferred compounds which are the repeating unit represented by formula (XI) and used in the present invention, are described below.

$R^{31}$ in the repeating unit represented by formula (XI) represents a hydrogen atom or a methyl group and is preferably a hydrogen atom.

In the repeating unit represented by formula (XI), $Ar^{31}$ represents an arylene group and may have a substituent. The arylene group of $Ar^{31}$ is preferably an arylene group having a carbon number of 6 to 18, which may have a substituent, more preferably a phenylene group or a naphthylene group, which may have a substituent, and most preferably a phenylene group which may have a substituent. Examples of the substituent which may be substituted on $Ar^{31}$ include an alkyl group, a halogen atom, a hydroxyl group, an alkoxy group, a carboxyl group, and an alkoxycarbonyl group.

In the repeating unit represented by formula (XI), when $Ar^{31}$ is a phenylene group, the bonding position of —O-$L^{31}$-$Ar^{32}$—$SO_3^-X_a^+$ to the benzene ring of $Ar^{31}$ may be a para-position, a meta-position or an ortho-position with respect to the bonding position of the benzene ring to the polymer main chain but is preferably a meta-position or a para-position, more preferably a para-position.

Examples of the divalent organic group of $L^{31}$ in formula (XI) include an alkylene group, an alkenylene group, —O—, —CO—, —$NR^{14}$—, —S—, —CS—, and a combination thereof. Here, $R^{14}$ represents a hydrogen atom, an alkyl group, a cycloalkyl group, an aryl group or an aralkyl group. The total carbon number of the divalent organic group of $L^{31}$ is preferably from 1 to 15, more preferably from 1 to 10.

The alkylene group is preferably an alkylene group having a carbon number of 1 to 8, more preferably a carbon number of 1 to 4, and examples thereof include a methylene group, an ethylene group, a propylene group, a butylene group, a hexylene group and an octylene group.

The alkenylene group is preferably an alkenylene group having a carbon number of 2 to 8, more preferably a carbon number of 2 to 4.

Specific examples and preferred ranges of the alkyl group, cycloalkyl group, aryl group and aralkyl group represented by $R^{14}$ are the same as specific examples and preferred ranges of the alkyl group, cycloalkyl group, aryl group and aralkyl group represented by $R^{41}$ in formula (IX).

The group as $L^{31}$ is preferably a carbonyl group, a methylene group, —CO—$(CH_2)^n$—O—, —CO—$(CH_2)_n$—O—

CO—, —$(CH_2)_n$—COO—, —$(CH_2)_n$—CONR$^1$— or —CO—$(CH_2)_n$—NR$^1$—, more preferably a carbonyl group, —$CH_2$—COO—, —CO—$CH_2$—O—, —CO—$CH_2$—O—CO—, —$CH_2$—CONR$^1$— or —CO—$CH_2$—NR$^1$—, wherein $R^1$ represents a hydrogen atom, an alkyl group, an aryl group or an aralkyl group and n represents an integer of 1 to 10.

Specific examples and preferred ranges of the alkyl group, aryl group and aralkyl group represented by $R^1$ are the same as specific examples and preferred ranges of the alkyl group, aryl group and aralkyl group represented by $R^{41}$ in formula (IX).

n is preferably an integer of 1 to 6, more preferably an integer of 1 to 3, and most preferably 1.

$Ar^{32}$ represents an unsubstituted aromatic ring or an aromatic ring substituted with an alkyl group or an alkoxy group. When $Ar^{32}$ is an unsubstituted aromatic ring, this means that the aromatic ring does not have a substituent except for -$L^{31}$- and —$SO_3^-X_a^+$ which are connected to $Ar^{32}$. Also, when $Ar^{32}$ is an aromatic ring substituted with an alkyl group or an alkoxy group, this means that the aromatic ring has an alkyl group or an alkoxy group as a substituent in addition to -$L^{31}$- and —$SO_3^-X_a^+$ which are connected to $Ar^{32}$. In this way, $Ar^{32}$ is an aromatic ring not having, as a substituent, an electron-withdrawing group such as fluorine atom, and thanks to this configuration, the strength of the acid generated can be kept from excessively increasing, and the acid generated can have an appropriate strength.

In the case where $Ar^{32}$ has an alkyl group, the alkyl group is preferably an alkyl group having a carbon number of 1 to 8, more preferably a carbon number of 1 to 4. In the case where $Ar^{32}$ has an alkoxy group, the alkoxy group is preferably an alkoxy group having a carbon number of 1 to 8, more preferably a carbon number of 1 to 4. The aromatic ring of $Ar^{32}$ may be an aromatic hydrocarbon ring (for example, a benzene ring or a naphthalene ring) or an aromatic heterocyclic ring (for example, a quinoline ring) and preferably has a carbon number of 6 to 18, more preferably a carbon number of 6 to 12.

$Ar^{32}$ is preferably an unsubstituted or alkyl group- or alkoxy group-substituted aromatic ring where the aromatic ring is an aromatic hydrocarbon ring, and it is more preferred that the aromatic hydrocarbon ring is a benzene ring or a naphthalene ring. $Ar^{32}$ is more preferably an unsubstituted aromatic ring.

$X_a^+$ represents an onium cation and is preferably a sulfonium cation or an iodonium cation, more preferably a sulfonium cation.

As described above, in formula (XI), because of the presence of a moiety $L^{31}$ and a moiety $Ar^{31}$ in the side chain, the linkage length between the acid generating portion ($SO_3^-X_a^+$) and the main chain of the polymer compound (A) becomes long, and this makes it easy for the acid generated upon exposure to react with the acid labile group represented by formula (I). However, if the linkage length is too long, the acid generated readily diffuses, and roughness characteristics and resolution are impaired. As the index indicative of the linkage length, the minimum number of linking atoms of ($L^{31}$-$Ar^{32}$) is preferably from 3 to 20, more preferably from 3 to 15, still more preferably from 3 to 10.

In this connection, the minimum number of linking atoms is a number determined as follows. That is, first, out of atoms constituting $L^{31}$-$Ar^{32}$, an atom sequence connecting the atom bonded to the oxygen atom combined with $Ar^{31}$ and the atom bonded to —$SO_3^-X_a^+$ is considered. Next, the number of atoms contained in each of these sequences is determined, and among the numbers of atoms, the minimum number is taken as the minimum number of linking atoms.

For example, the minimum number of linking atoms is 3 in the case of the following formula ($N_L$-1), and 7 in the case of ($N_L$-2).

($N_L$-1)

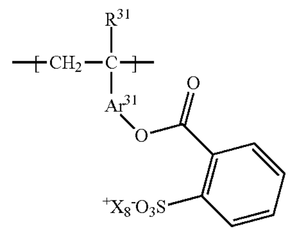

($N_L$-2)

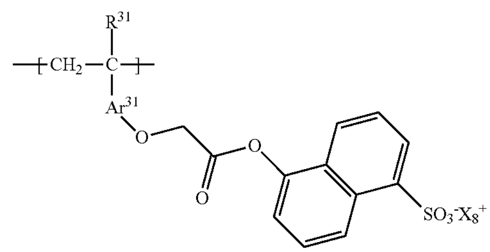

The onium cation represented by $X_a^+$ in the repeating unit represented by formula (XI) is preferably an onium cation represented by the following formula (XII) or (XIII):

(XII)

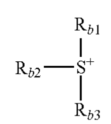

(XIII)

$$R_{b4}—I^+—R_{b5}$$

In formulae (XII) and (XIII), each of $R_{b1}$, $R_{b2}$, $R_{b3}$, $R_{b4}$ and $R_{b5}$ independently represents an organic group.

The sulfonium cation represented by formula (XII) is described in detail below.

Each of $R_{b1}$ to $R_{b3}$ in formula (XII) independently represents an organic group, and at least one of $R_{b1}$ to $R_{b3}$ is preferably an aryl group. An arylsulfonium cation is preferred, and the aryl group is preferably a phenyl group or a naphthyl group, more preferably a phenyl group.

In the arylsulfonium cation, all of $R_{b1}$ to $R_{b3}$ may be an aryl group, or a part of $R_{b1}$ to $R_{b3}$ may be an aryl group with the remaining being an alkyl group. Examples thereof include a triarylsulfonium cation, a diarylalkylsulfonium cation, an aryldialkylsulfonium cation, a diarylcycloalkylsulfonium cation, and an aryldicycloalkylsulfonium cation.

The aryl group in the arylsulfonium cation is preferably an aryl group such as phenyl group and naphthyl group, or a heteroaryl group such as indole residue and pyrrole residue, more preferably a phenyl group or an indole residue. In the case of having two or more aryl groups, each aryl group may be the same as or different from every other aryl groups.

As for the group other than the aryl group in the arylsulfonium cation, the alkyl group is preferably a linear or branched alkyl group having a carbon number of 1 to 15, or a cycloalkyl group having a carbon number of 3 to 15, and examples thereof include a methyl group, an ethyl group, a propyl group, an n-butyl group, a sec-butyl group, a tert-butyl group and a cyclohexyl group.

The aryl group and alkyl group of $R_{b1}$ to $R_{b3}$ may have a substituent, and the substituent is preferably an alkyl group having a carbon number of 1 to 4, or an alkoxy group having a carbon number of 1 to 4. In the case where $R_{b1}$ to $R_{b3}$ are an aryl group, the substituent is preferably substituted on the p-position of the aryl group.

Two members out of $R_{b1}$ to $R_{b3}$ in formula (XII) may combine to form a ring structure, and the ring may contain an oxygen atom, a sulfur atom, an ester bond, an amide bond or a carbonyl group.

The iodonium cation represented by formula (XIII) is described in detail below.

Each of $R_{b4}$ and $R_{b5}$ in formula (XIII) independently represents an organic group and is independently preferably an aryl group or an alkyl group, and more preferably, the iodonium cation represented by formula (XIII) is an aryliodonium cation where at least one of $R_{b4}$ and $R_{b5}$ is an aryl group.

The aryl group of $R_{b4}$ and $R_{b5}$ is preferably a phenyl group or a naphthyl group, more preferably a phenyl group.

The alkyl group as $R_{b4}$ and $R_{b5}$ may be either linear or branched and is preferably a linear or branched alkyl group having a carbon number of 1 to 10 or a cycloalkyl group having a carbon number of 3 to 10 (for example, a methyl group, an ethyl group, a propyl group, a butyl group, a pentyl group and a cyclohexyl group).

Examples of the substituent which may be substituted on $R_{b4}$ and $R_{b5}$ include an alkyl group, an aryl group, an alkoxy group, a halogen atom, a hydroxyl group and a phenylthio group.

Examples of the repeating unit represented by formula (XI) are illustrated below, but the present invention is not limited thereto.

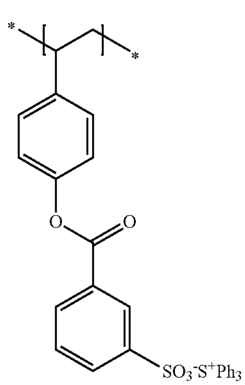

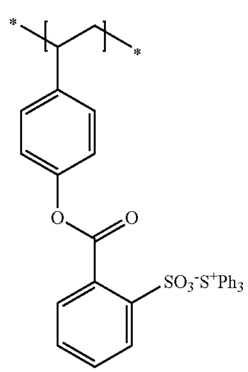

-continued

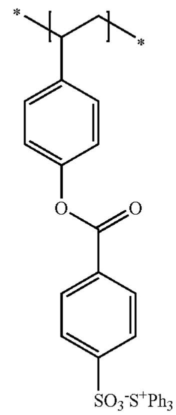

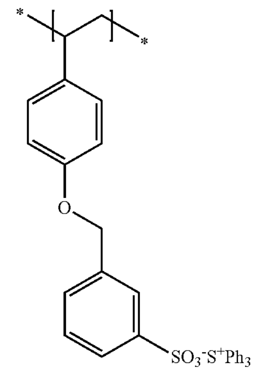

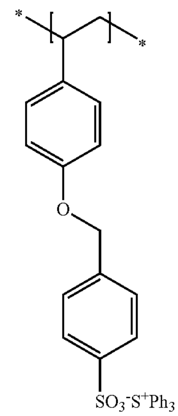

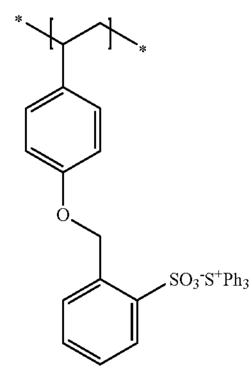

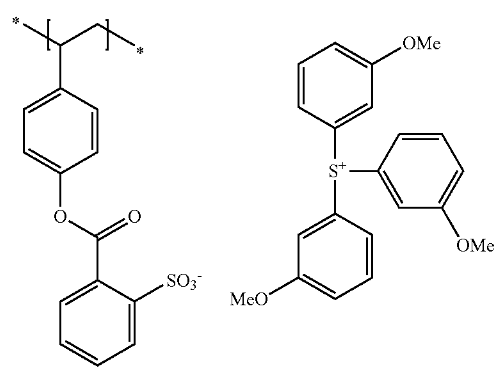

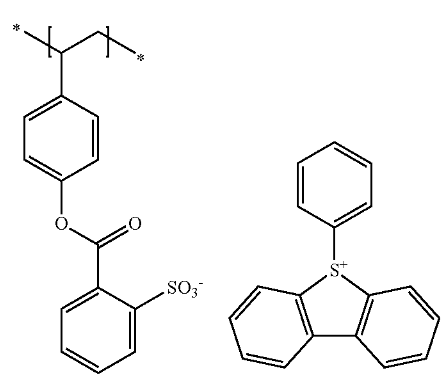

-continued
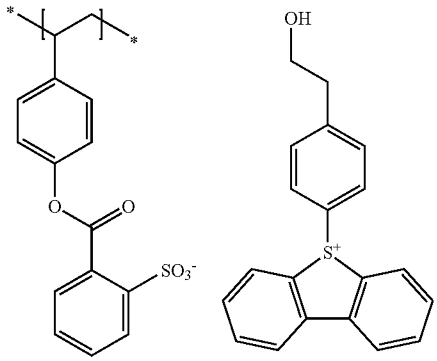
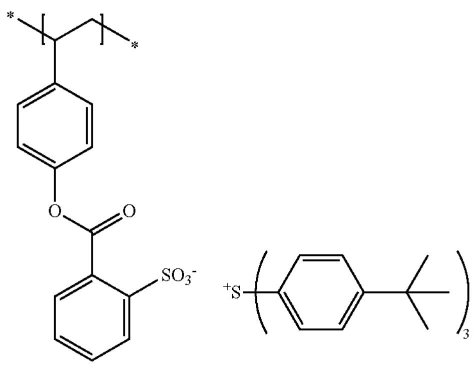
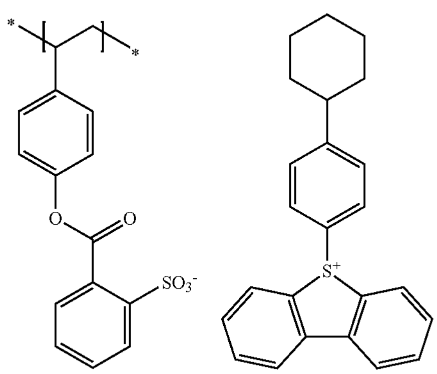
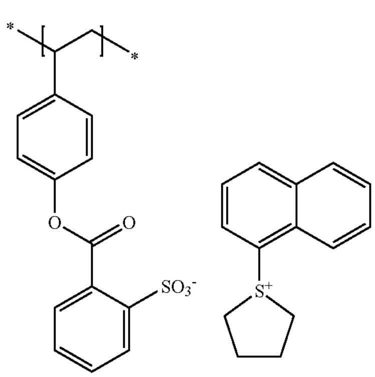
-continued
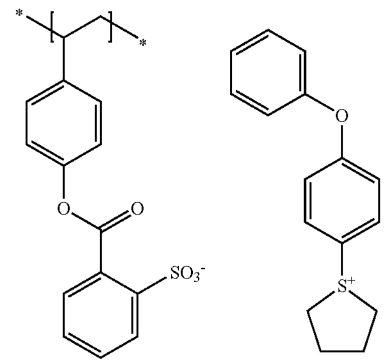
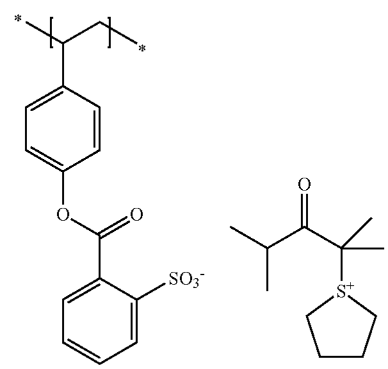
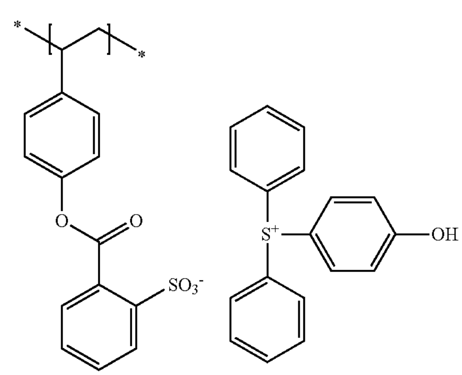
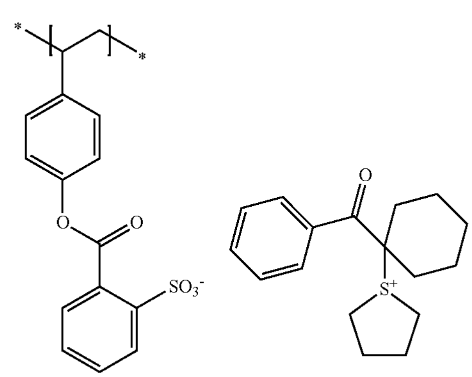

-continued
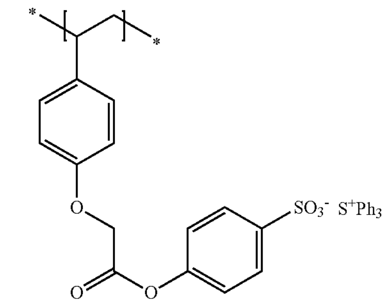
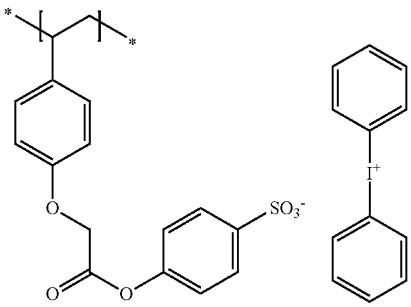
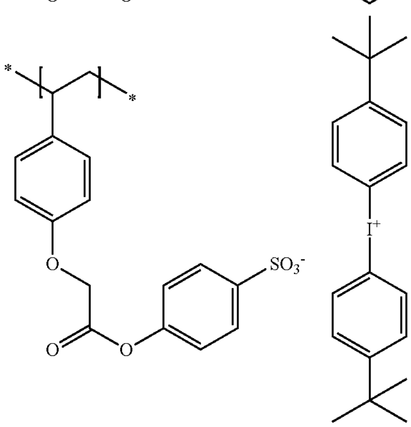
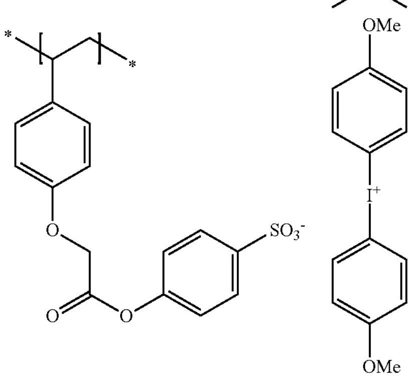
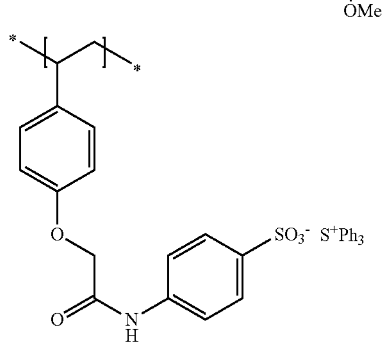
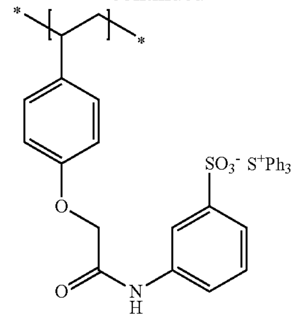
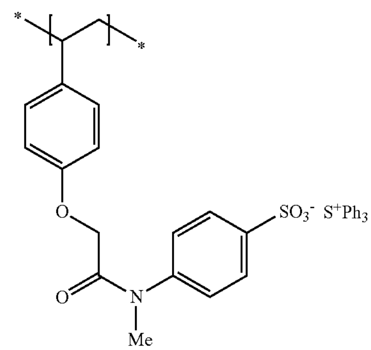
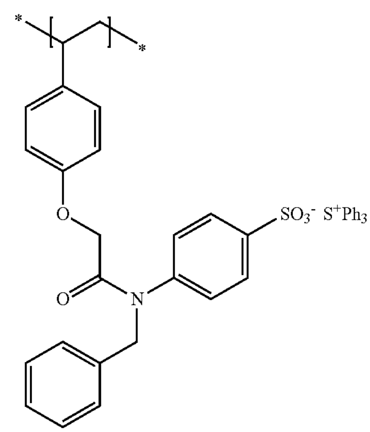
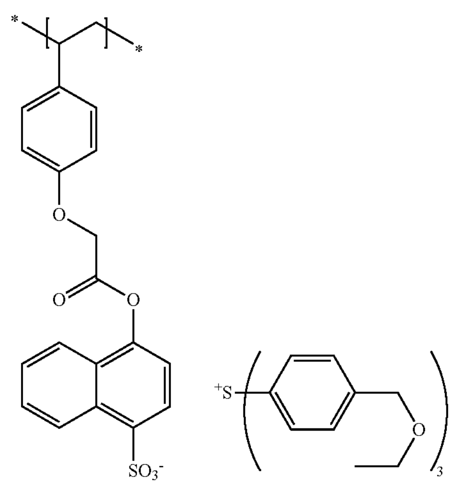

-continued
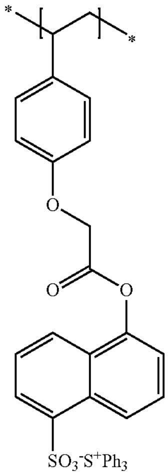
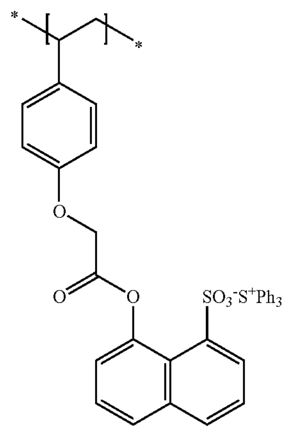
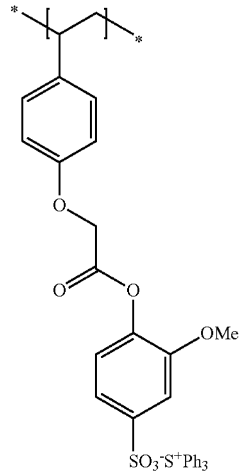
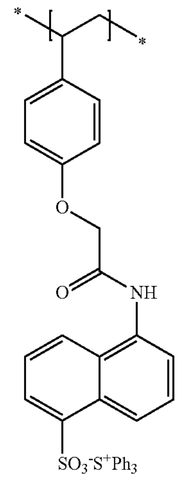
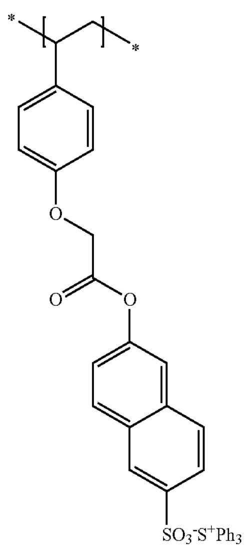
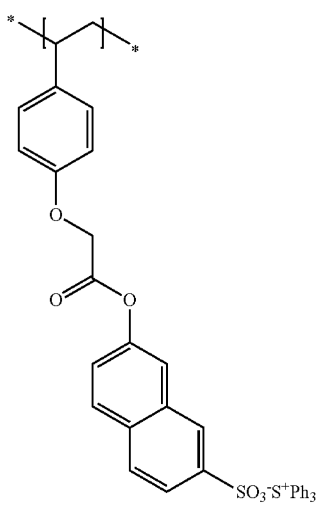
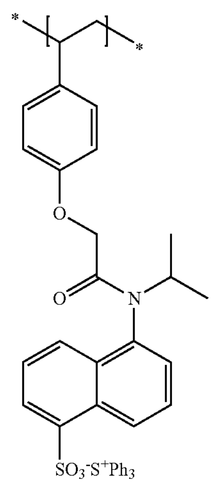
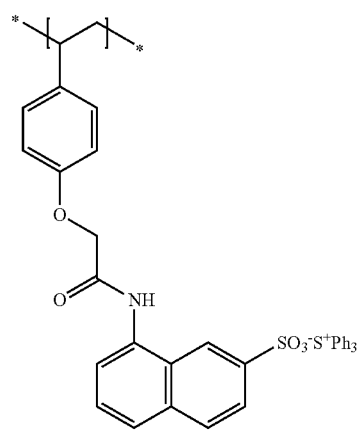
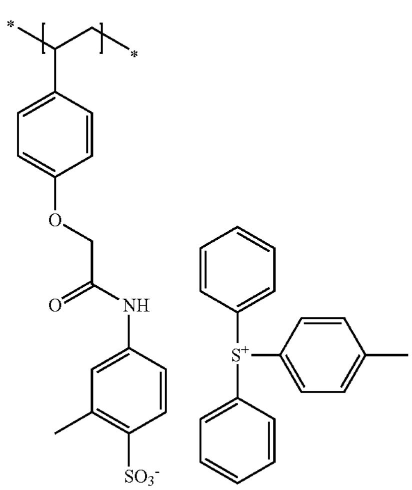
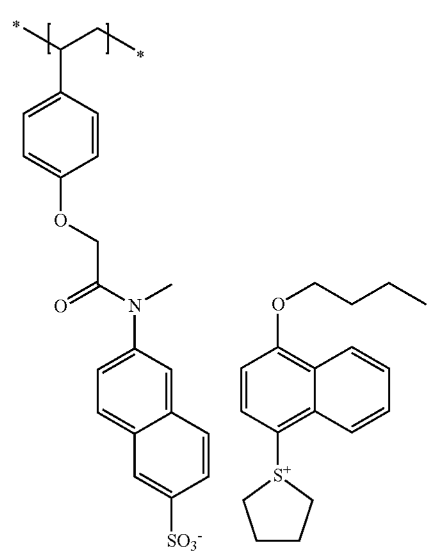

-continued
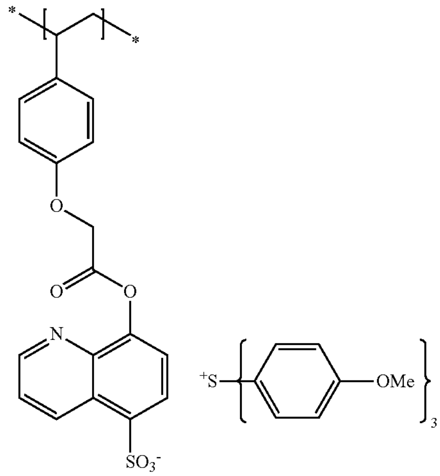
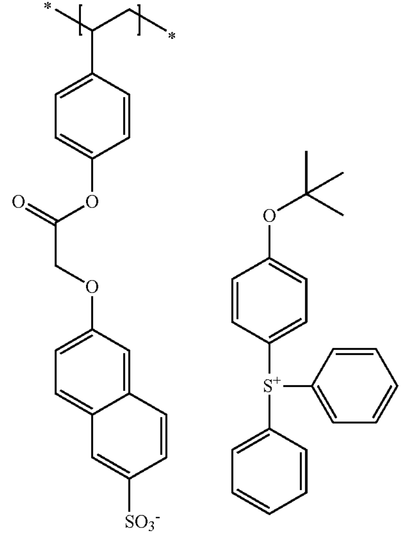
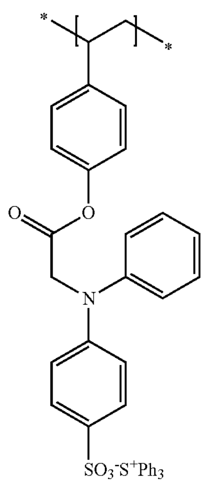
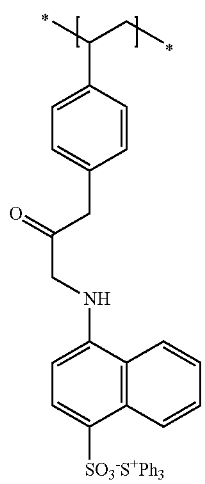
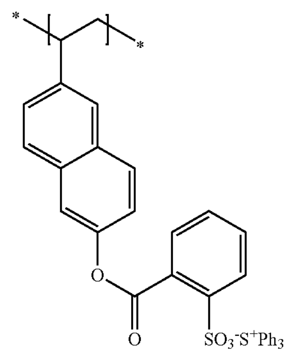
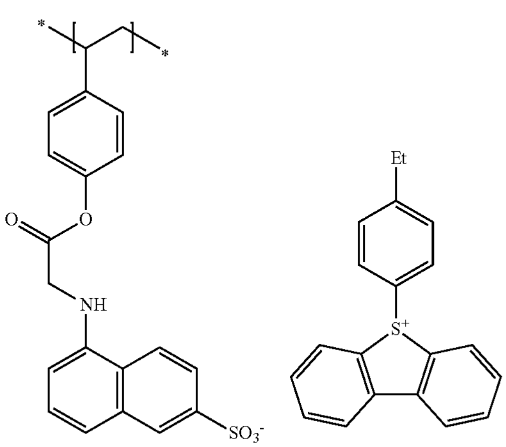
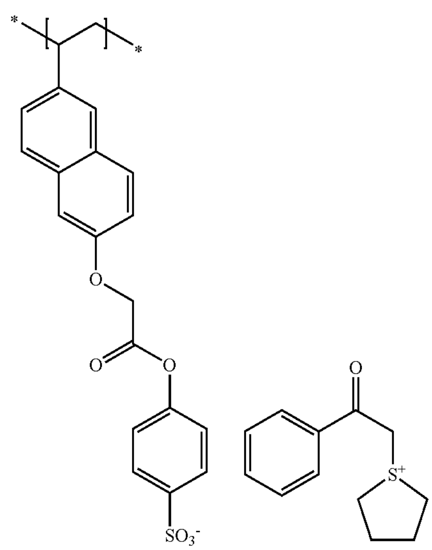

-continued
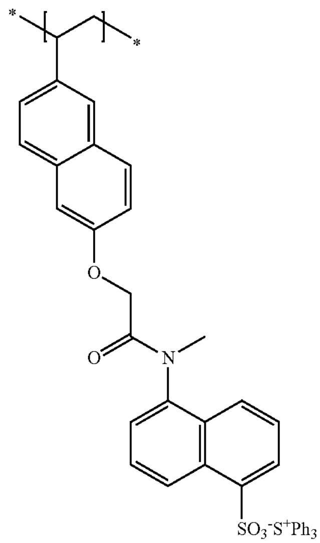
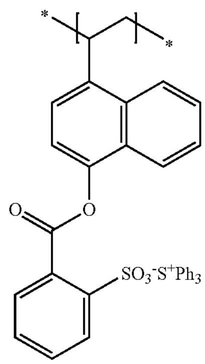
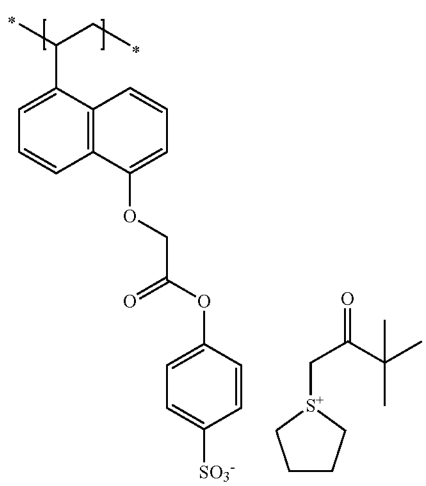
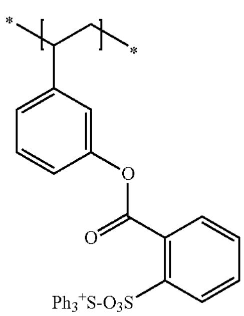
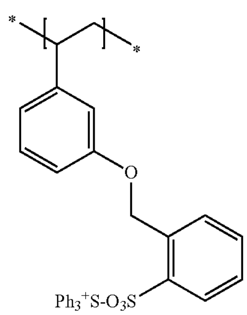
-continued
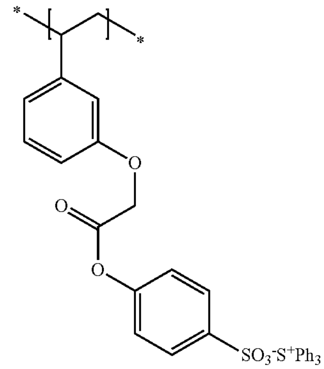
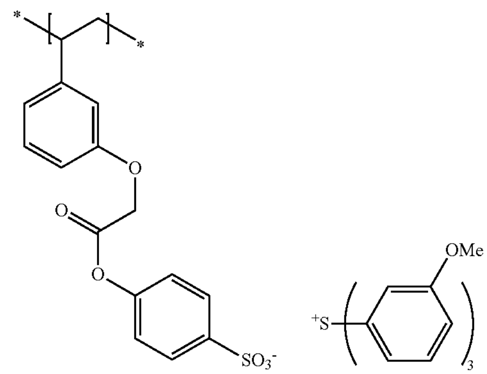
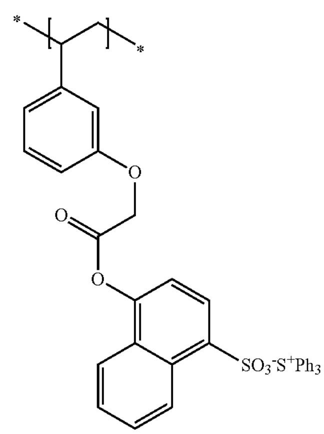
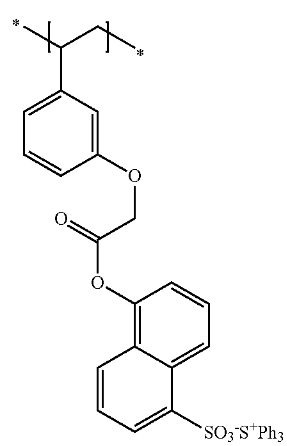

-continued
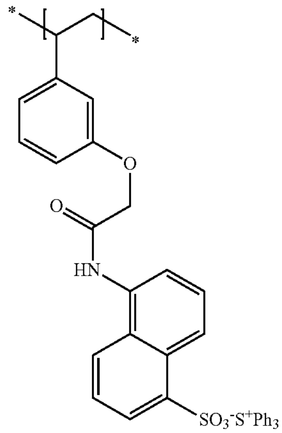
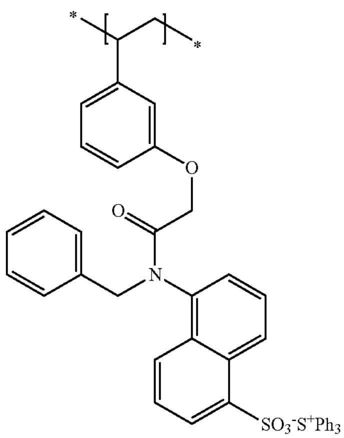
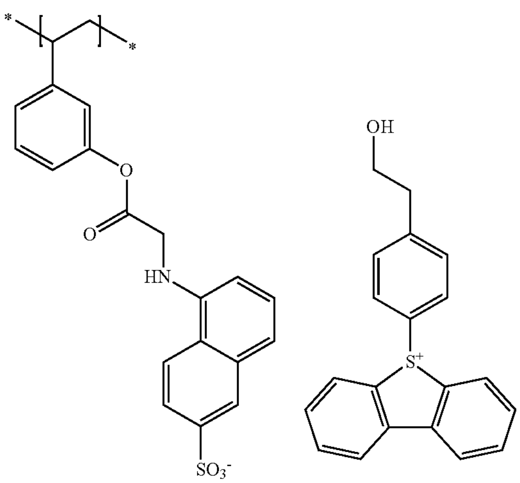
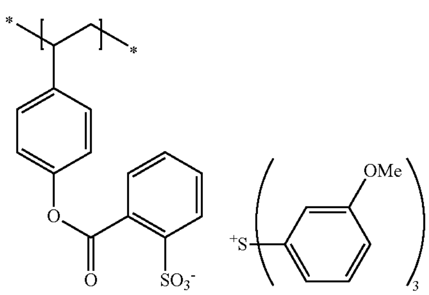
-continued
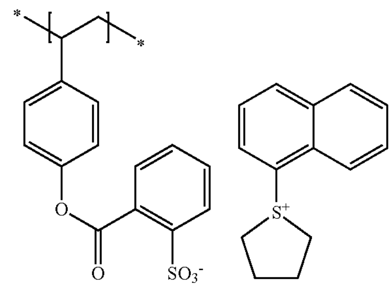
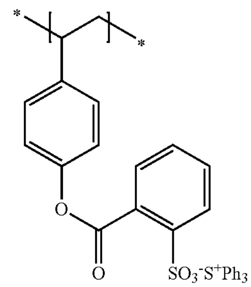
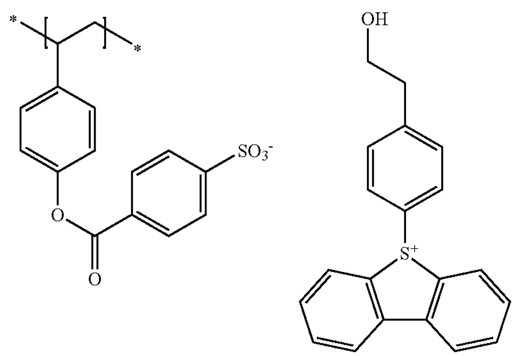
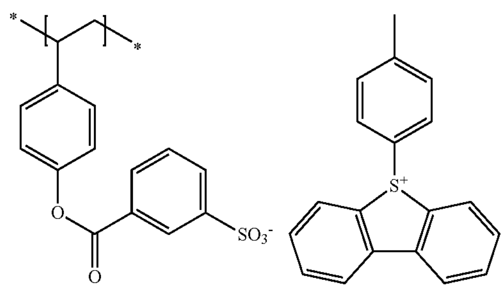
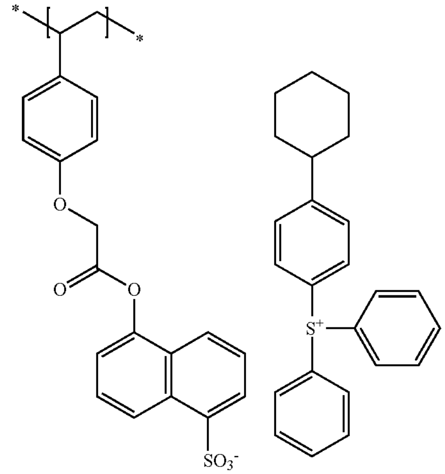

-continued
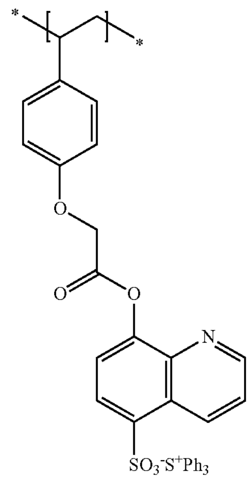
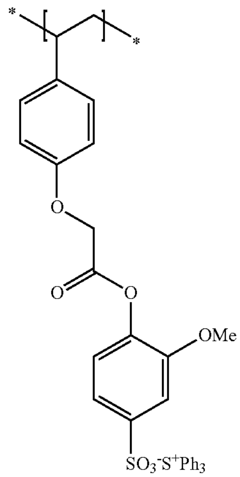
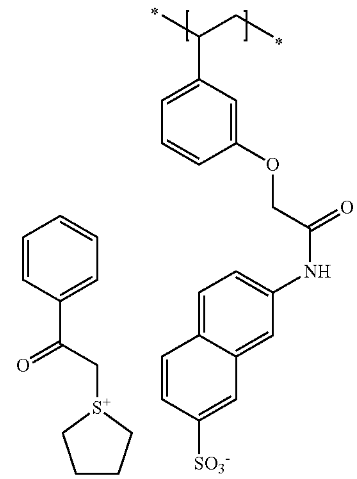
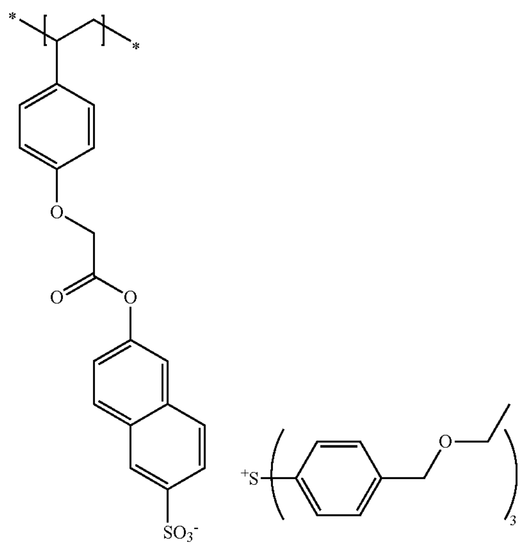
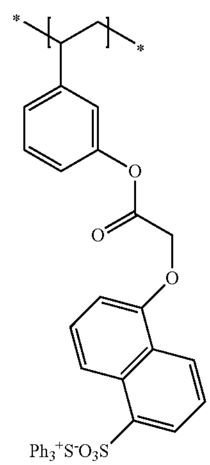
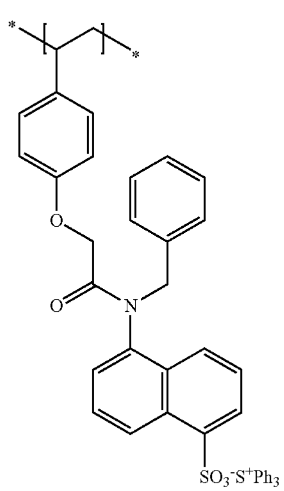
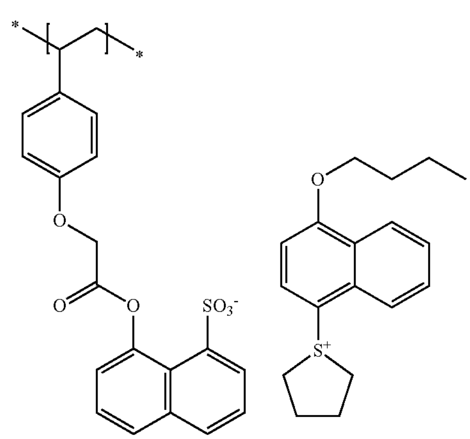

-continued
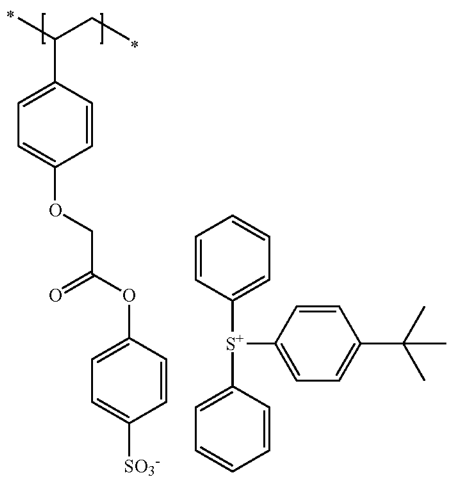
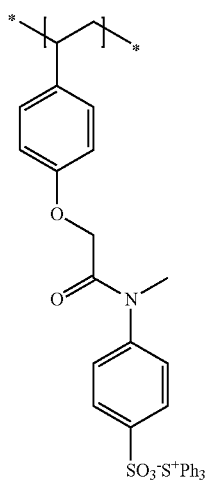
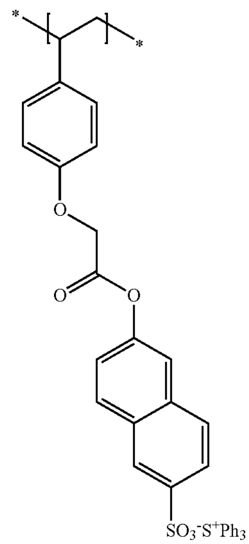
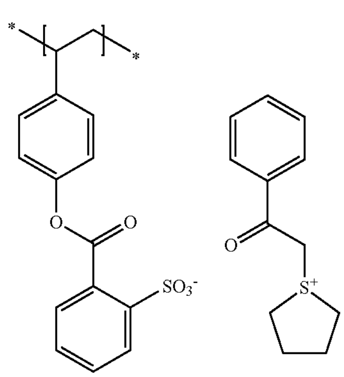
-continued
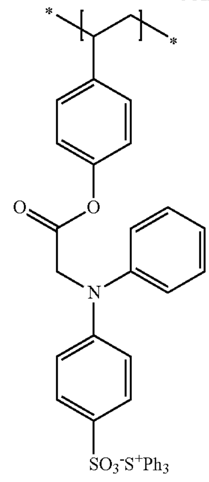
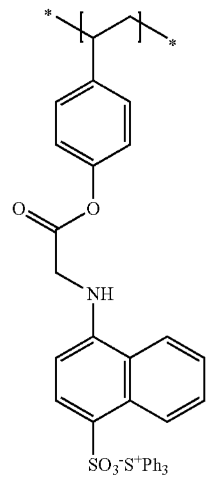
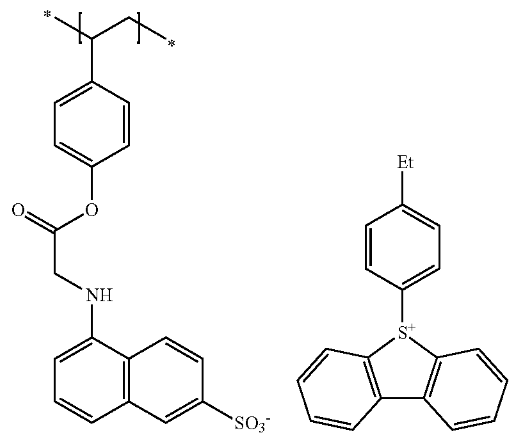
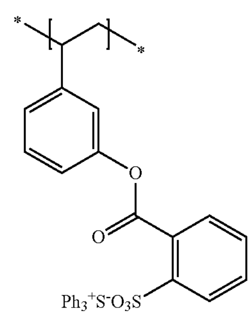
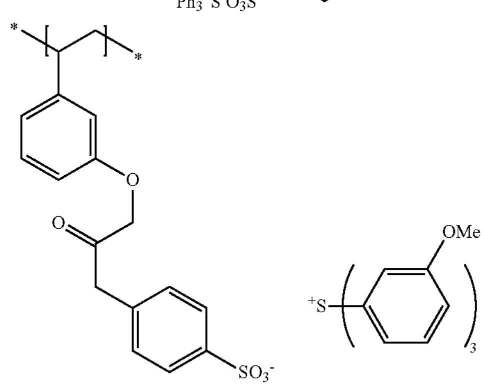

-continued
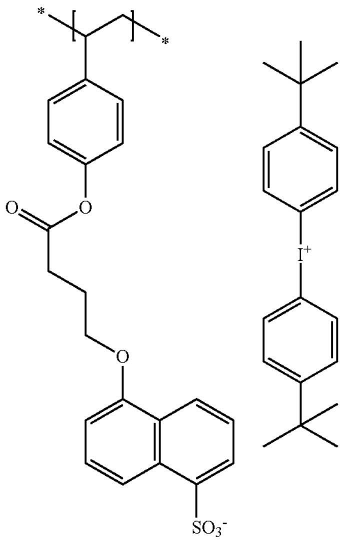
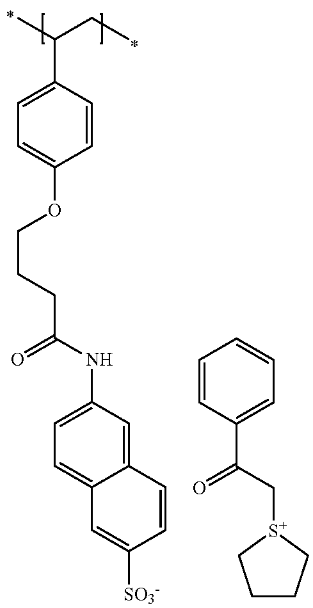
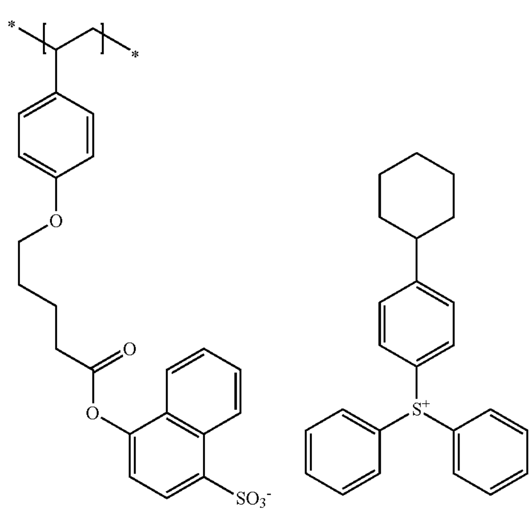
-continued
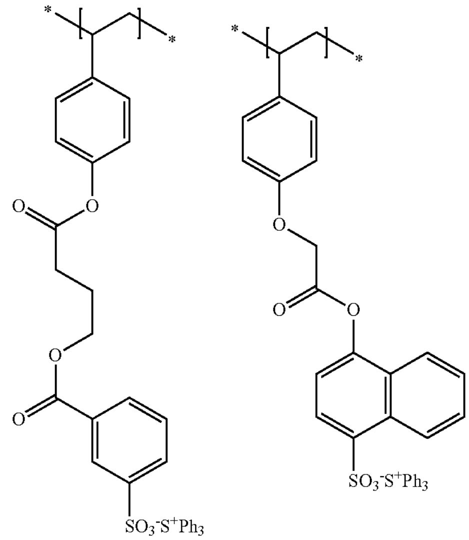
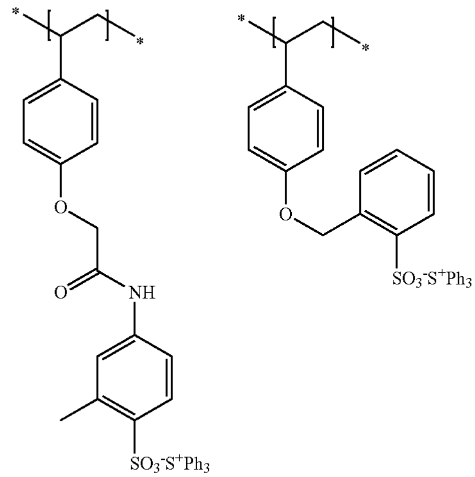
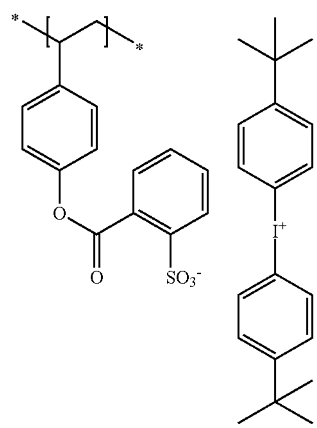

-continued

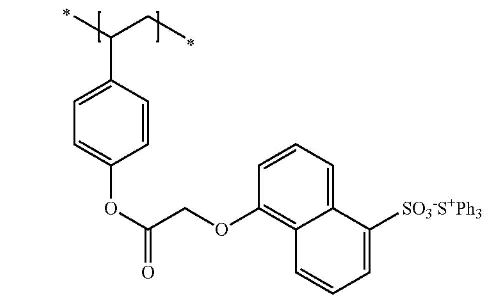

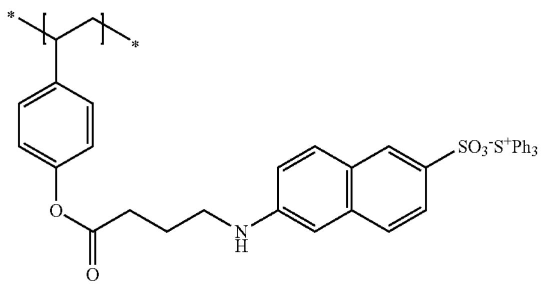

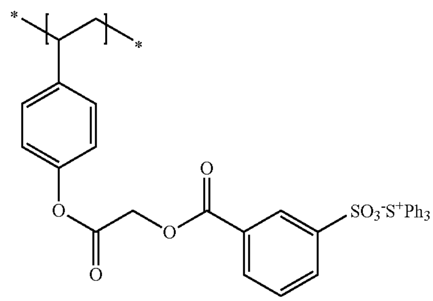

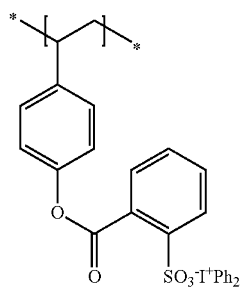

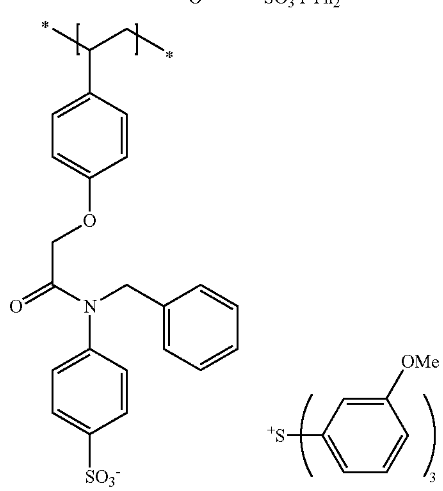

Specific examples of the monomer corresponding to the repeating unit having a photoacid generating group other than the repeating unit represented by formula (XI) are illustrated below (shown as the structure of an acid generated upon EB or EUV exposure).

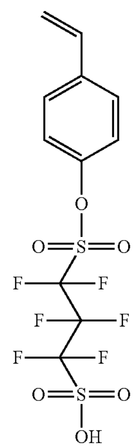

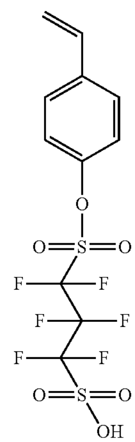

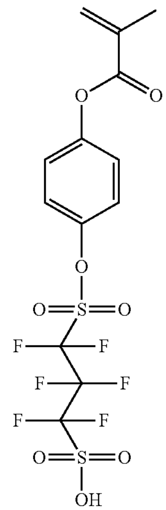

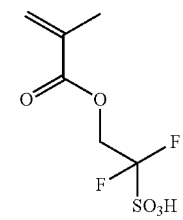

In the case where the polymer compound contains the repeating unit having a photoacid generating group, the content of the repeating unit having a photoacid generating group is preferably from 1.0 to 30 mol %, more preferably from 1.5 to 25 mol %, still more preferably from 2.0 to 20 mol %, based on all repeating units in the polymer compound (A).

Example of the polymerizable monomer for forming a repeating unit other than those described above in the polymer compound (A) for use in the present invention include styrene, an alkyl-substituted styrene, an alkoxy-substituted styrene, an O-alkylated styrene, an O-acylated styrene, a hydrogenated hydroxystyrene, maleic anhydride, an acrylic acid derivative (e.g., acrylic acid, acrylic acid ester), a methacrylic acid derivative (e.g., methacrylic acid, methacrylic acid ester), an N-substituted maleimide, acrylonitrile, methacrylonitrile, vinylnaphthalene, vinylanthracene, indene which may have a substituent, and a polymerizable monomer having an alcoholic hydroxyl group substituted with a fluoroalkyl group or the like at the α-position. Preferred examples of the substituted styrene include 4-(1-naphthylmethoxy)styrene, 4-benzyloxystyrene, 4-(4-chlorobenzyloxy)styrene, 3-(1-naphthylmethoxy)styrene, 3-benzyloxystyrene, and 3-(4-chlorobenzyloxy)styrene.

The polymer compound (A) may or may not contain such other repeating unit, but in the case of containing such other repeating unit, the content thereof in the polymer compound (A) is generally from 1 to 20 mol %, preferably from 2 to 10 mol %, based on all repeating units constituting the polymer compound (A).

The polymer compound (A) for use in the present invention can be synthesized, for example, by radical, cationic or anionic polymerization of unsaturated monomers corresponding to respective repeating units. The polymer compound can be also synthesized by polymerizing a polymer from unsaturated monomers corresponding to precursors of respective repeating units, and modifying the synthesized polymer with a low molecular compound, thereby converting the precursors into desired repeating units. In either case, living polymerization such as living anionic polymerization is preferably used, because the obtained polymer compound can have a uniform molecular weight distribution.

The weight average molecular weight of the polymer compound (A) for use in the present invention is preferably from 1,000 to 50,000, more preferably from 2,000 to 40,000, still more preferably from 2,000 to 15,000. The polydispersity (molecular weight distribution) (Mw/Mn) of the polymer compound (A) is, in view of LER, preferably from 1.0 to 1.7, more preferably from 1.0 to 1.2. The weight average molecular weight and the polydispersity of the polymer compound (A) are defined in terms of polystyrene by GPC measurement.

Specific examples of the polymer compound (A) for use in the present invention are illustrated below, but the present invention is not limited thereto.

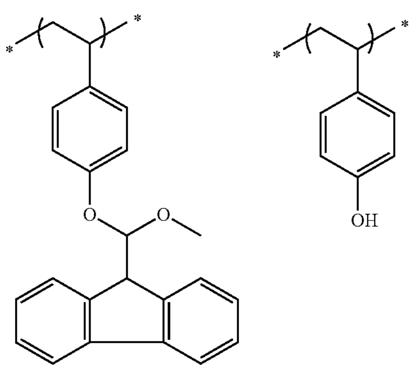

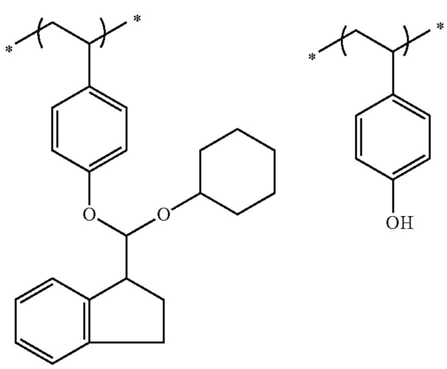

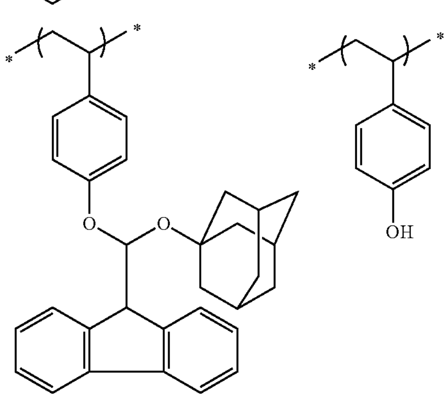

-continued

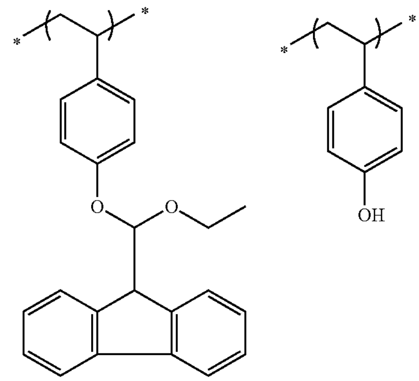

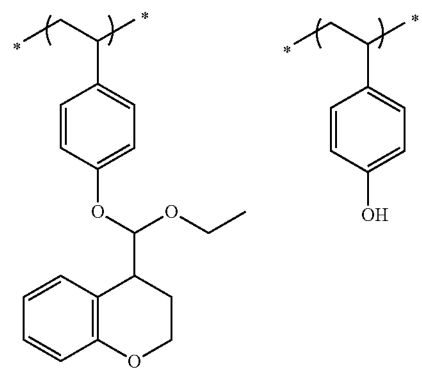

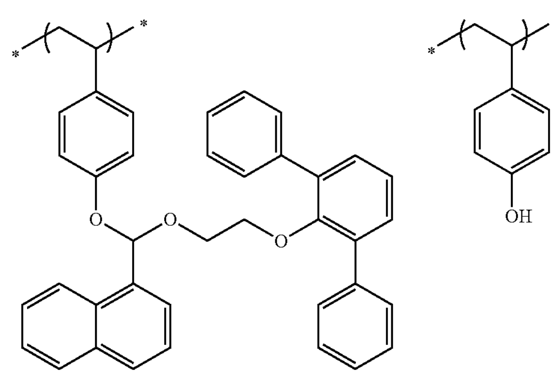

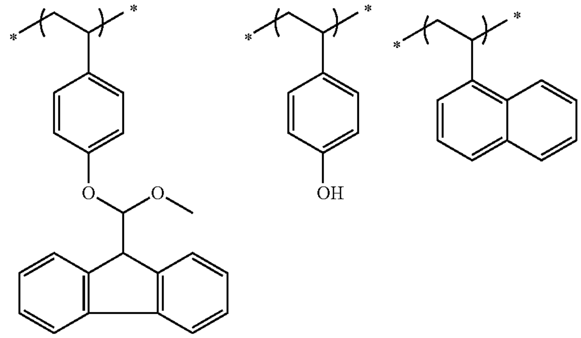

-continued
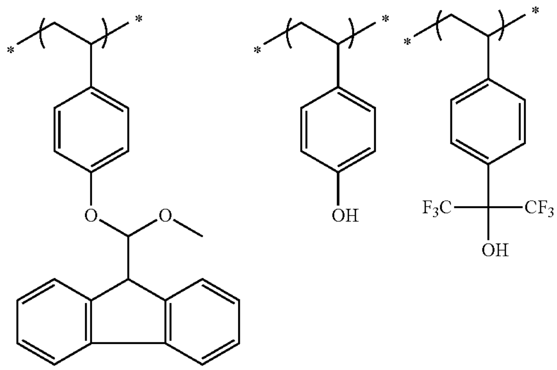
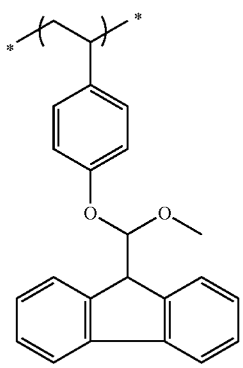
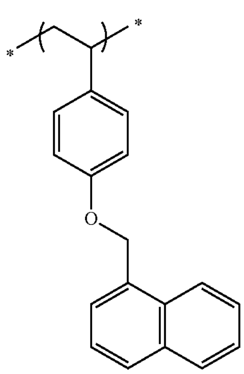
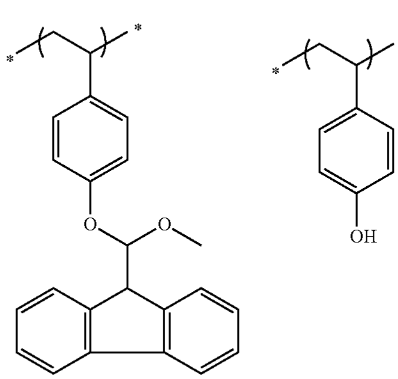
-continued
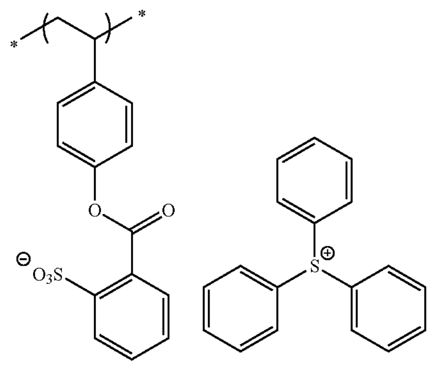
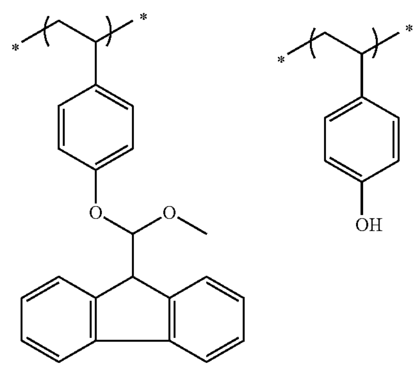
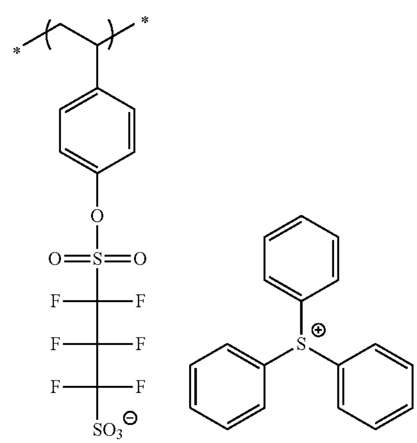
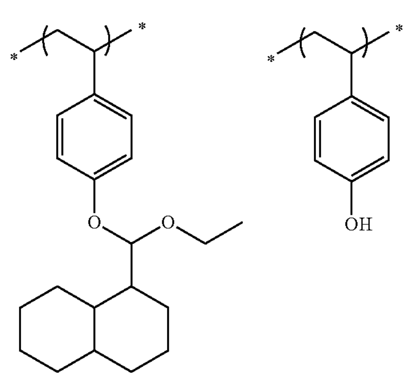

-continued
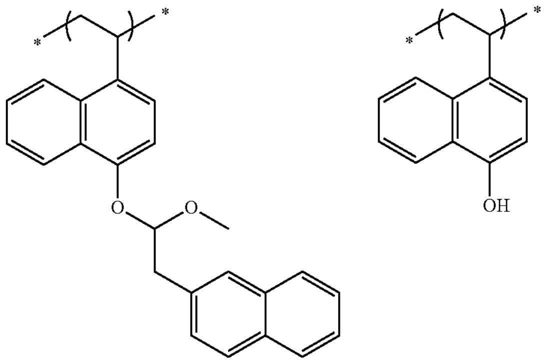
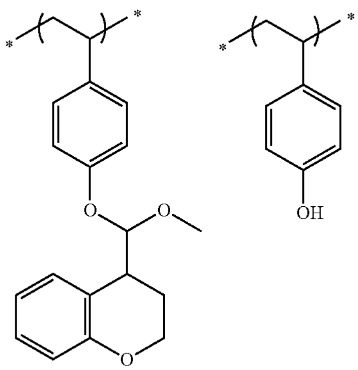
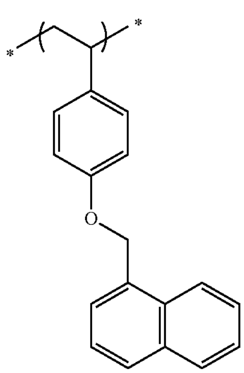
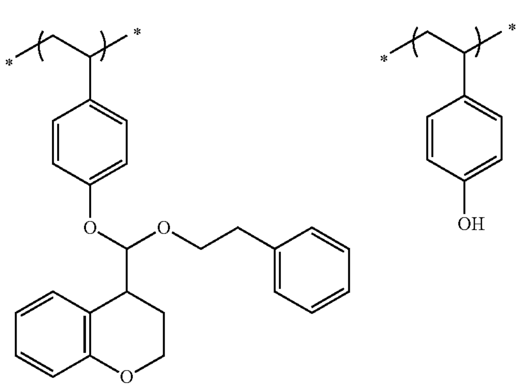
-continued
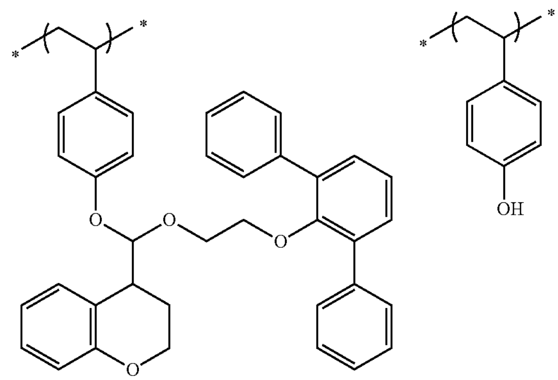
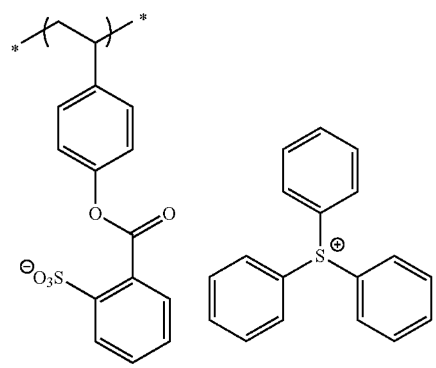
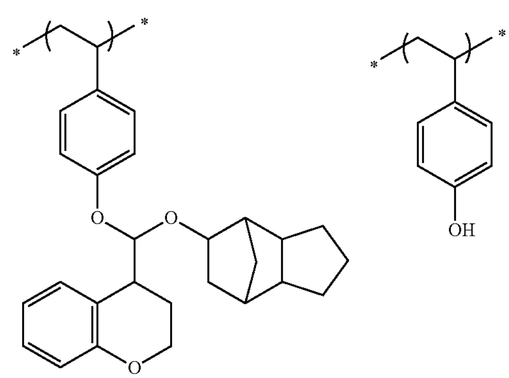
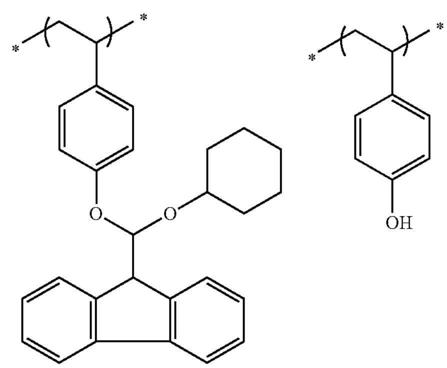

-continued
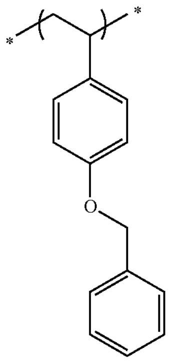
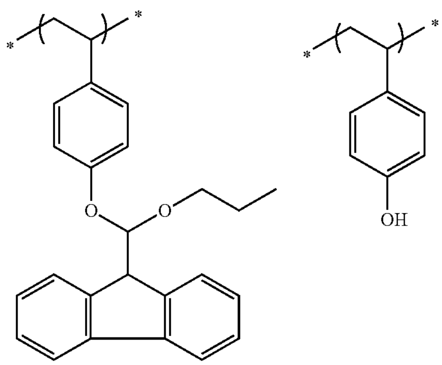
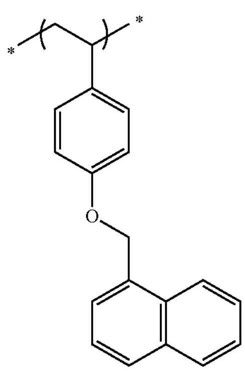
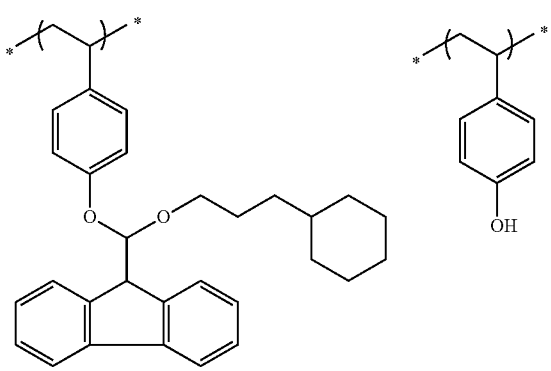
-continued
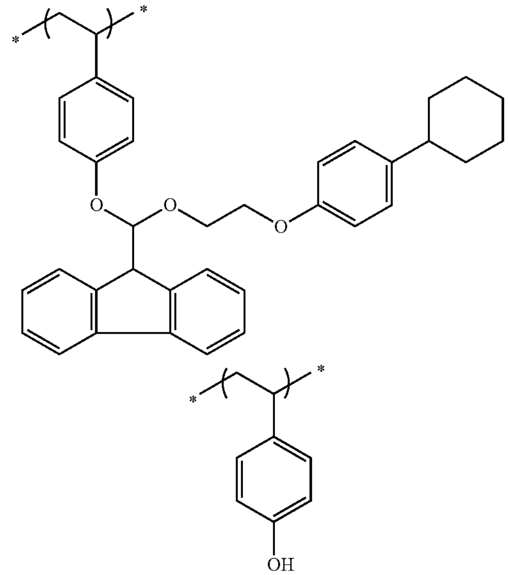
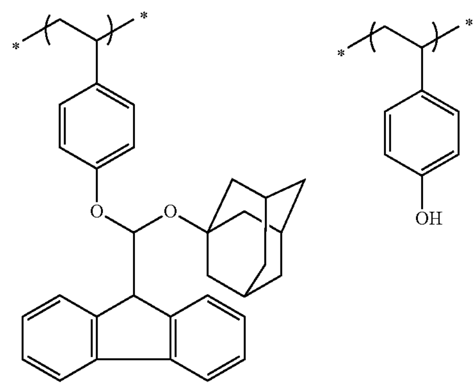
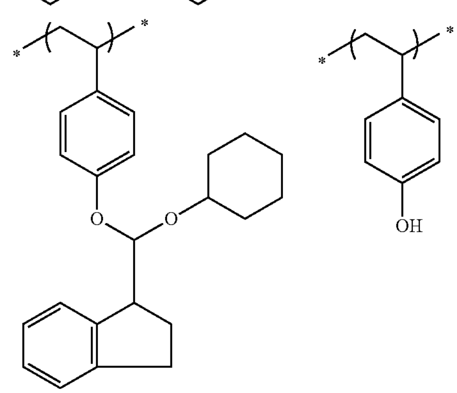
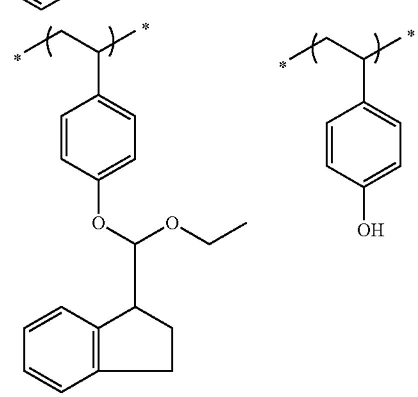

-continued
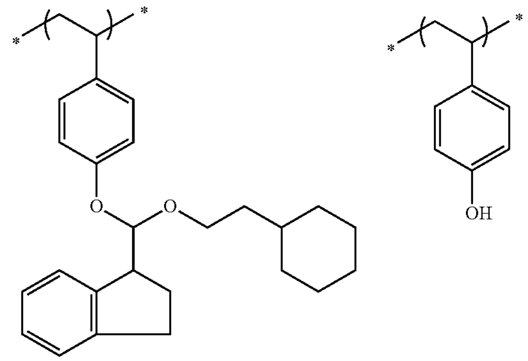
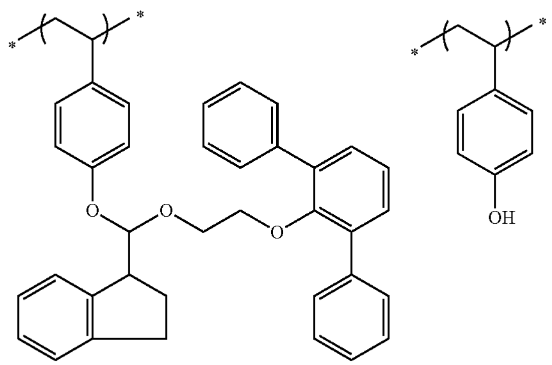
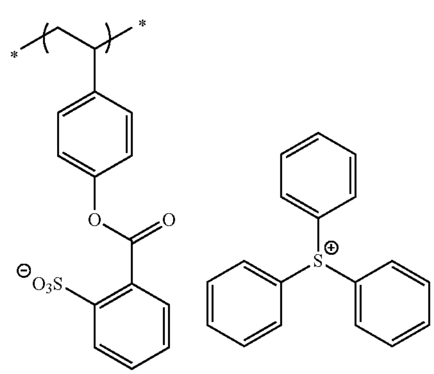
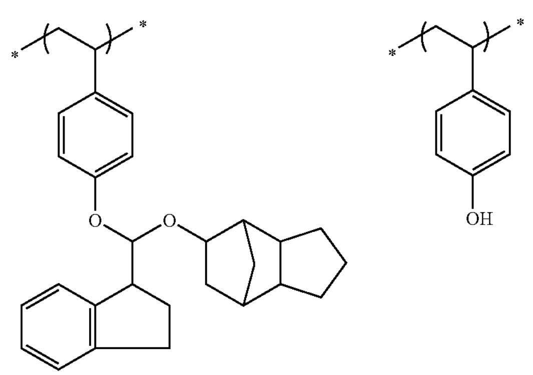
-continued
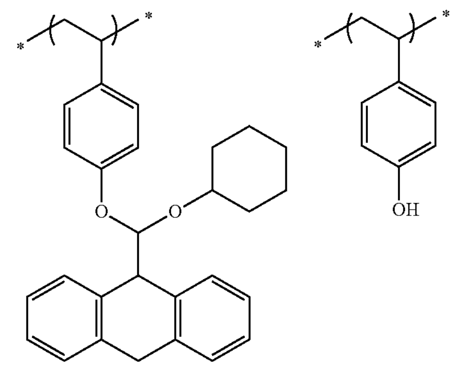
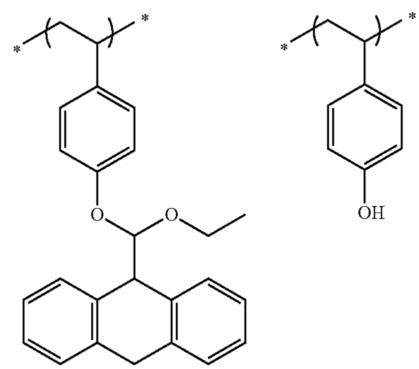
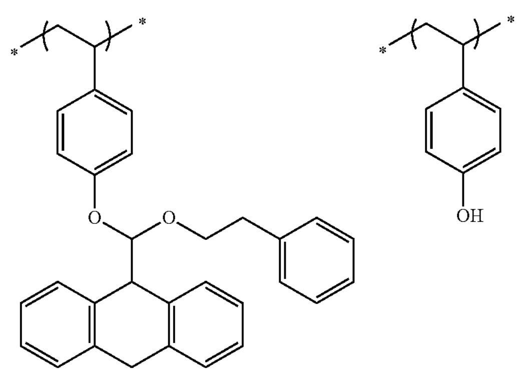
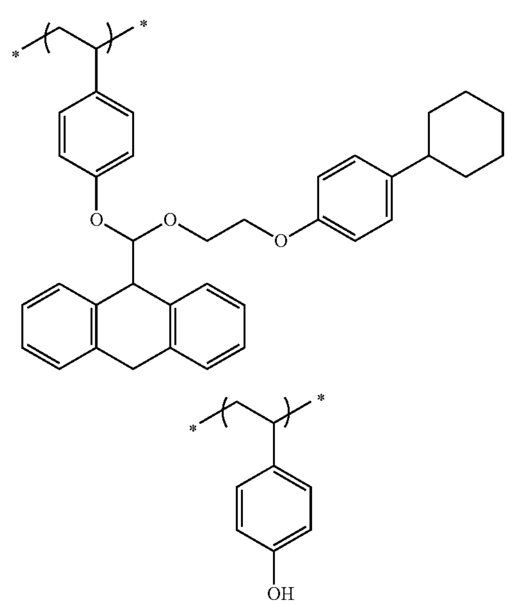

-continued
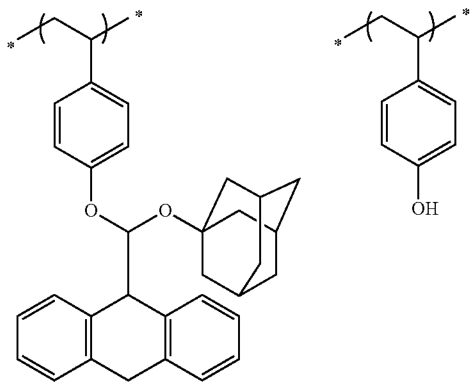
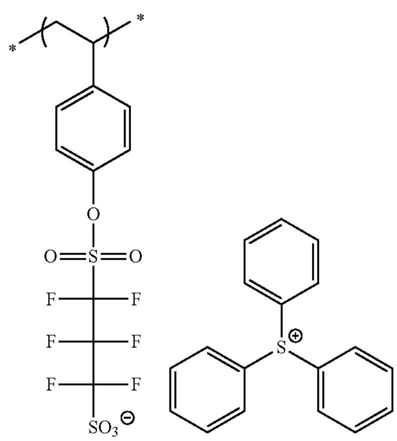
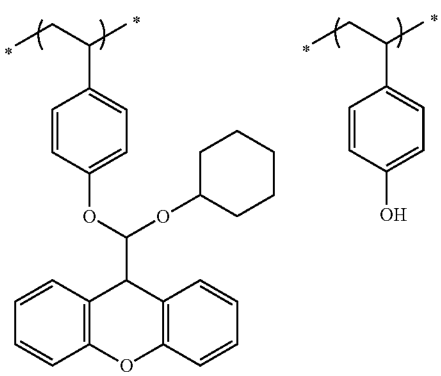
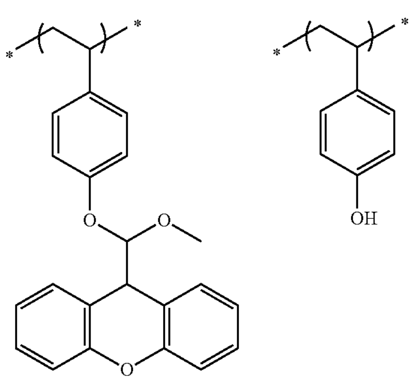
-continued
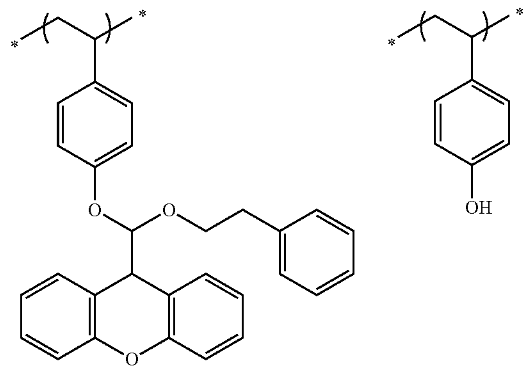
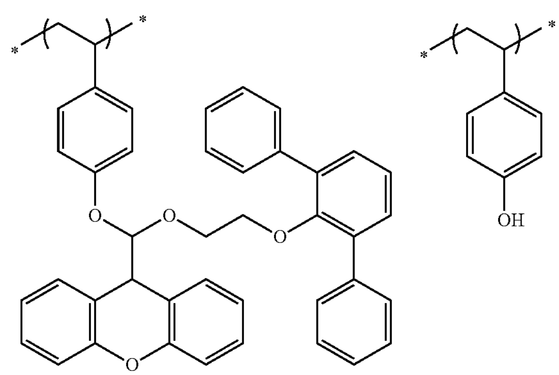
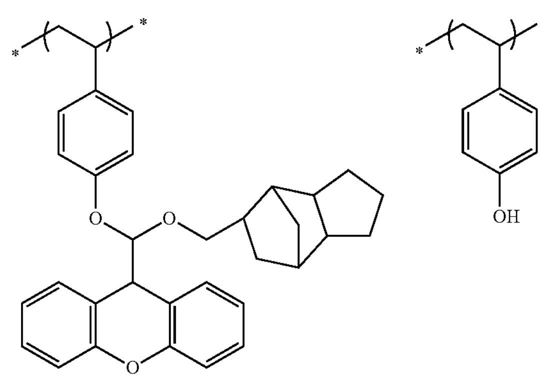
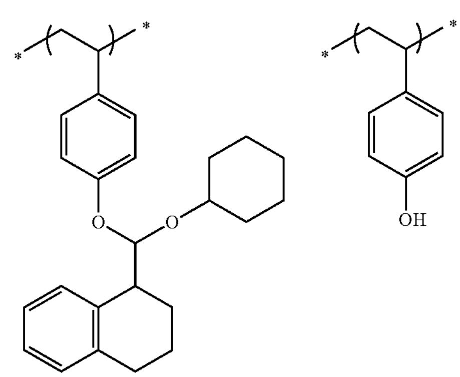

-continued
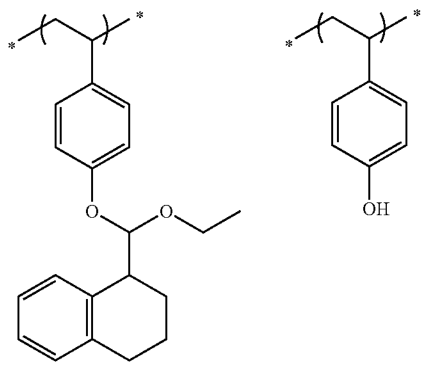
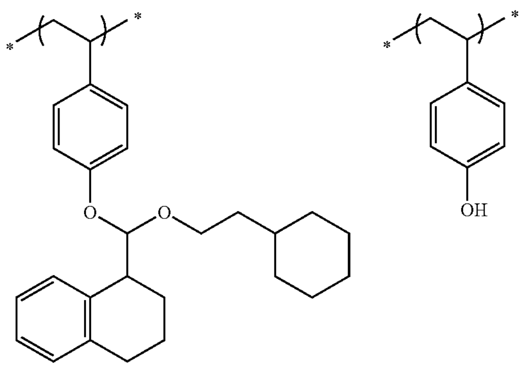
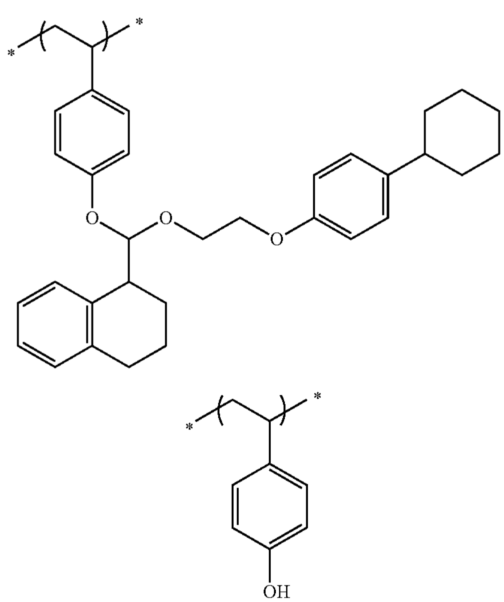
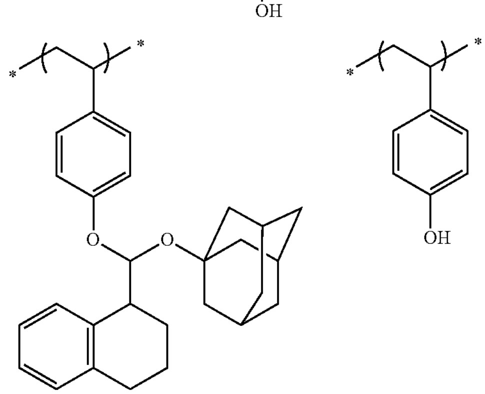
-continued
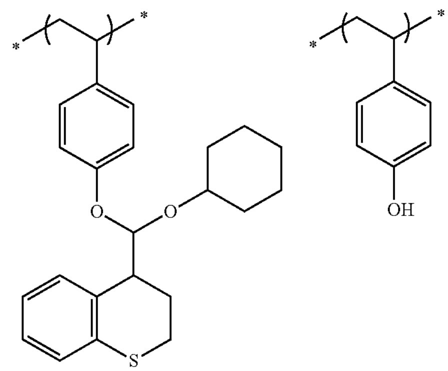
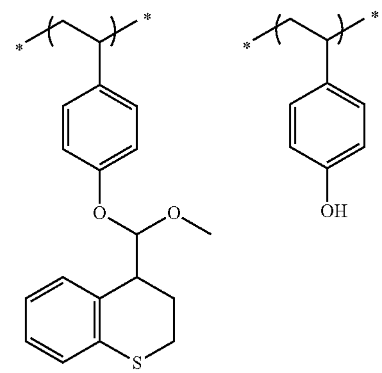
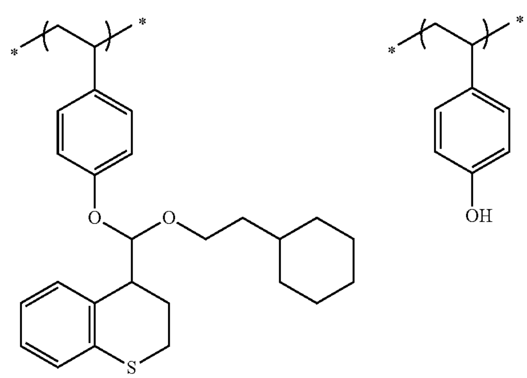
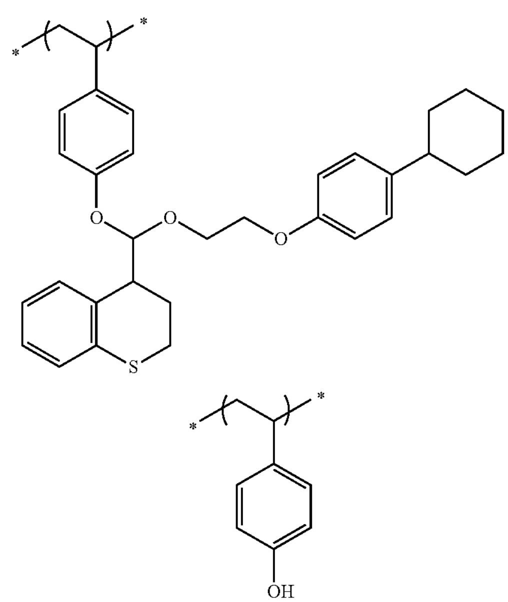

-continued
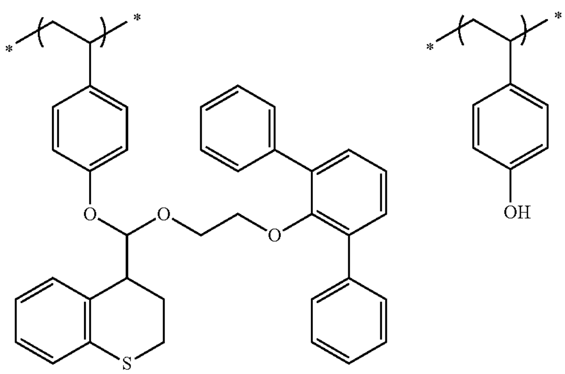
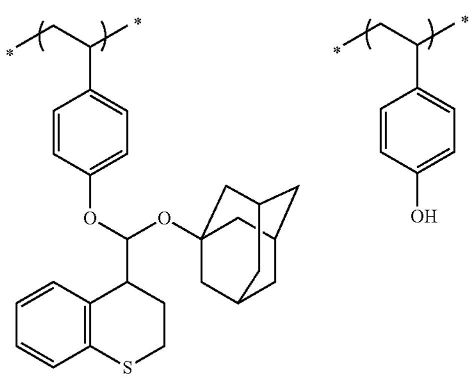
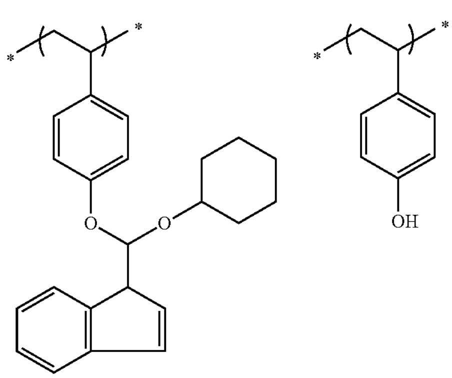
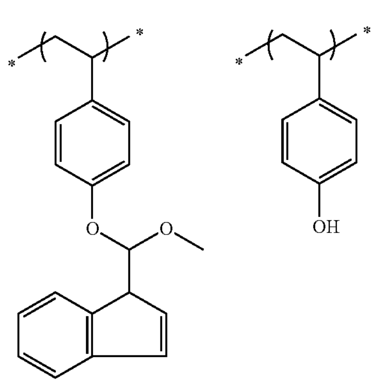
-continued
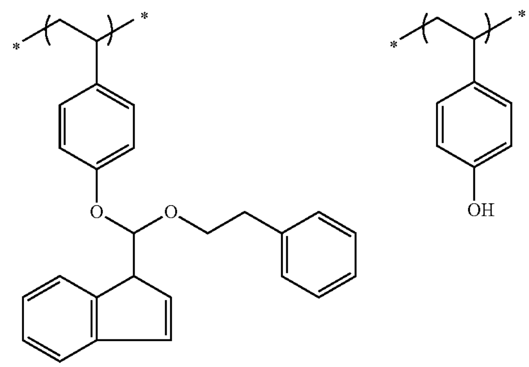
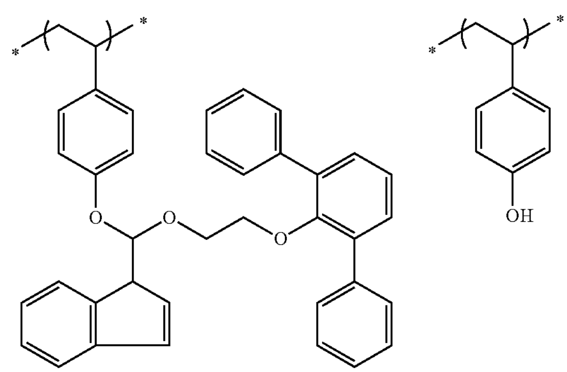
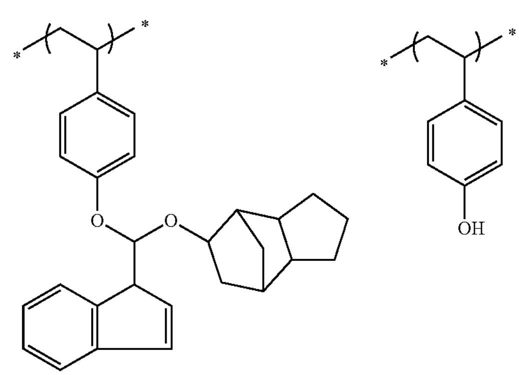
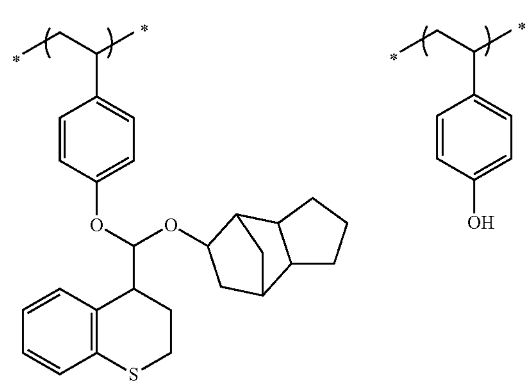

-continued
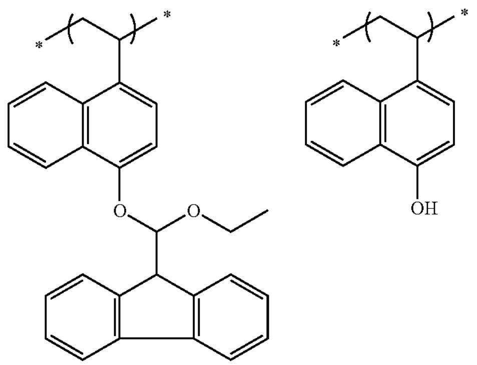
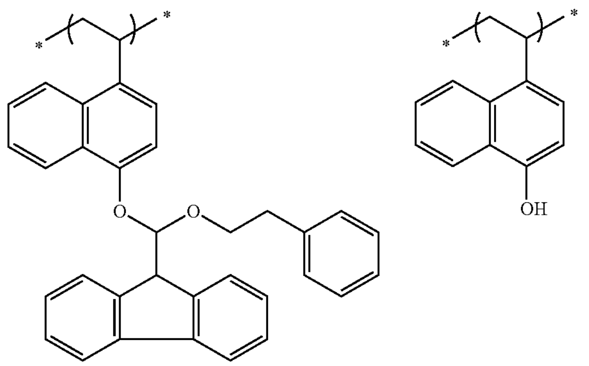
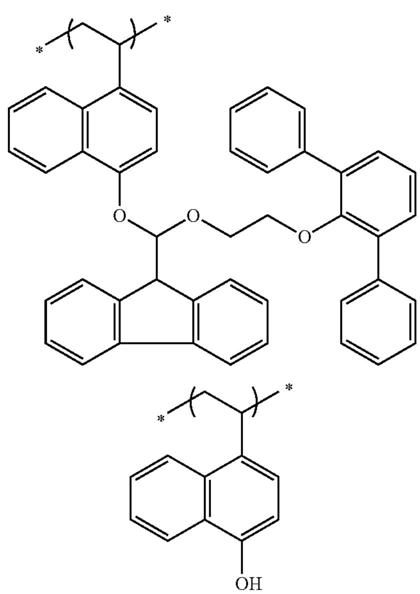
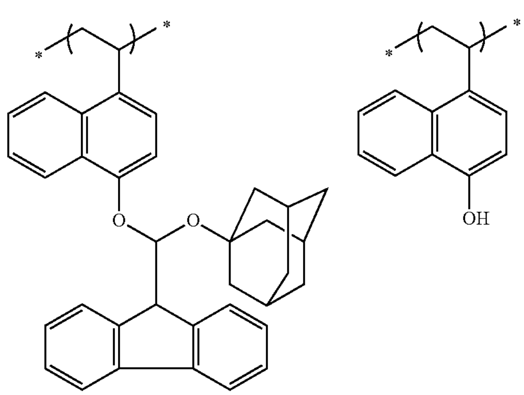
-continued
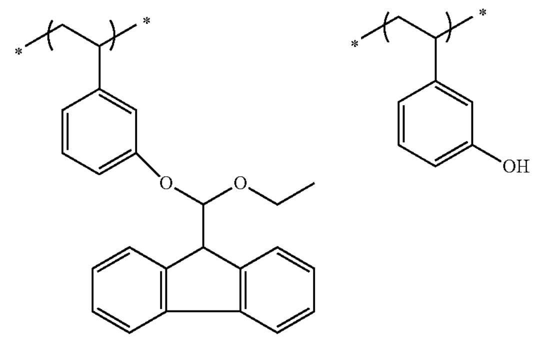
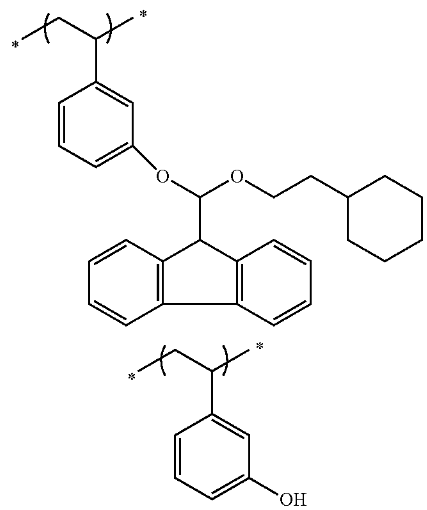
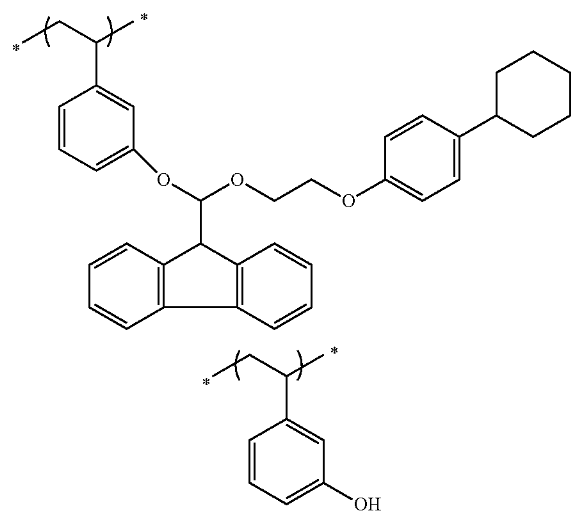
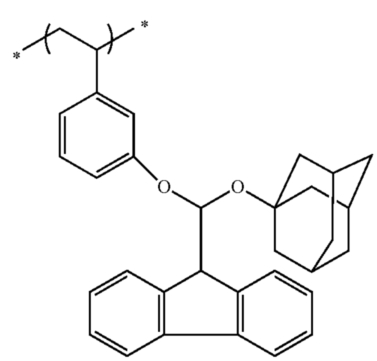

-continued
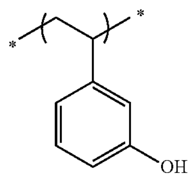
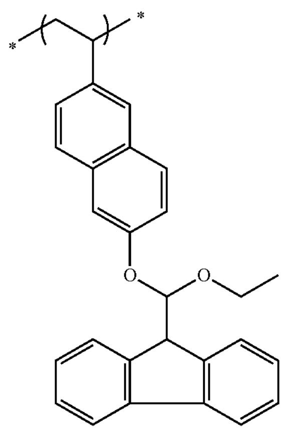
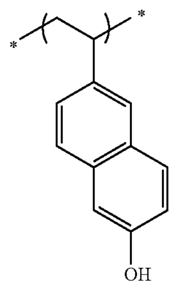
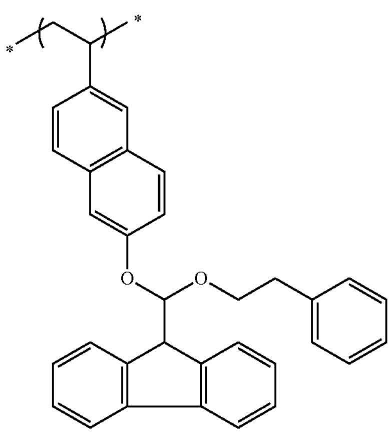
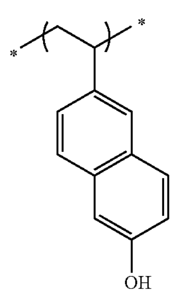
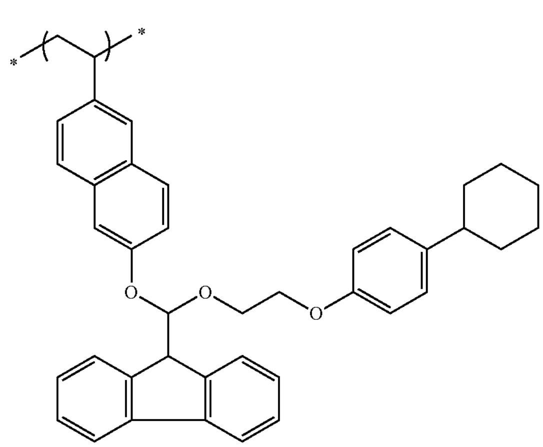
-continued
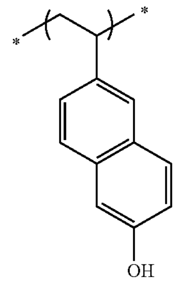
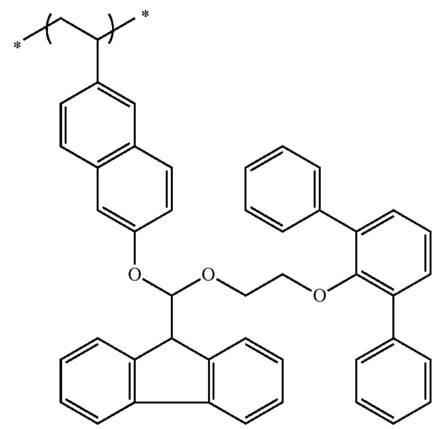
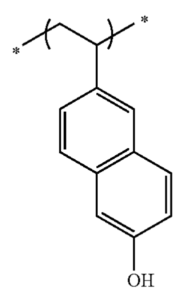
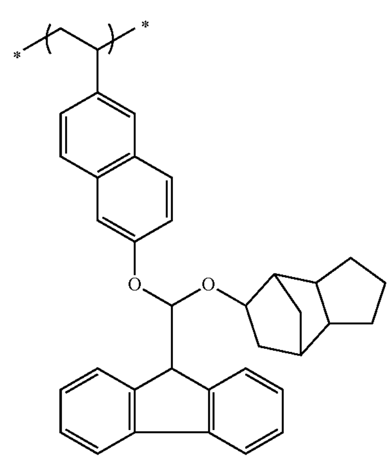
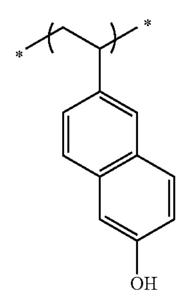

-continued
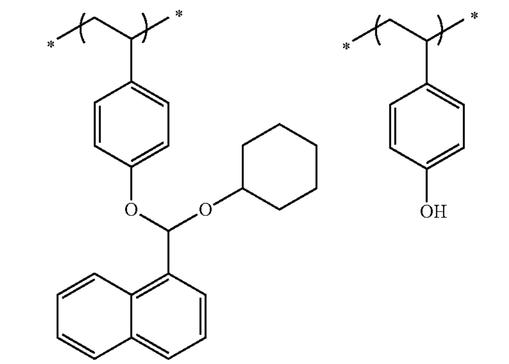
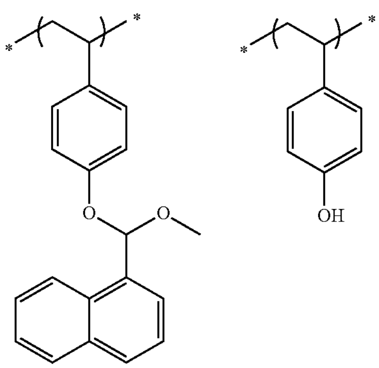
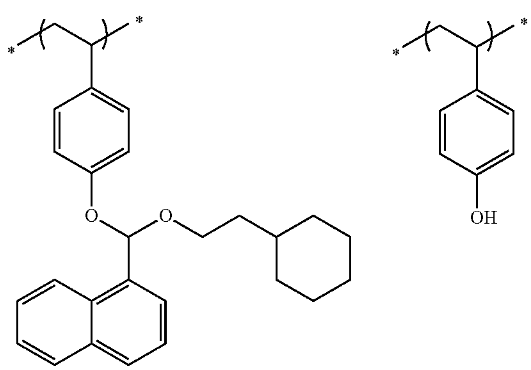
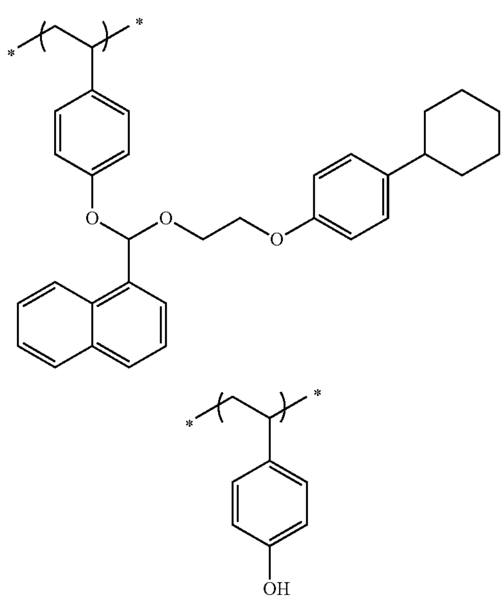
-continued
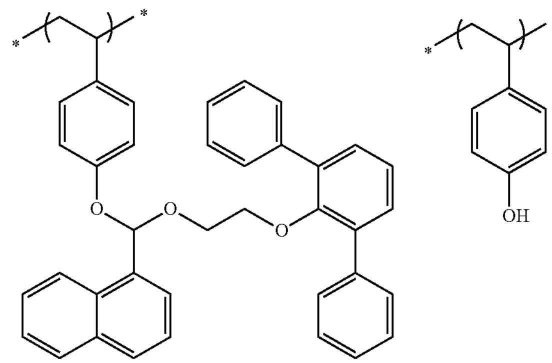
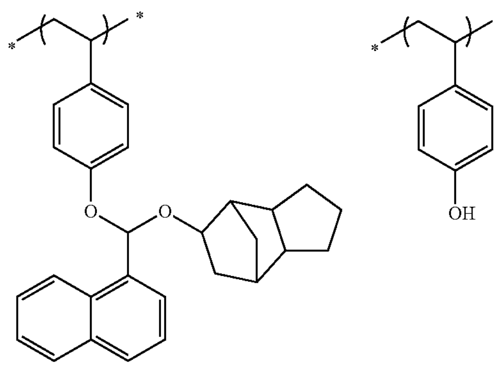
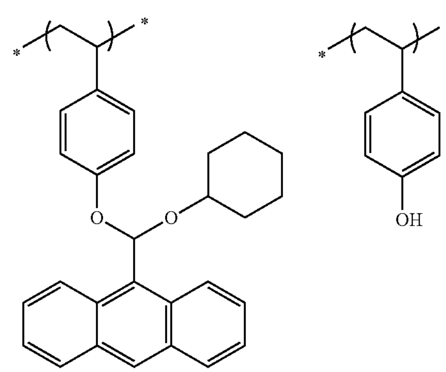
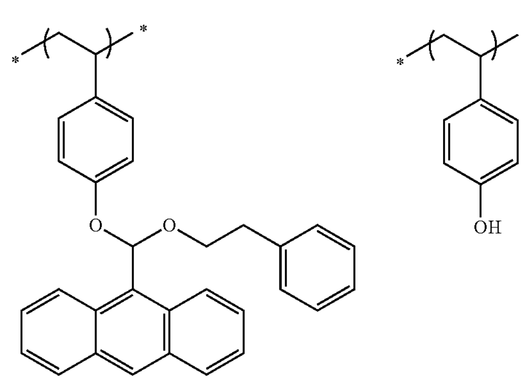

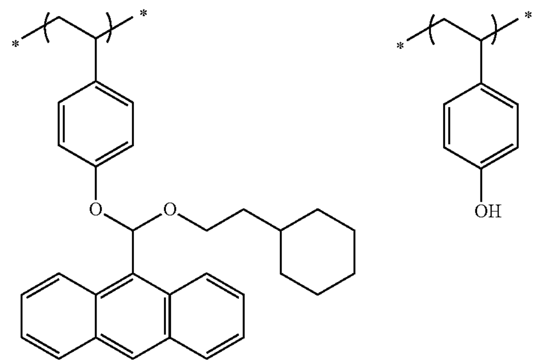
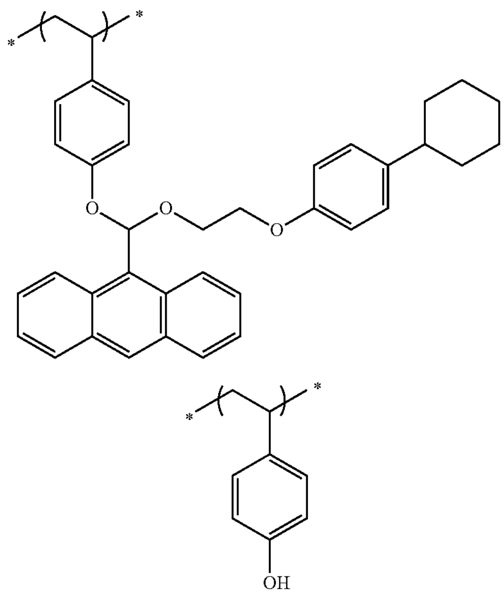
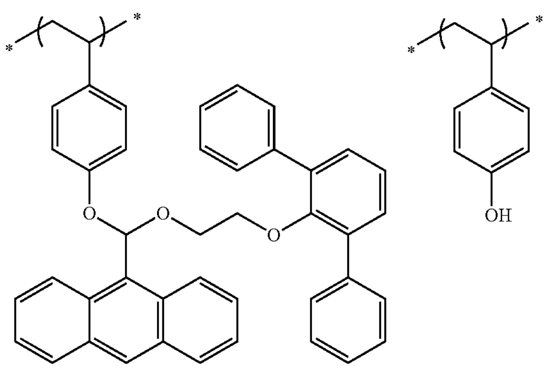
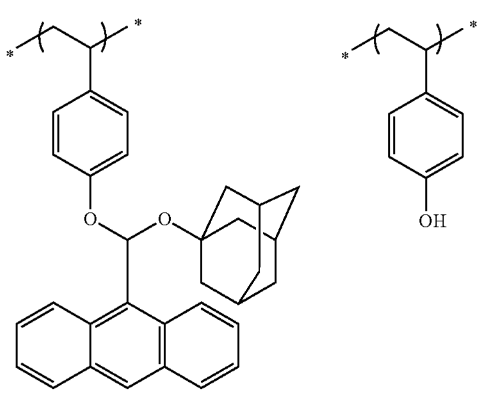
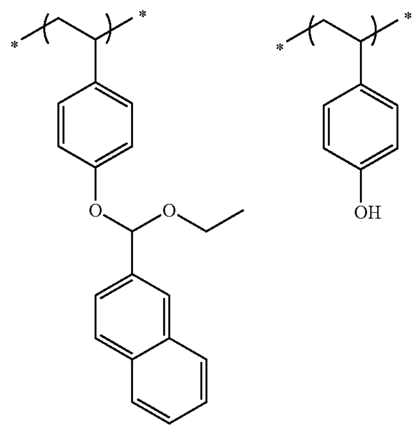
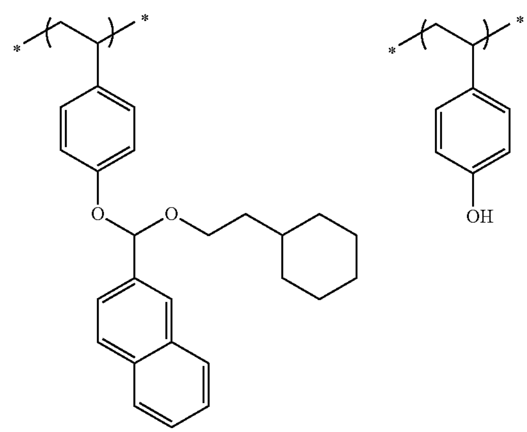
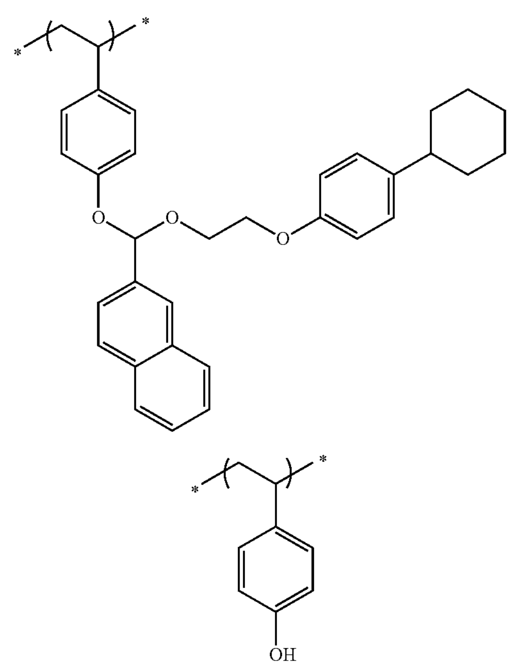

-continued
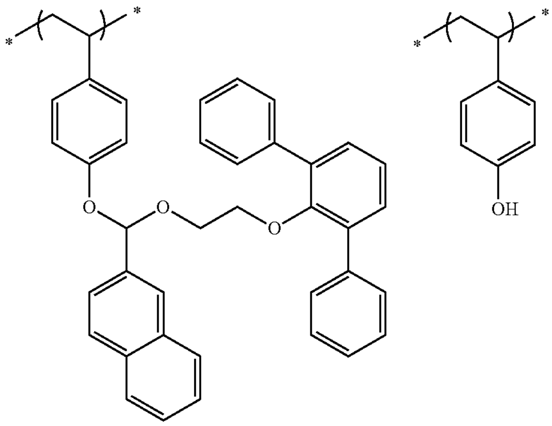
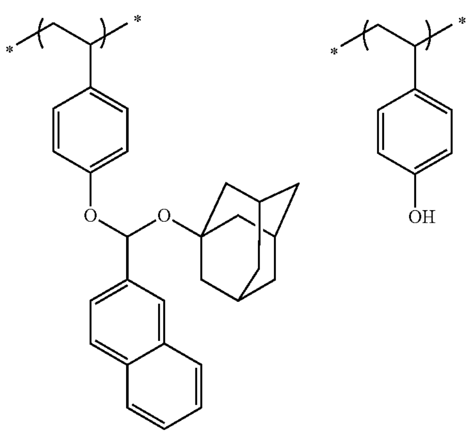
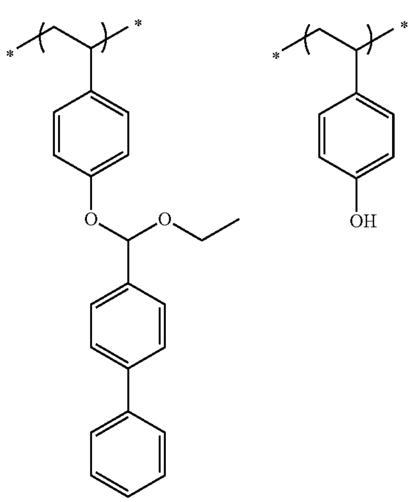
-continued
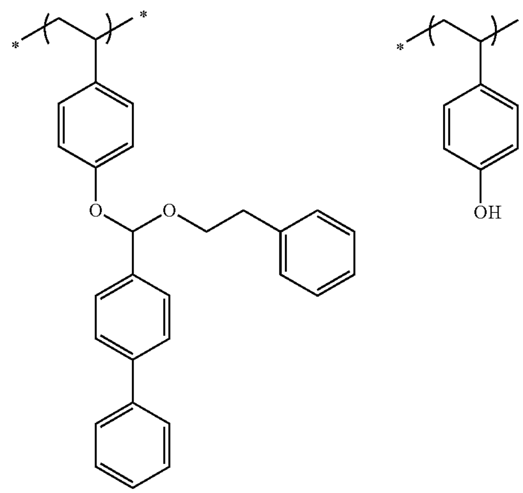
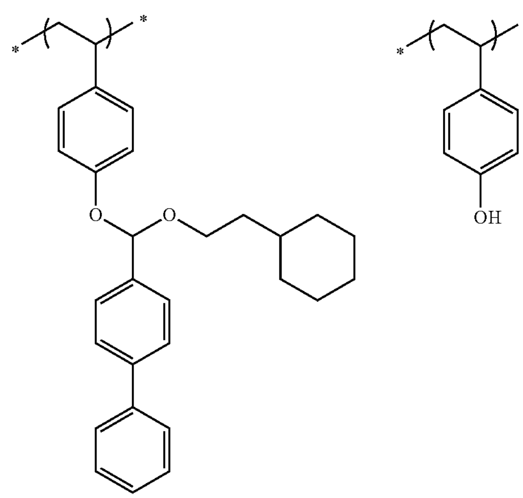
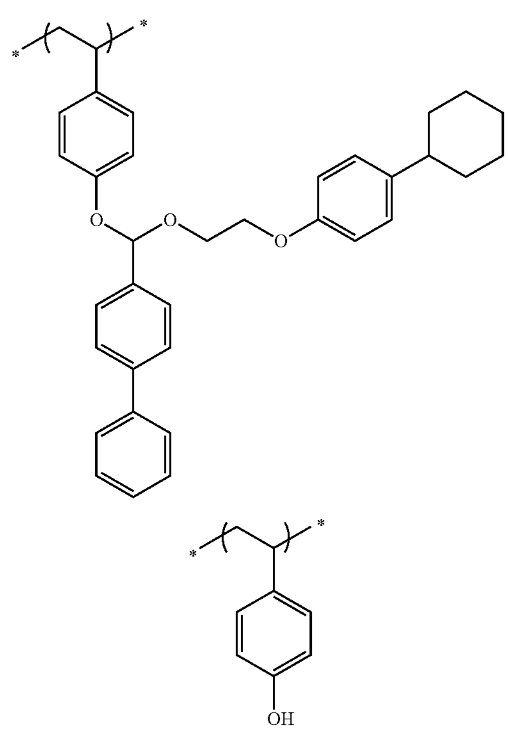

-continued
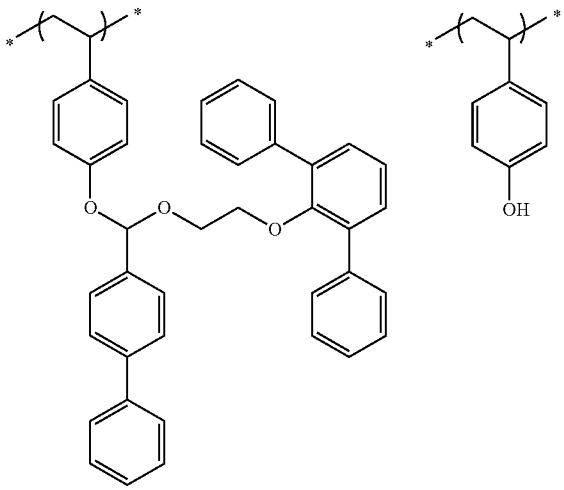
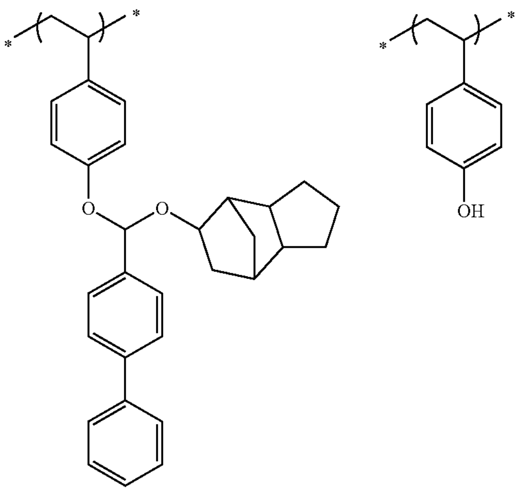
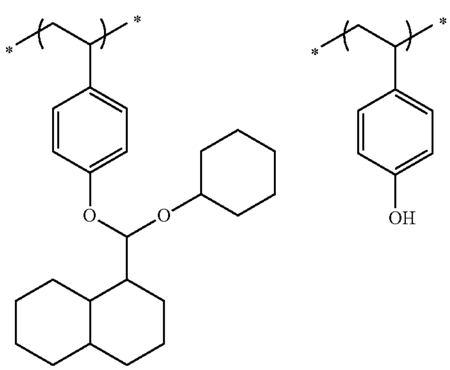
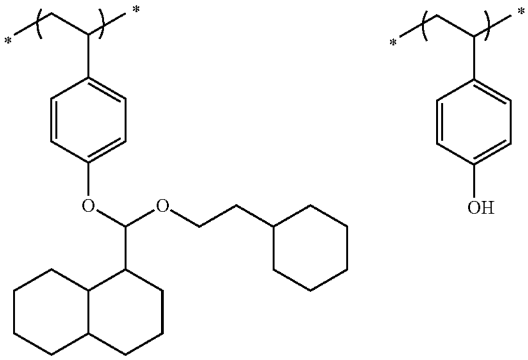
-continued
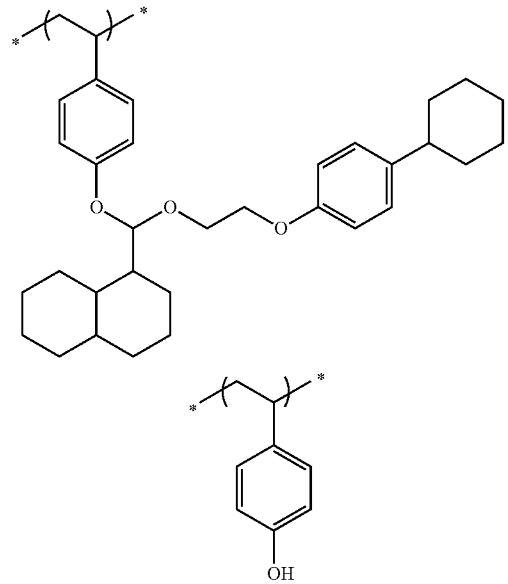
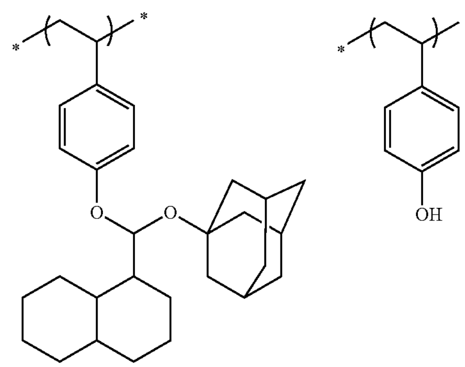
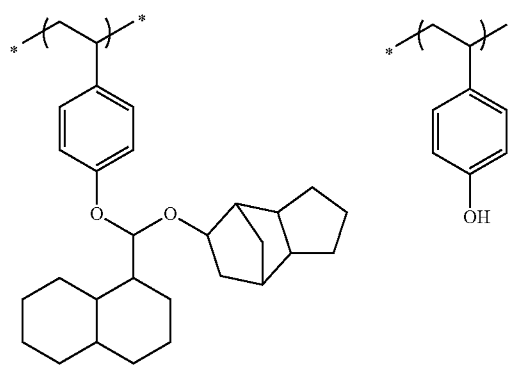
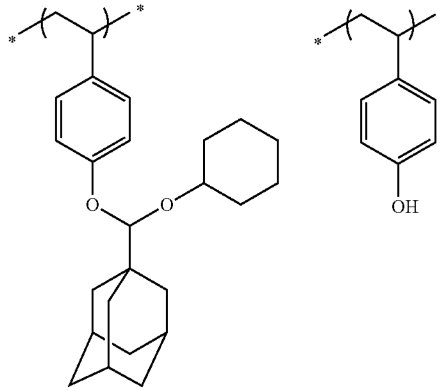

-continued
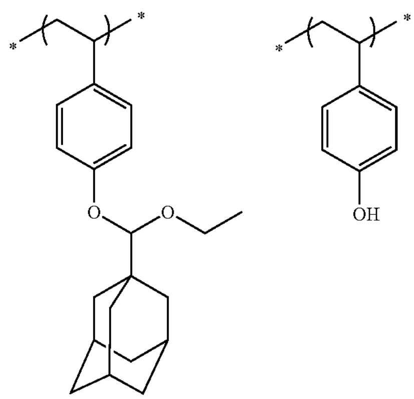
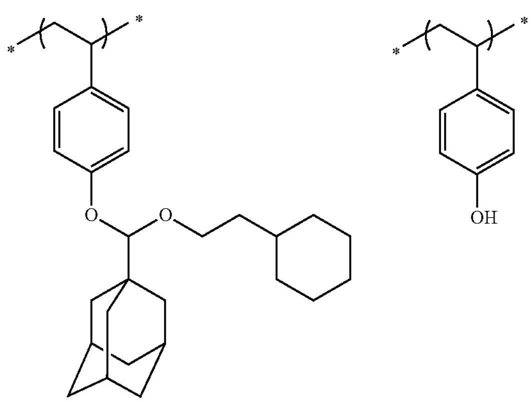
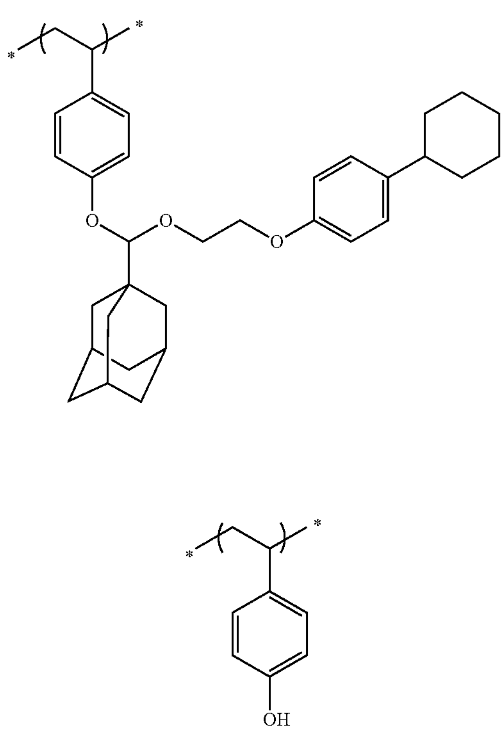
-continued
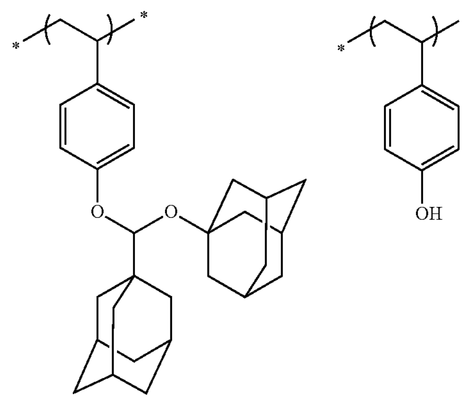
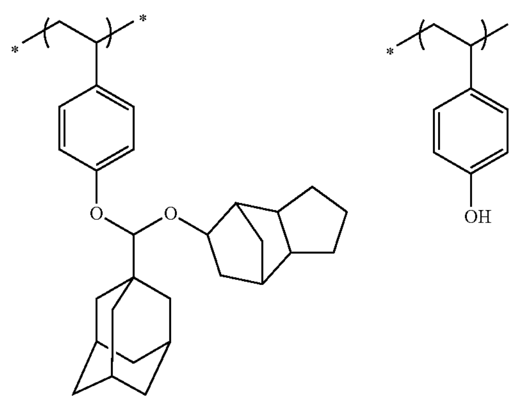
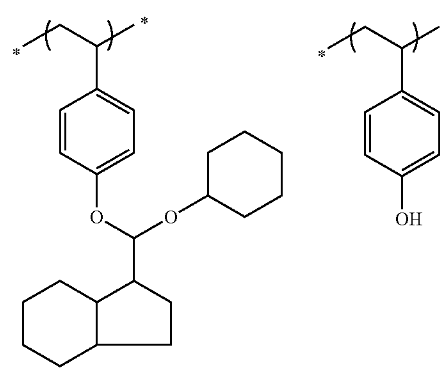
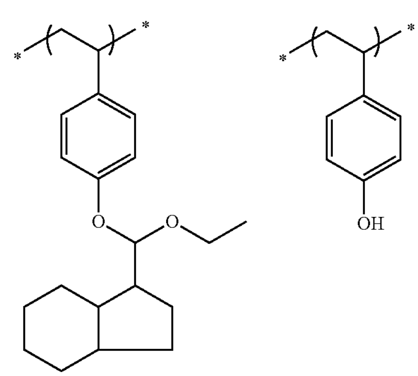

-continued
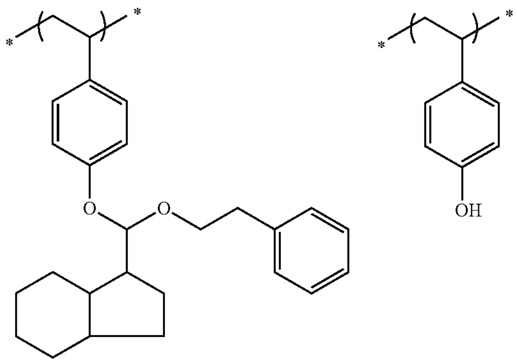
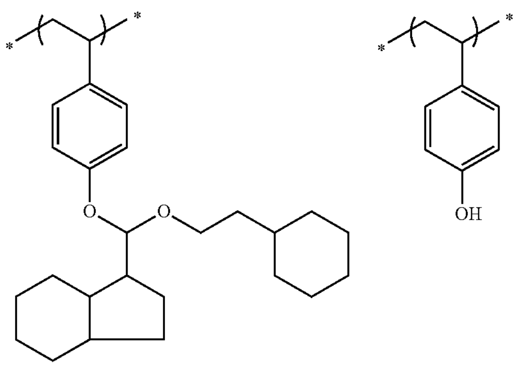
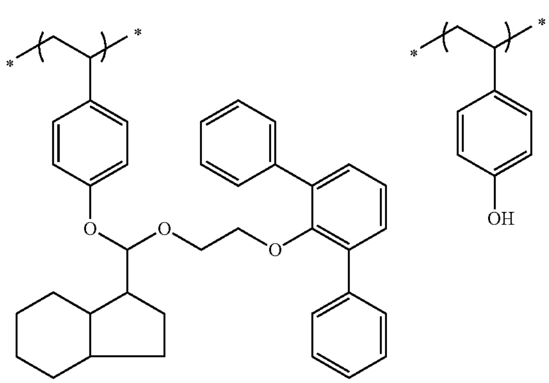
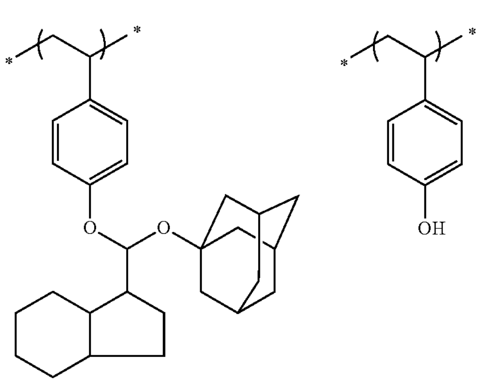
-continued
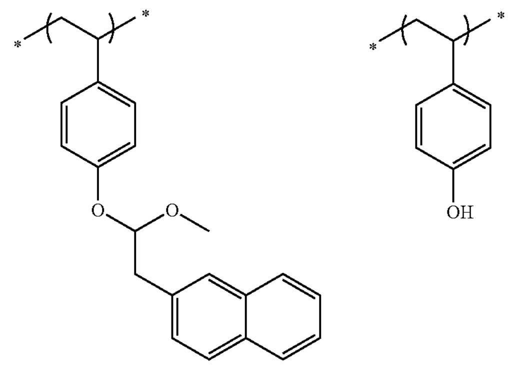
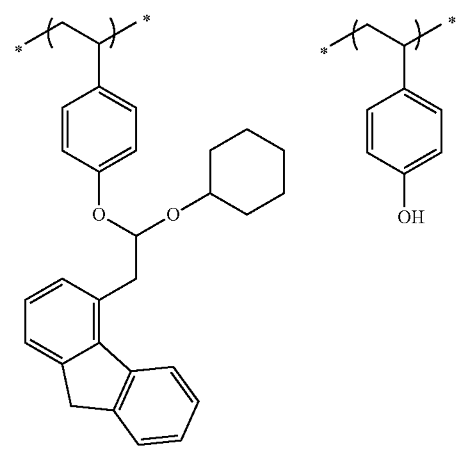
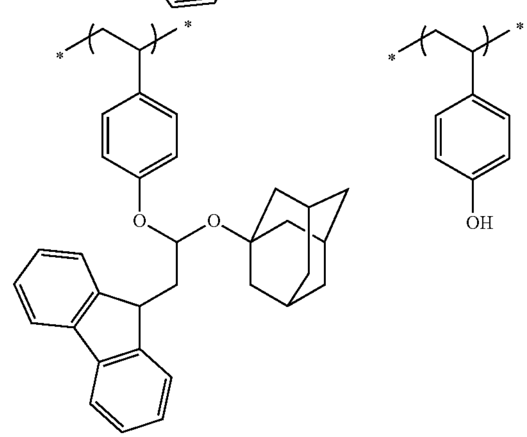
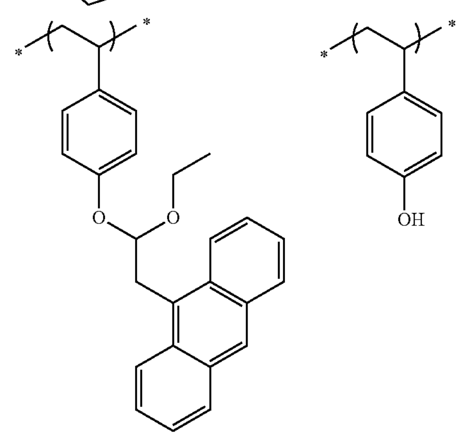

-continued

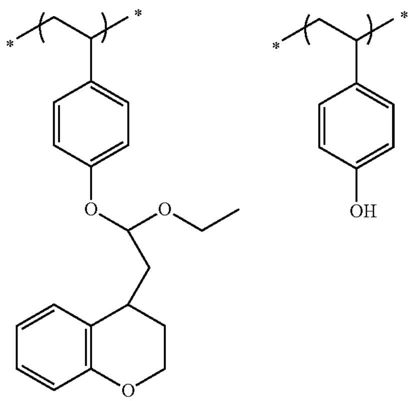

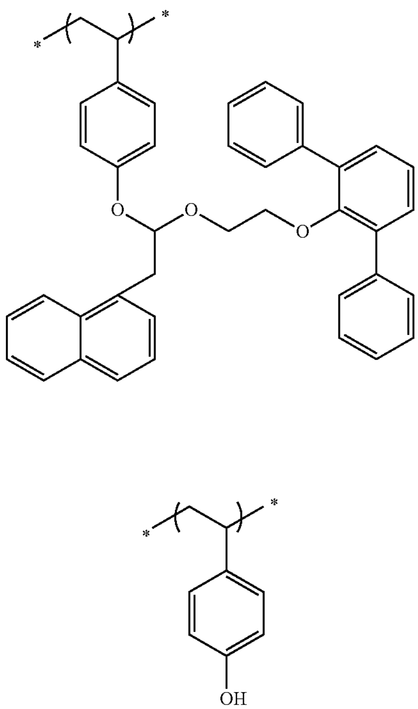

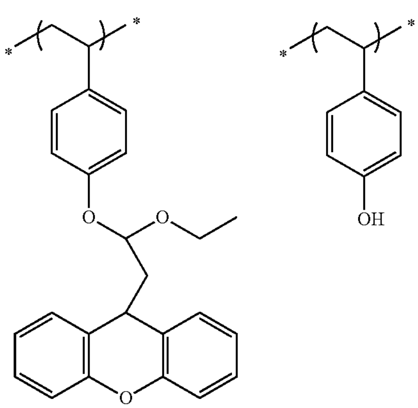

-continued

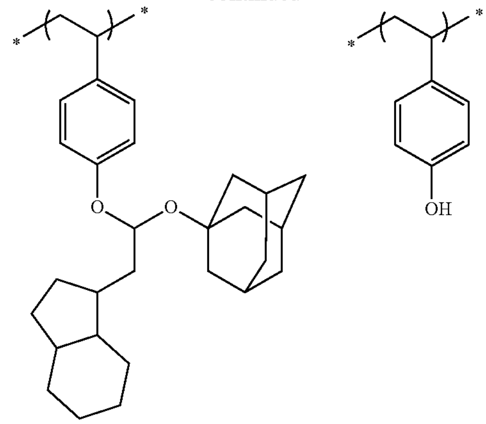

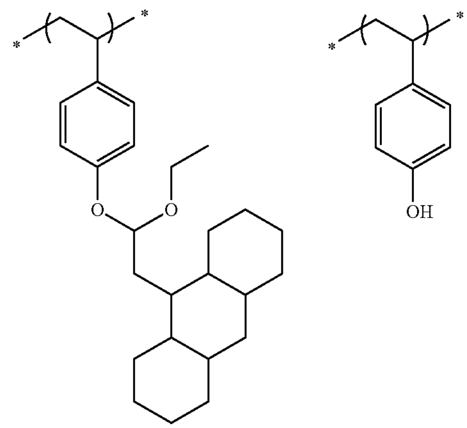

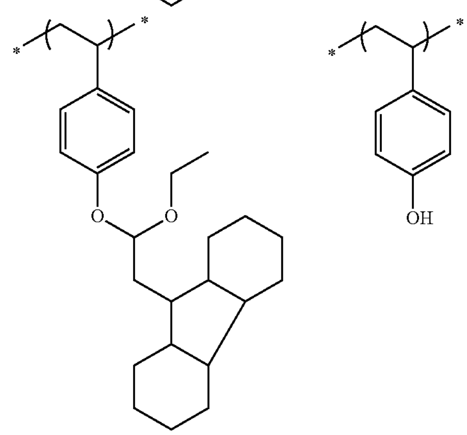

Two or more of these polymer compounds may be mixed and used.

The amount added of the polymer compound (A) for use in the present invention is preferably from 30 to 100 mass %, more preferably from 50 to 99.7 mass %, still more preferably from 70 to 99.5 mass %, based on the entire solid content of the composition. (In this specification, mass ratio is equal to weight ratio.)

[2] (B) Compound Capable of Generating Acid Upon Irradiation with Actinic Ray or Radiation The positive resist composition of the present invention preferably further contains (B) a compound capable of generating an acid upon irradiation with an actinic ray or radiation (hereinafter, sometimes simply referred to as an "acid generator"). In the present invention, the compound (B) capable of generating an acid upon irradiation with an actinic ray or radiation may be a low-molecular acid generator capable of generation an acid upon irradiation with an actinic ray or radiation (particularly an electron beam or an extreme-ultraviolet ray) or may be an acid generating polymer compound. As described above, it is also preferred to use this compound as one constituent component of the polymer compound (A) and allow use as an integrated polymer compound.

A preferred embodiment of the acid generator is an onium compound. Examples of the onium compound include a sulfonium salt, an iodonium salt and a phosphonium salt.

Another preferred embodiment of the acid generator is a compound capable of generating a sulfonic acid, an imidic acid or a methide acid upon irradiation with an actinic ray or radiation. Examples of the acid generator in this embodiment include a sulfonium salt, an iodonium salt, a phosphonium salt, oxime sulfonate and imidosulfonate.

The acid generator for use in the present invention is not limited to a low molecular compound, and a compound where a group capable of generating an acid upon irradiation with an actinic ray or radiation is introduced into the main or side chain of the polymer compound may be also used. Furthermore, in the case where, as described above, a group capable of generating an acid upon irradiation with an actinic ray or radiation is present in a repeating unit serving as a copolymerization component of the polymer compound (A) for use in the present invention, the acid generator (B) which is a different molecule from the polymer compound (A) of the present invention may not be contained.

The acid generator is preferably a compound capable of generating an acid upon irradiation with an electron beam or an extreme-ultraviolet ray.

In the present invention, the onium compound is preferably a sulfonium compound represented by the following formula (1) or an iodonium compound represented by formula (2):

(1)

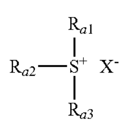

(2)

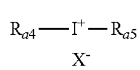

In formulae (1) and (2), each of $R_{a1}$, $R_{a2}$, $R_{a3}$, $R_{a4}$ and $R_{a5}$ independently represents an organic group, and $X^-$ represents an organic anion.

The sulfonium compound represented by formula (1) and the iodonium compound represented by formula (2) are described in detail below.

Each of $R_{a1}$ to $R_{a3}$ in formula (1) and $R_{a4}$ and $R_{a5}$ in formula (2) independently represents an organic group, but at least one of $R_{a1}$ to $R_{a3}$ and at least one of $R_{a4}$ and $R_{a5}$ each is preferably an aryl group. The aryl group is preferably a phenyl group or a naphthyl group, more preferably a phenyl group.

Examples of the organic anion of $X^-$ in formulae (1) and (2) include a sulfonate anion, a carboxylate anion, a bis(alkylsulfonyl)imide anion and a tris(alkylsulfonyl)methide anion. The organic anion is preferably an organic anion represented by the following formula (3), (4) or (5), more preferably an organic anion represented by the following formula (3):

(3)

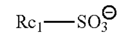

(4)

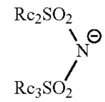

(5)

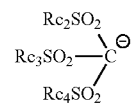

In formulae (3), (4) and (5), each $Rc_1$, $Rc_2$, $Rc_3$ and $Rc_4$ represents an organic group.

The organic anion of $X^-$ corresponds to a sulfonic acid, an imide acid or a methide acid which are an acid generated upon irradiation with an actinic ray or radiation such as electron beam and extreme-ultraviolet ray.

Examples of the organic group of $R_{c1}$ to $R_{c4}$ include an alkyl group, a cycloalkyl group, an aryl group, and a group formed by combining a plurality of such groups. Among these organic groups, an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group, are preferred. A plurality of organic groups of $R_{c2}$ to $R_{c4}$ may combine with each other to form a ring, and the group formed by combining a plurality of organic groups is preferably an alkylene group substituted with a fluorine atom or a fluoroalkyl group. By having a fluorine atom or a fluoroalkyl group, the acidity of the acid generated upon irradiation with light is increased and the sensitivity is enhanced. However, the terminal group preferably contains no fluorine atom as a substituent.

In the present invention, from the standpoint of constraining the acid generated by exposure from diffusing to the non-exposed area and improving the resolution or pattern profile, the (B) compound capable of generating an acid is preferably a compound capable of generating an acid of a size with a volume of 130 Å$^3$ or more (preferably a sulfonic acid), more preferably a compound capable of generating an acid of a size with a volume of 190 Å$^3$ or more (preferably a sulfonic acid), still more preferably a compound capable of generating an acid of a size with a volume of 230 Å$^3$ or more (preferably a sulfonic acid), yet still more preferably a compound capable of generating an acid of a size with a volume of 270 Å$^3$ or more (preferably a sulfonic acid), and particularly preferably a compound capable of generating an acid of a size with a volume of 400 Å$^3$ or more (preferably a sulfonic acid). On the other hand, in view of sensitivity or solubility in the coating solvent, the volume above is preferably 2,000 Å$^3$ or less, more preferably 1,500 Å$^3$ or less. The value of the volume above was determined using "WinMOPAC" produced by Fujitsu Limited. That is, first, the chemical structure of the acid in each example is input; next, using this structure as an initial structure, the most stable steric configuration of each acid is determined by molecular force field calculation using an MM3 method; and thereafter, molecular orbital calculation using a PM3 method is performed with respect to the most stable steric conformation, whereby the "accessible volume" of each acid can be computed.

Acid generators particularly preferred in the present invention are illustrated below. In some of these examples, the calculated value of volume (unit: Å$^3$) is shown together. The calculated value determined here is a volume value of an acid where a proton is bonded to the anion moiety.
(z1)
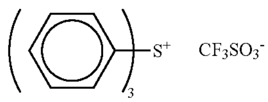
(z2)
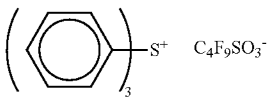
113Å$^3$
(z3)
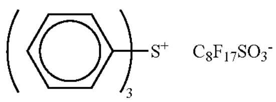
220Å$^3$
(z4)
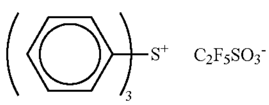
(z5)
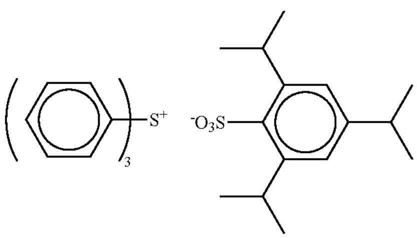
303Å$^3$
(z6)
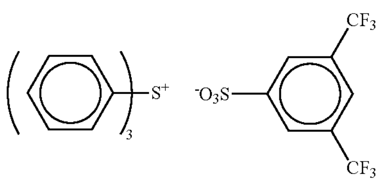
(z7)
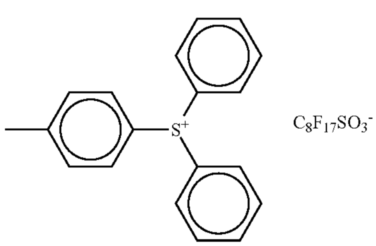
(z8)
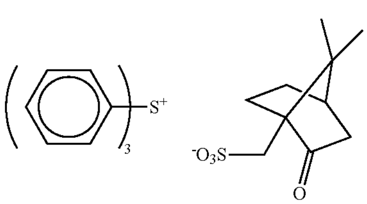
216Å$^3$
-continued
(z9)
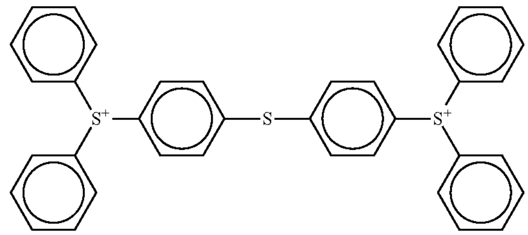
127Å$^3$
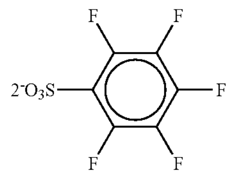
(z10)
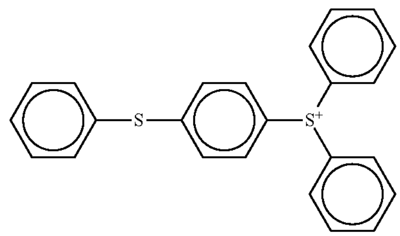
127Å$^3$
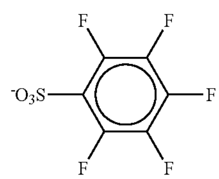
(z11)
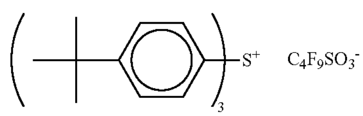
113Å$^3$
(z12)
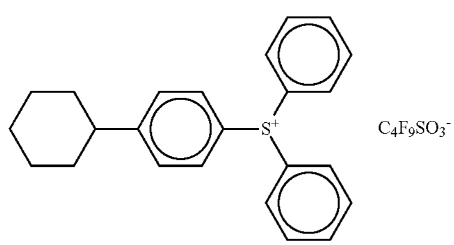
113Å$^3$
(z13)
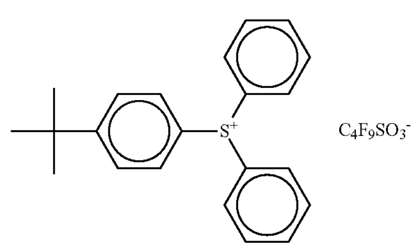
113Å$^3$ -continued
(z14)
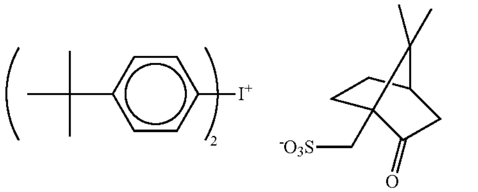
216Å$^3$
(z15)
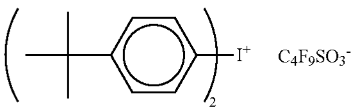
113Å$^3$
(z16)
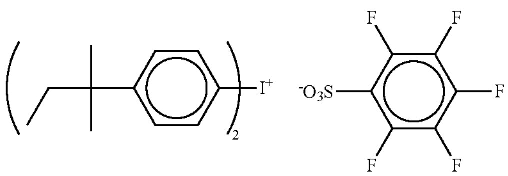
127Å$^3$
(z17)
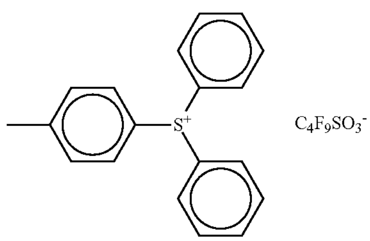
113Å$^3$
(z18)
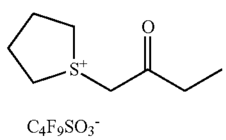
113Å$^3$
(z19)
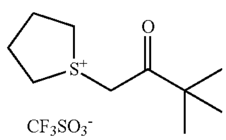
113Å$^3$
(z20)
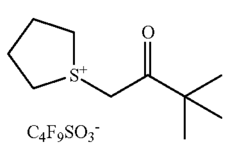
113Å$^3$
-continued
(z21)
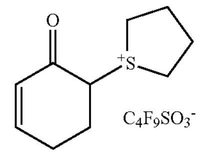
113Å$^3$
(z22)
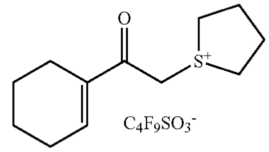
113Å$^3$
(z23)
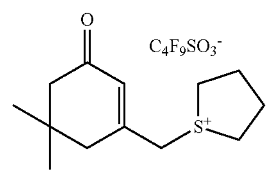
113Å$^3$
(z24)
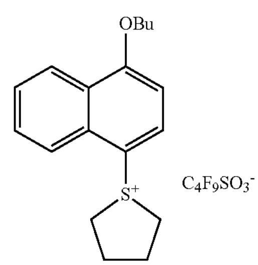
113Å$^3$
(z25)
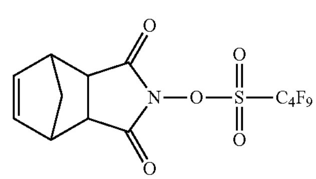
113Å$^3$
(z26)
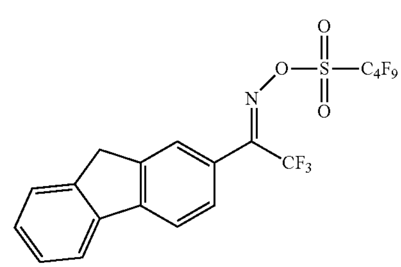
113Å$^3$ -continued
(z27)
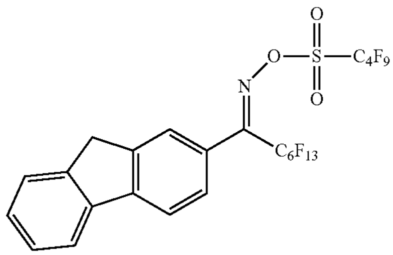
113Å$^3$
(z28)
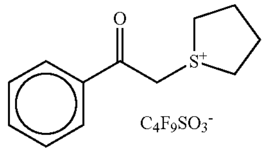
113Å$^3$
(z29)
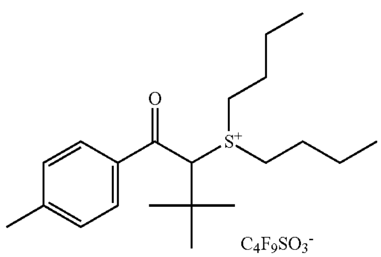
113Å$^3$
(z30)
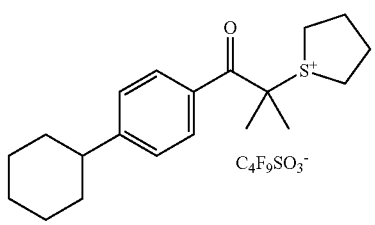
113Å$^3$
(z31)
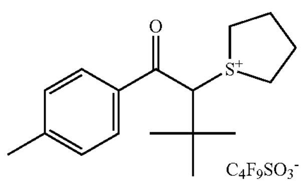
113Å$^3$
(z32)
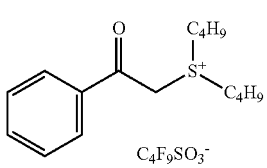
113Å$^3$
-continued
(z33)
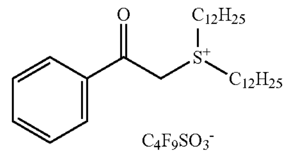
113Å$^3$
(z34)
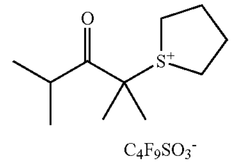
113Å$^3$
(z35)
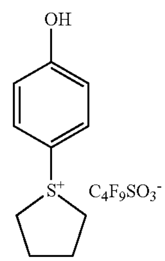
113Å$^3$
(z36)
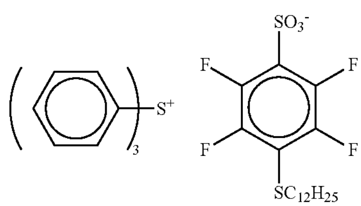
393Å$^3$
(z37)
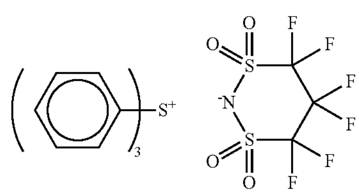
136Å$^3$
(z38)
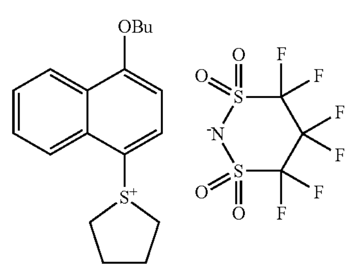
136Å$^3$ -continued
(z39)
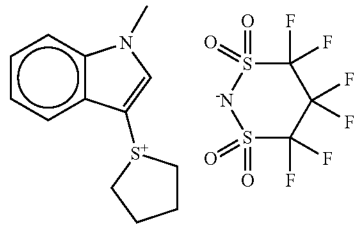
136Å$^3$
(z40)
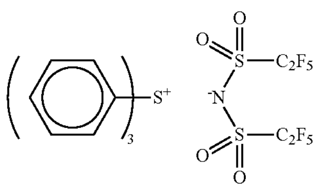
173Å$^3$
(z41)
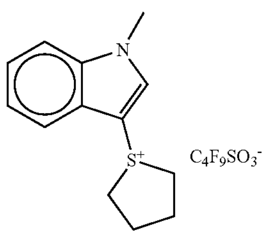
113Å$^3$
(z42)
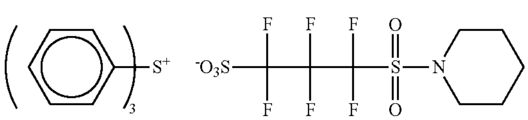
244Å$^3$
(z43)
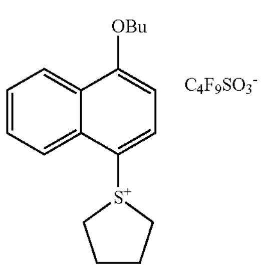
113Å$^3$
(z44)
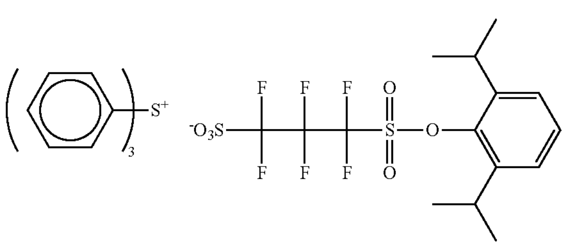
349Å$^3$
-continued
(z45)
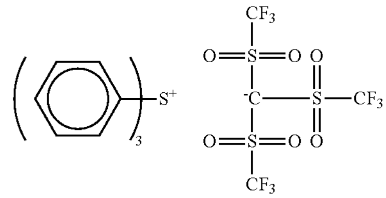
189Å$^3$
(z46)
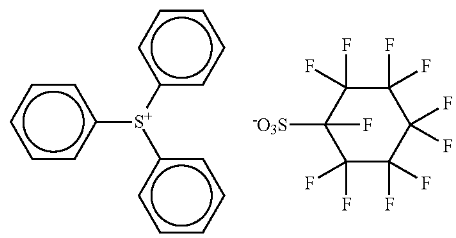
136Å$^3$
(z47)
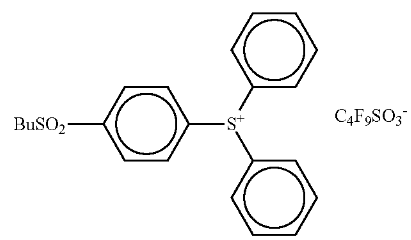
113Å$^3$
(z48)
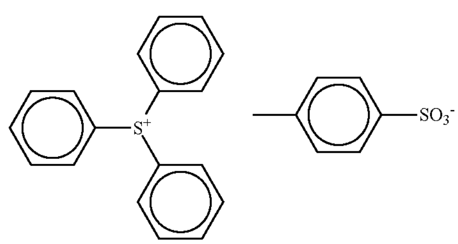
186Å$^3$
(z49)
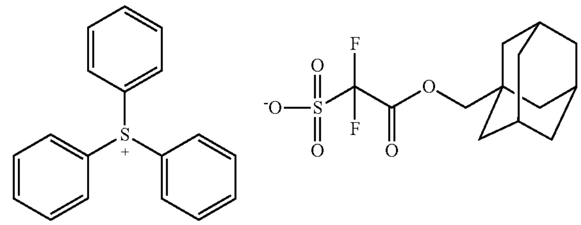
271Å$^3$ -continued
(z50)
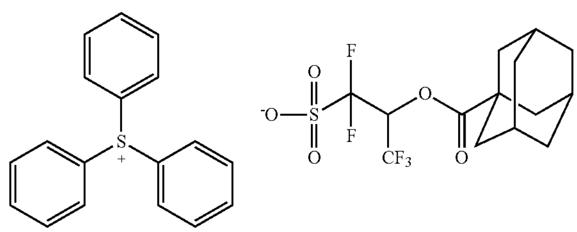
291Å$^3$
(z51)
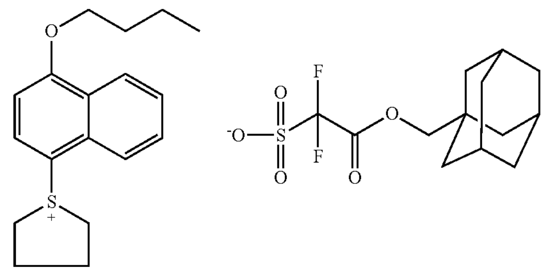
271Å$^3$
(z52)
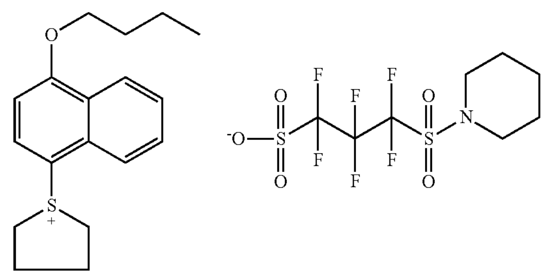
244Å$^3$
(z53)
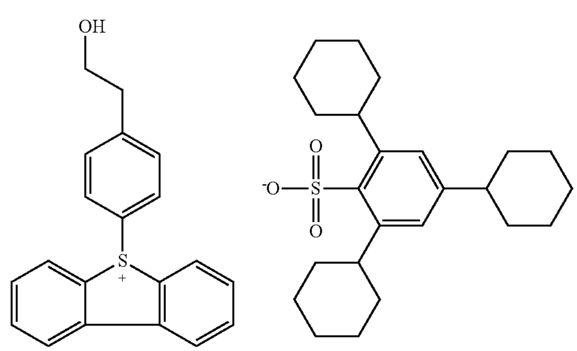
437Å$^3$
(z54)
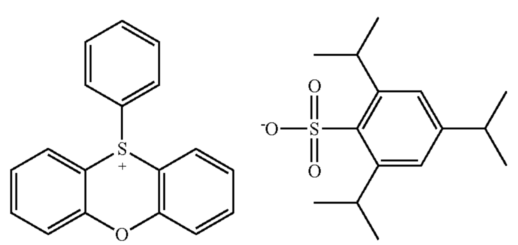
303Å$^3$
-continued
(z55)
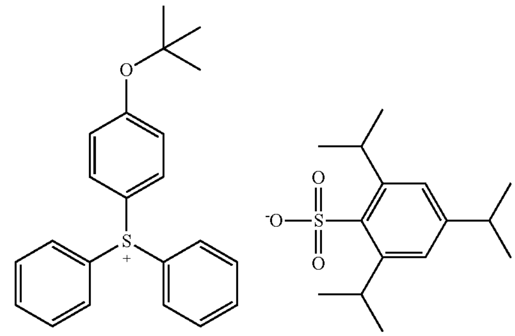
303Å$^3$
(z56)
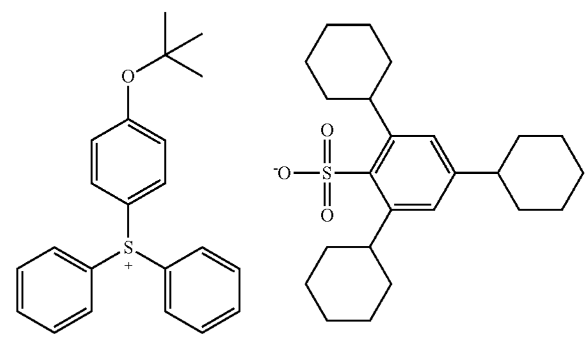
437Å$^3$
(z57)
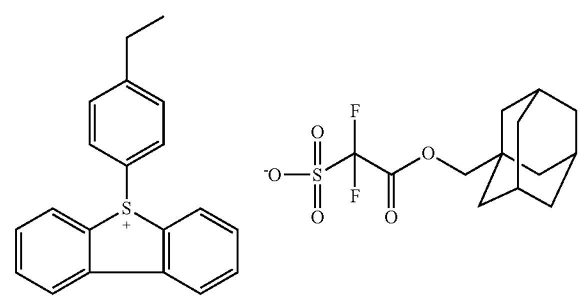
271Å$^3$
(z58)
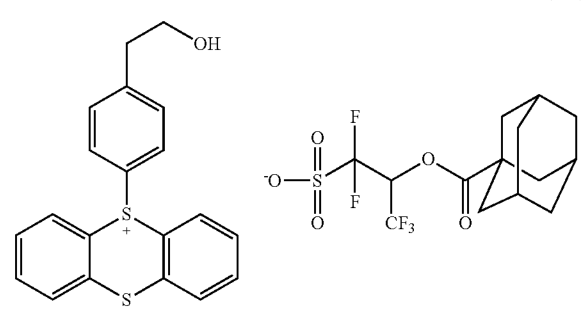
291Å$^3$ -continued
(z59)
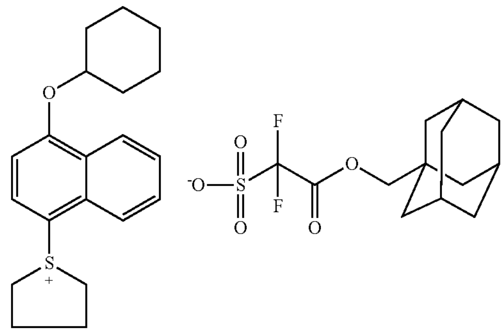
271Å$^3$
(z60)
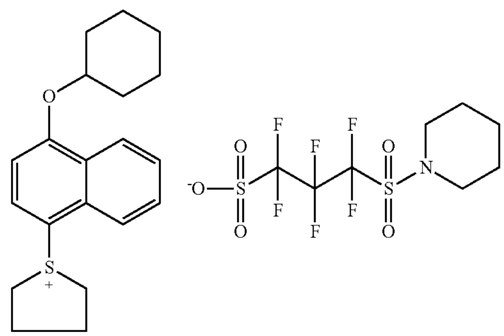
244Å$^3$
(z61)
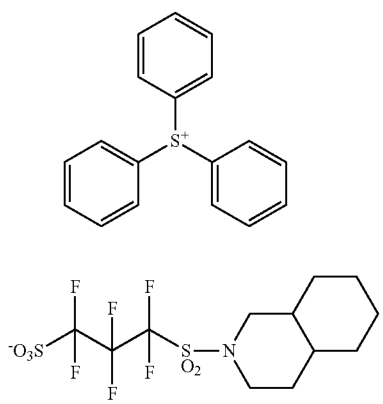
311Å$^3$
(z62)
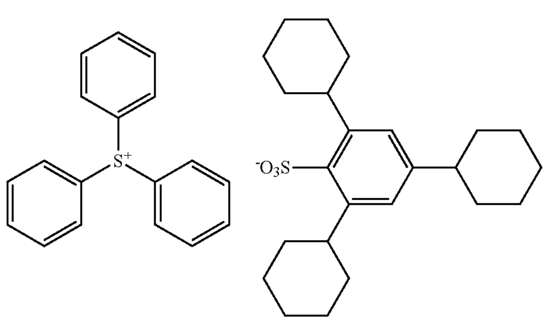
437Å$^3$
-continued
(z63)
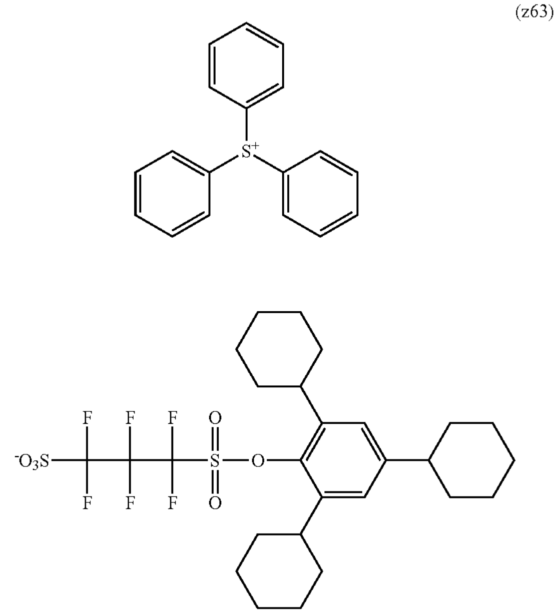
535Å$^3$
(z64)
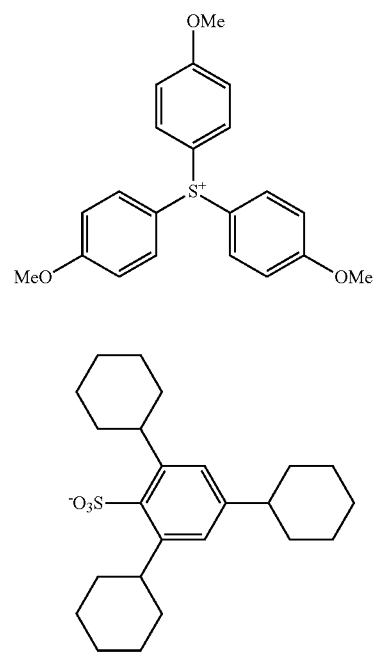
437Å$^3$
(z65)
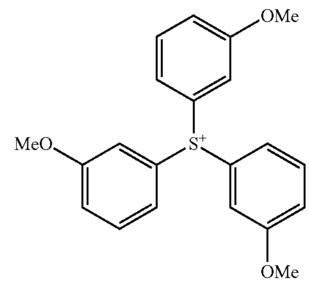

-continued

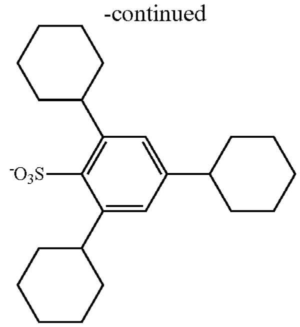

437Å³

(z66)

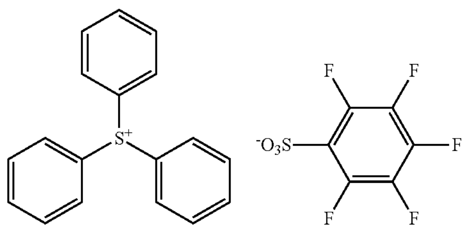

127Å³

(z67)

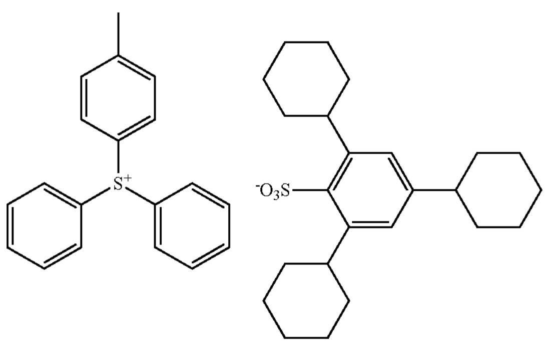

437Å³

Incidentally, as the acid generator (preferably an onium compound) for use in the present invention, a polymer-type acid generator where a group capable of generating an acid upon irradiation with an actinic ray or radiation (photoacid generating group) is introduced into the main or side chain of a polymer compound may be also used, and this acid generator is described as a repeating unit having a photoacid generating group in connection with the polymer compound (A).

The content of the acid generator in the composition is preferably from 1.0 to 35 mass %, more preferably from 1.5 to 30 mass %, still more preferably from 2.0 to 25 mass %, based on the entire solid content of the resist composition.

One kind of an acid generator may be used alone, or two or more kinds of acid generators may be used in combination.

[3] (C) Basic Compound

The positive resist composition of the present invention preferably contains a basic compound as an acid scavenger, in addition to the components described above. By using a basic compound, the change of performance with aging from exposure to post-heating can be reduced. The basic compound is preferably an organic basic compound, and specific examples thereof include aliphatic amines, aromatic amines, heterocyclic amines, nitrogen-containing compounds having a carboxyl group, nitrogen-containing compound having a sulfonyl group, nitrogen-containing compound having a hydroxy group, nitrogen-containing compound having a hydroxyphenyl group, an alcoholic nitrogen-containing compound, amide derivatives, and imide derivatives. An amine oxide compound (for example, compounds described in JP-A-2008-102383) and an ammonium salt (preferably a hydroxide or a carboxylate; more specifically, a tetraalkylammonium hydroxide typified by tetrabutylammonium hydroxide is preferred in view of LER) may be also appropriately used.

Furthermore, a compound capable of increasing the basicity by the action of an acid can be also used as a kind of the basic compound.

Specific examples of the amines include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecyl amine, N,N-dimethyldodecylamine, methyldioctadecylamine, N,N-dibutylaniline, N,N-dihexylaniline, 2,6-diisopropylaniline, 2,4,6-tri(tert-butyl)aniline, triethanolamine, N,N-dihydroxyethyl aniline, tris(methoxyethoxyethyl)amine, the compounds exemplified in column 3, line 60 et seq. of U.S. Pat. No. 6,040,112, 2-[2-{2-(2,2-dimethoxy-phenoxyethoxy) ethyl}-bis-(2-methoxyethyl)]-amine, and Compounds (C1-1) to (C3-3) illustrated in paragraph [0066] of U.S. Patent Application Publication No. 2007/0224539A1. Examples of the compound having a nitrogen-containing heterocyclic structure include 2-phenylbenzimidazole, 2,4,5-triphenylimidazole, N-hydroxyethylpiperidine, bis(1,2,2,6,6-pentamethyl-4-piperidyl)sebacate, 4-dimethylaminopyridine, antipyrine, hydroxyantipyrine, 1,5-diazabicyclo[4.3.0]-non-5-ene, and 1,8-diazabicyclo[5.4.0]-undec-7-ene. As an ammonium salt, tetrabutylammonium hydroxide is preferred.

In addition, a photodecomposable basic compound (a compound which initially exhibits basicity due to the action of the basic nitrogen atom as a base but decomposes upon irradiation with an actinic ray or radiation to generate a zwitterionic compound having a basic nitrogen atom and an organic acid moiety and resulting from their neutralization in the molecule, is reduced in or deprived of the basicity; for example, the onium salts described in Japanese Patent No. 3,577,743, JP-A-2001-215689, JP-A-2001-166476 and JP-A-2008-102383), and a photobase generator (for example, the compounds described in JP-A-2010-243773) may be also appropriately used.

Among these basic compounds, an ammonium salt is preferred from the standpoint of enhance the resolution property.

In the present invention, one kind of a basic compound may be used alone, or two or more kinds of basic compounds may be used in combination.

The content of the basic compound for use in the present invention is preferably from 0.01 to 10 mass %, more preferably from 0.03 to 5 mass %, still more preferably from 0.05 to 3 mass %, based on the entire solid content of the resist composition.

[4] Surfactant

In the positive resist composition of the present invention, a surfactant may further be added so as to enhance the coatability. The examples of the surfactant include a nonionic surfactant such as polyoxyethylene alkyl ethers, polyoxyethylene alkylallyl ethers, polyoxyethylene-polyoxypropylene block copolymers, sorbitan fatty acid esters and polyoxyethylene sorbitan fatty acid esters, a fluorine-containing surfactant such as Florad FC430 (produced by Sumitomo 3M, Inc.), Surfynol E1004 (produced by Asahi Glass Co., Ltd.), and PF656 and PF6320 produced by OMNOVA, and an organosiloxane polymer.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

The positive resist composition of the present invention may further contain a dye, a plasticizer, a photodecomposable base compound, a photobase generator and the like, if desired. Examples of these compounds include the compounds described in JP-A-2002-6500.

Preferred examples of the organic solvent for use in the resist composition of the present invention include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate. These solvents are used individually or in combination.

The solid contents of the resist composition are preferably dissolved in the solvent above to give a solid content concentration of 1 to 30 mass %, more preferably from 1 to 30 mass %, still more preferably from 3 to 20 mass %. With a solid content concentration in this range, the later-described film thickness can be achieved.

The present invention also relates to a resist film formed using the positive resist composition of the present invention. This resist film is formed, for example, by applying the resist composition having the above-described solid content concentration on a support such as substrate. The positive resist composition of the present invention is applied on a substrate by an appropriate coating method such as spin coating, roll coating, flow coating, dip coating, spray coating and doctor coating, and then pre-baked at 60 to 150° C. for 1 to 20 minutes, preferably at 80 to 120° C. for 1 to 10 minutes, to form a thin film. The thickness of the coated film is preferably from 10 to 180 nm, more preferably from 20 to 150 nm.

The substrate suitable for the present invention is a silicon substrate or a substrate having provided thereon a metal deposited film or a metal-containing film, and a substrate having provided on the surface thereof a deposited film by Cr, MoSi, TaSi or an oxide or nitride thereof is more suited.

The present invention also relates to a resist-coated mask blank coated with the thus-obtained resist film. In order to obtain such a resist-coated mask blank, in the case of forming a resist pattern on a photomask blank for the production of a photomask, the transparent substrate is a transparent substrate such as quartz and calcium fluoride. In general, a light-shielding film, an antireflection film, further a phase shift film, and additionally a required functional film such as etching stopper film and etching mask film, are stacked on the substrate. As for the material of the functional film, a film containing silicon or a transition metal such as chromium, molybdenum, zirconium, tantalum, tungsten, titanium and niobium is stacked. Examples of the material used for the outermost layer include a material where the main constituent material is a material containing silicon or containing silicon and oxygen and/or nitrogen, a silicon compound material where the main constituent material is the material above which further contains a transition metal, and a transition metal compound material where the main constituent material is a material containing a transition metal, particularly, one or more transition metals selected from chromium, molybdenum, zirconium, tantalum, tungsten, titanium and niobium, or further containing one or more elements selected from oxygen, nitrogen and carbon.

The light-shielding film may have a single-layer structure but preferably has a multilayer structure where plural materials are applied one on another. In the case of a multilayer structure, the film thickness per layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

Out of the materials above, when pattern formation is performed using a resist composition on a photomask blank having in the outermost surface layer thereof a material containing chromium and oxygen or nitrogen, a so-called undercut profile waist-shaped near the substrate is liable to be formed in general. However, when the present invention is used, the undercut problem can be improved as compared with the conventional mask blank.

Subsequently, this resist film is irradiated with an actinic ray or radiation (e.g., electron beam), preferably baked (usually at 80 to 150° C., preferably from 90 to 130° C. for usually 1 to 20 minutes, preferably 1 to 10 minutes), and then developer, whereby a good pattern can be obtained. Etching, ion implantation or the like is appropriately performed by using this pattern as the mask to produce, for example, a semiconductor fine circuit or an imprint mold structure.

Incidentally, the process when preparing an imprint mold by using the composition of the present invention is described, for example, in Japanese Patent 4,109,085, JP-A-2008-162101 and Yoshihiko Hirai (compiler), Nanoimprint no Kiso to Gijutsu Kaihatsu•Oyo Tenkai—Nanoimprint no Kiban Gijutsu to Saishin no Gijutsu Tenkai (Basic and Technology Expansion•Application Development of Nanoimprint—Fundamental Technology of Nanoimprint and Latest Technology Expansion), Frontier Shuppan.

The use mode of the positive resist composition of the present invention and the resist pattern forming method are described below.

The present invention also relates to a resist pattern forming method including exposing the above-described resist film or resist-coated mask blank and developing the exposed resist film or resist-coated mask blank. In the present invention, the exposure is preferably performed using an electron beam or an extreme-ultraviolet ray.

In the production or the like of a precision integrated circuit device, the exposure of the resist film (pattern forming step) is preferably performed by patternwise irradiating the resist film of the present invention with an electron beam or an extreme-ultraviolet ray (EUV). The exposure is performed with an exposure dose of, in the case of an electron beam, approximately from 0.1 to 20 μC/$cm^2$, preferably on the order of 3 to 15 μC/$cm^2$, and in the case of an extreme-ultraviolet ray, approximately from 0.1 to 20 mJ/$cm^2$, preferably on the order of 3 to 15 mJ/$cm^2$. Thereafter, post-exposure baking is performed on a hot plate at 60 to 150° C. for 1 to 20 minutes, preferably at 80 to 120° C. for 1 to 10 minutes, and subsequently, the resist film is developed, rinsed and dried, whereby a resist pattern is formed. The developer is an aqueous alkali solution in a concentration of preferably from 0.1 to 5 mass %, more preferably from 2 to 3 mass %, such as tetramethylammonium hydroxide (TMAH) and tetrabutylammonium hydroxide (TBAH), and the development is performed by a conventional method such as dip method, puddle method and spray method for preferably from 0.1 to 3 minutes, more preferably from 0.5 to 2 minutes. In the alkali developer, alcohols and/or a surfactant may be added each in an appropriate amount, if desired.

As such, with respect to the positive resist composition of the present invention, the exposed area is dissolved with the developer and the unexposed area is hardly dissolved with the developer, whereby an objective pattern is formed on the substrate.

The present invention also relates to a photomask obtained by exposing and developing the resist-coated mask blank. As for the exposure and development, the above-described steps are applied. The photomask is suitably used for the production of a semiconductor.

EXAMPLES

The present invention is described in greater detail below by referring to Examples, but the contents of the present invention are not limited thereto.

(I) Example as Chemical Amplification Positive Resist (Electron Beam)

1. Synthesis Example of Polymer Compound (A) (Component (A))<

Synthesis Example 1

Synthesis of Polymer Compound (P1)

In 120 mL of tetrahydrofuran, 20 g of poly(p-hydroxystyrene) (VP8000) (base polymer) produced by Nippon Soda Co., Ltd. was dissolved, and 2.02 g of triethylamine was added thereto. Subsequently, 6.11 g of 9-(chloro(methoxy) methyl-9H-fluorene (acetalizing agent) was added dropwise, and the mixture was stirred at room temperature for 8 hours. The reaction solution was transferred to a separating funnel, and 100 mL of ethyl acetate and 100 mL of distilled water were further added. After stirring, the aqueous layer was removed, and the organic layer was washed with 100 mL of distilled water three times. The organic layer was then concentrated, and the resulting reaction solution was added dropwise in 3 L of hexane. After filtration, the powder was collected and vacuum-dried to obtain 20.6 g of Polymer Compound (P1).

Polymer Compounds (P2) to (P6) and (P12) were synthesized in the same manner as Polymer Compound (P1) except for changing the acetalizing agent.

Also, Polymer Compounds (P7) to (P11) and (P13) were synthesized in the same manner as Polymer Compound (P1) except for changing the base polymer.

For comparison, Comparative Polymer Compounds (P1) and (P2) were synthesized in the same manner as Polymer Compound (P1).

With respect to the polymer compounds obtained, the compositional ratio (molar ratio) of the polymer compound was calculated by $^1$H-NMR measurement. Furthermore, the weight average molecular weight (Mw, in terms of polystyrene), number average molecular weight (Mn, in terms of polystyrene) and polydispersity (Mw/Mn, hereinafter sometimes referred to as "PDI") of the polymer compound were calculated by GPC (solvent: THF) measurement. In Table 1 below, the weight average molecular weight and the polydispersity are shown together with the chemical formula and compositional ratio of the polymer compound.

TABLE 1

| Polymer Compound | Chemical Formula | Compositional Ratio (molar ratio) | Weight Average Molecular Weight | Polydispersity |
|---|---|---|---|---|
| Polymer Compound (P1) | 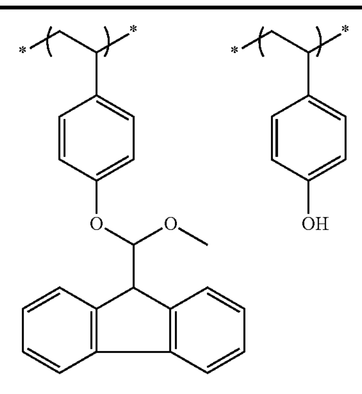 | 15/85 | 4000 | 1.1 |

TABLE 1-continued
| Polymer Compound | Chemical Formula | Compositional Ratio (molar ratio) | Weight Average Molecular Weight | Polydispersity |
|---|---|---|---|---|
| Polymer Compound (P2) | 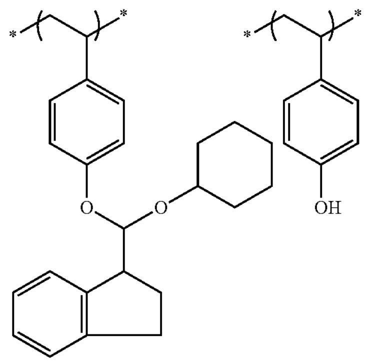 | 20/80 | 3800 | 1.1 |
| Polymer Compound (P3) | 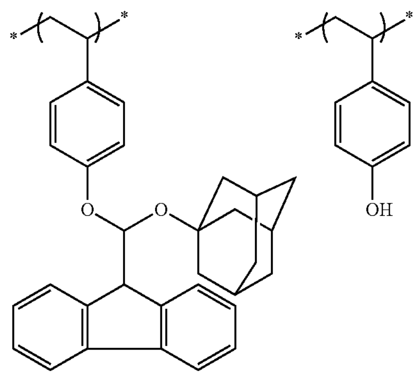 | 12/88 | 3500 | 1.1 |
| Polymer Compound (P4) | 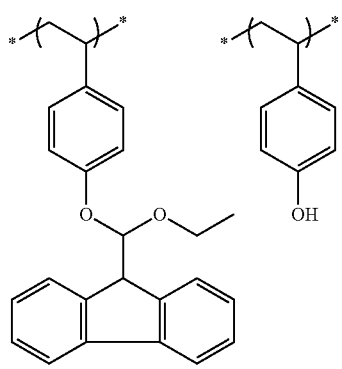 | 20/80 | 3500 | 1.1 |
| Polymer Compound (P5) | 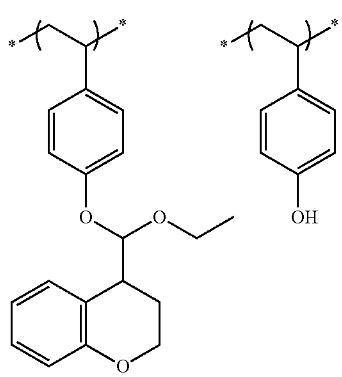 | 20/80 | 3500 | 1.1 |

TABLE 1-continued
| Polymer Compound | Chemical Formula | Compositional Ratio (molar ratio) | Weight Average Molecular Weight | Polydispersity |
|---|---|---|---|---|
| Polymer Compound (P6) | 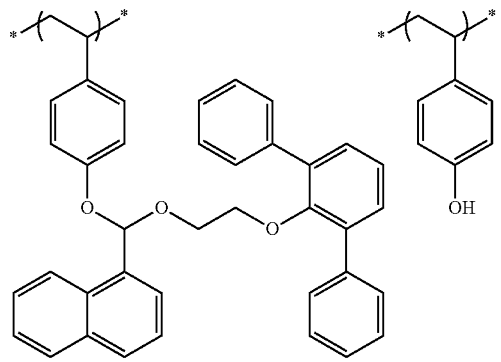 | 10/90 | 4000 | 1.1 |
| Polymer Compound (P7) | 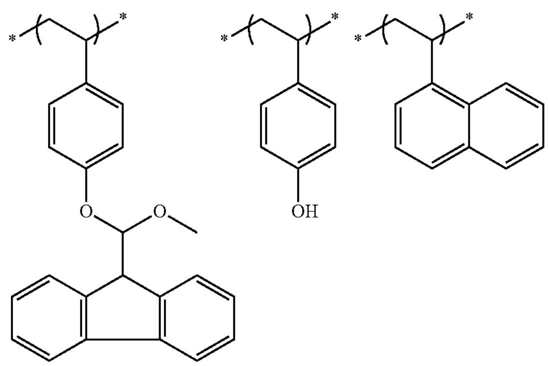 | 15/80/5 | 6000 | 1.5 |
| Polymer Compound (P8) | 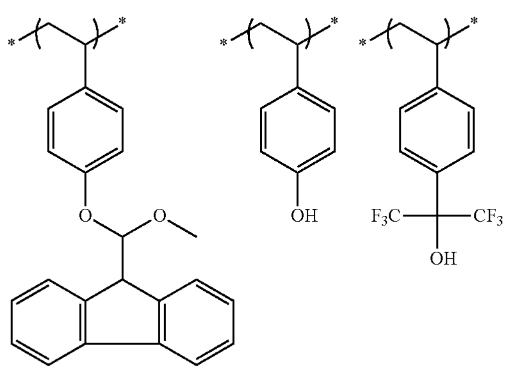 | 10/80/10 | 8000 | 1.5 |
| Polymer Compound (P9) | 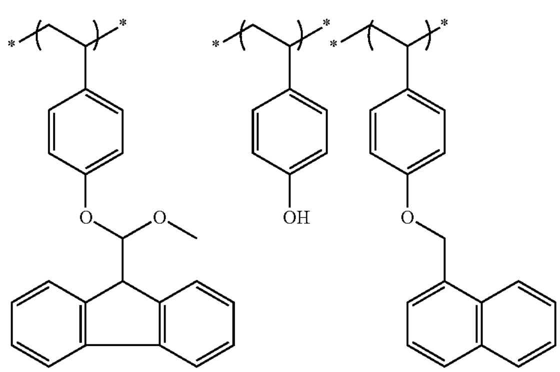 | 15/80/5 | 6000 | 1.1 |

TABLE 1-continued
| Polymer Compound | Chemical Formula | Compositional Ratio (molar ratio) | Weight Average Molecular Weight | Polydispersity |
|---|---|---|---|---|
| Polymer Compound (P10) | 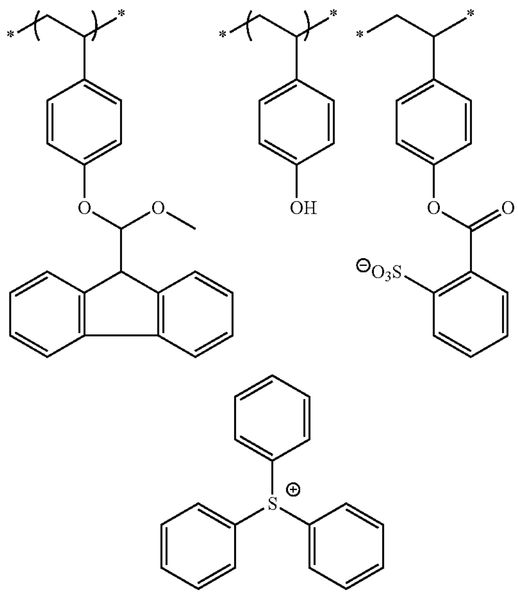 | 15/80/5 | 4000 | 1.1 |
| Polymer Compound (P11) | 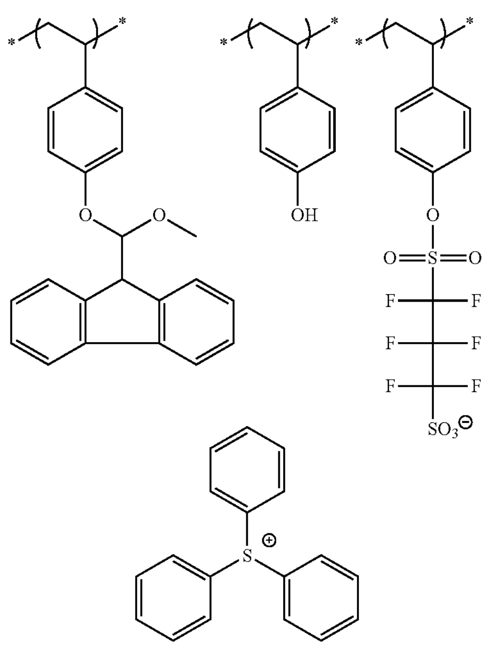 | 15/80/5 | 5000 | 1.5 |

TABLE 1-continued
| Polymer Compound | Chemical Formula | Compositional Ratio (molar ratio) | Weight Average Molecular Weight | Polydispersity |
| --- | --- | --- | --- | --- |
| Polymer Compound (P12) | 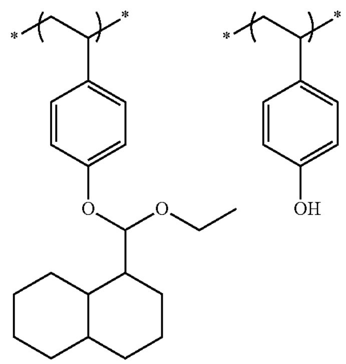 | 15/85 | 4000 | 1.1 |
| Polymer Compound (P13) | 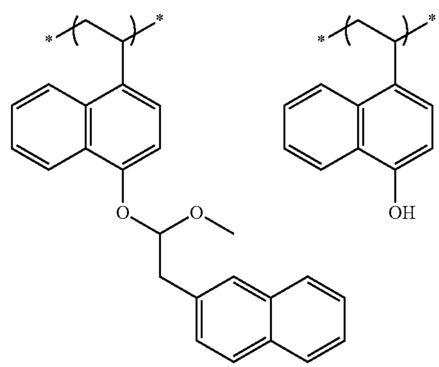 | 10/90 | 3800 | 1.1 |
| Comparative Polymer Compound (P1) | 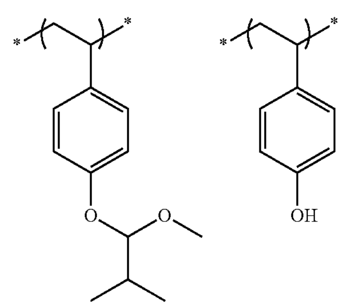 | 30/70 | 8800 | 1.5 |
| Comparative Polymer Compound (P2) | 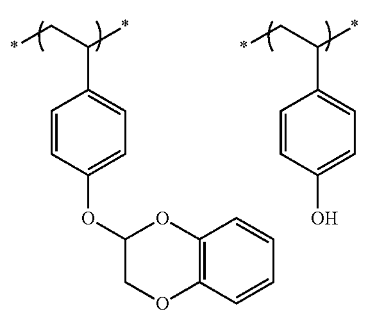 | 30/70 | 9100 | 1.5 |

2. Example

Example 1P (1) Preparation of Support

A Cr oxide-deposited 6-inch wafer (a wafer subjected to a treatment of forming a shielding film, which is used for normal photomask) was prepared.

(2) Preparation of Resist Coating Solution

| (Coating Solution Formulation of Positive Resist Composition P1) | |
|---|---|
| Polymer Compound (P1) | 0.60 g |
| Photoacid Generator (z5) (the structural formula is shown below) | 0.12 g |
| Tetrabutylammonium hydroxide (basic compound) | 0.002 g |
| Surfactant PF6320 (produced by OMNOVA) | 0.001 g |
| Propylene glycol monomethyl ether acetate (solvent) | 9.0 g |

The solution of the formulation above was microfiltered through a membrane filter having a pore size of 0.04 μm to obtain a resist coating solution.

(3) Preparation of Resist Film

The resist coating solution was applied on the 6-inch wafer by using a spin coater, Mark 8, manufactured by Tokyo Electron Ltd. and dried at 110° C. for 90 seconds on a hot plate to obtain a resist film having a thickness of 100 nm. That is, a resist-coated mask blank was obtained.

(4) Production of Positive Resist Pattern

This resist film was irradiated with a pattern by using an electron beam lithography device (HL750 manufactured by Hitachi, Ltd., accelerating voltage: 50 KeV). After the irradiation, the resist film was heated at 120° C. for 90 seconds on a hot plate, dipped in an aqueous 2.38 mass % tetramethylammonium hydroxide (TMAH) solution for 60 seconds, rinsed with water for 30 seconds and dried.

(5) Evaluation of Resist Pattern

The obtained pattern was evaluated for the sensitivity, resolution, pattern profile, line edge roughness (LER) and dry etching resistance by the following methods.

[Sensitivity]

The cross-sectional profile of the pattern obtained was observed using a scanning electron microscope (S-4300, manufactured by Hitachi, Ltd.), and the exposure dose (dose of electron beam irradiation) when resolving a resist pattern with a line width of 100 nm (line:space=1:1) was taken as the sensitivity. A smaller value indicates higher sensitivity.

[Evaluation of Resolution (LS)]

The limiting resolution (the minimum line width when the line and the space (line:space=1:1) were separated and resolved) at the exposure dose (dose of electron beam irradiation) giving the sensitivity above was taken as the LS resolution.

[Evaluation of Resolution (IL)]

The limiting resolution (the minimum line width when the line and the space (line:space=1:>100) were separated and resolved) at the minimum irradiation dose when resolving an isolated line pattern with a line width of 100 nm (space: line=1:>100) was taken as the IL resolution (nm).

[Pattern Profile]

The cross-sectional profile of the line pattern with a line width of 100 nm (L/S=1/1) at the exposure dose (dose of electron beam irradiation) giving the sensitivity above was observed by a scanning electron microscope (S-4300, manufactured by Hitachi, Ltd.). The cross-sectional profile of the line pattern was rated "forward taper" when the ratio represented by [line width in the bottom part (base part) of line pattern/line width in the middle of line pattern (the position of half the height of line pattern)] is 1.5 or more, rated "slightly forward taper" when the ratio above is from 1.2 to less than 1.5, and rated "rectangle" when the ratio is less than 1.2.

[Line Edge Roughness (LER)]

A line pattern (L/S=1/1) having a line width of 100 nm was formed with the irradiation dose (dose of electron beam irradiation) giving the sensitivity above. At arbitrary 30 points included in its longitudinal 50 μm region, the distance from the reference line where the edge should be present was measured using a scanning electron microscope (S-9220, manufactured by Hitachi, Ltd.). The standard deviation of the measured distances was determined, and 3σ was computed. A smaller value indicates better performance.

[Evaluation of Dry Etching Resistance]

An unexposed resist film was subjected to dry etching for 30 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very Good: Residual film ratio of 95% or more.

Good: From 90% to less than 95%.

Bad: Less than 90%.

Example 2P to Example 22P, Comparative Example 1P and Comparative Example 2P

Preparation of the resist solutions (Positive Resist Compositions P2 to P22 and Comparative Positive Resist Compositions P1 and P2), positive pattern formation and evaluations thereof were performed in the same manner as in Example 1P except that in the resist solution formulation, components in Table 2 below were used.

TABLE 2

(Electron Beam Exposure; Positive)

| Composition | Polymer Compound | Acid Generator | Basic Compound | Solvent |
|---|---|---|---|---|
| P1 | P1<br>(0.6 g) | z5<br>(0.12 g) | B1<br>(0.002 g) | S1<br>(9.0 g) |
| P2 | P2<br>(0.6 g) | z5<br>(0.12 g) | B1<br>(0.002 g) | S2/S1<br>(5.0 g/4.0 g) |
| P3 | P3<br>(0.6 g) | z5<br>(0.12 g) | B1<br>(0.002 g) | S2/S3<br>(5.0 g/4.0 g) |
| P4 | P4<br>(0.6 g) | z5<br>(0.12 g) | B1<br>(0.002 g) | S2/S1<br>(5.0 g/4.0 g) |

TABLE 2-continued

| (Electron Beam Exposure; Positive) | | | | |
|---|---|---|---|---|
| Composition | Polymer Compound | Acid Generator | Basic Compound | Solvent |
| P5 | P5 (0.6 g) | z5 (0.12 g) | B1 (0.002 g) | S2/S1 (5.0 g/4.0 g) |
| P6 | P6 (0.6 g) | z5 (0.12 g) | B1 (0.002 g) | S2/S4 (5.0 g/4.0 g) |
| P7 | P7 (0.6 g) | z5 (0.12 g) | B1 (0.002 g) | S2/S5 (5.0 g/4.0 g) |
| P8 | P8 (0.6 g) | z5 (0.12 g) | B1 (0.002 g) | S2/S1 (5.0 g/4.0 g) |
| P9 | P9 (0.6 g) | z5 (0.12 g) | B1 (0.002 g) | S2/S3 (5.0 g/4.0 g) |
| P10 | P10 (0.72 g) | none | B1 (0.002 g) | Sl/S3 (5.0 g/4.0 g) |
| P11 | P11 (0.72 g) | none | B1 (0.001 g) | S2/S3 (5.0 g/4.0 g) |
| P12 | P1 (0.6 g) | z8/z48 (0.06 g/0.06 g) | B2 (0.008 g) | S2/S6 (5.0 g/4.0 g) |
| P13 | P1/P3 (0.3 g/0.3 g) | z37 (0.12 g) | B3 (0.002 g) | S2/S1 (5.0 g/4.0 g) |
| P14 | P9 (0.6 g) | z42 (0.12 g) | B6 (0.002 g) | S2/S1 (5.0 g/4.0 g) |
| P15 | P9 (0.6 g) | z37/z66 (0.06 g/0.06 g) | B4 (0.002 g) | S2/S1 (5.0 g/4.0 g) |
| P16 | P9 (0.6 g) | z61 (0.12 g) | B1 (0.002 g) | S2/S1 (5.0 g/4.0 g) |
| P17 | P9 (0.6 g) | z63 (0.12 g) | B1 (0.002 g) | S2/S1 (5.0 g/4.0 g) |
| P18 | P9 (0.6 g) | z65 (0.12 g) | B1 (0.002 g) | S2/S1 (5.0 g/4.0 g) |
| P19 | P9 (0.6 g) | z2/z45 (0.06 g/0.06 g) | B5 (0.002 g) | S2/S1 (5.0 g/4.0 g) |
| P20 | P9 (0.6 g) | z67 (0.12 g) | B1/B6 (0.001 g/0.001 g) | S2/Sl (5.0 g/4.0 g) |
| P21 | P12 (0.6 g) | z5 (0.12 g) | B1 (0.002 g) | S2/S1 (5.0 g/4.0 g) |
| P22 | P13 (0.6 g) | z5 (0.12 g) | B1 (0.002 g) | S2/S1 (5.0 g/4.0 g) |
| Comparative Composition P1 | Comparative Polymer Compound (P1) (0.6 g) | z48 (0.12 g) | B2 (0.002 g) | S1 (9.0 g) |
| Comparative Composition P2 | Comparative Polymer Compound (P2) (0.6 g) | z48 (0.12 g) | B2 (0.002 g) | S1 (9.0 g) |

Abbreviations used in the above and following Examples/Comparative Examples are described below.

[Acid Generator (Compound (B))]

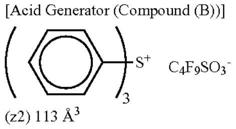

(z2) 113 Å$^3$

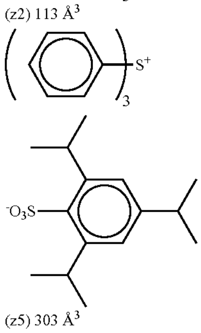

(z5) 303 Å$^3$

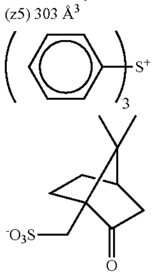

TABLE 2-continued
(Electron Beam Exposure; Positive)
| Composition | Polymer Compound | Acid Generator | Basic Compound | Solvent |
|---|---|---|---|---|
(z8) 216 Å$^3$
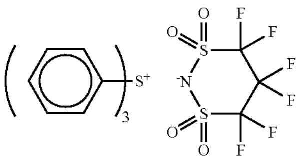
(z37) 136 Å$^3$
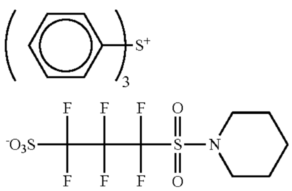
(z42) 244 Å$^3$
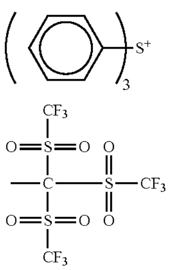
(z45) 189 Å$^3$
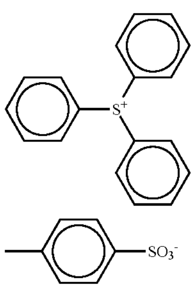
(z48) 186 Å$^3$
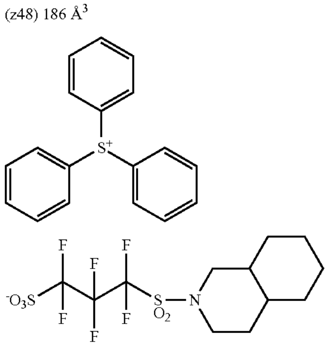
(z61) 311 Å$^3$
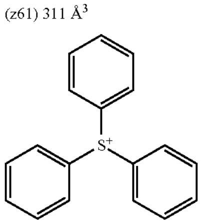

TABLE 2-continued
(Electron Beam Exposure; Positive)
| Composition | Polymer Compound | Acid Generator | Basic Compound | Solvent |
| --- | --- | --- | --- | --- |
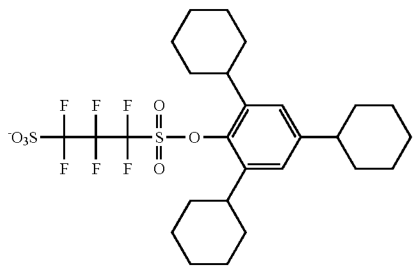
(z63) 535 Å$^3$
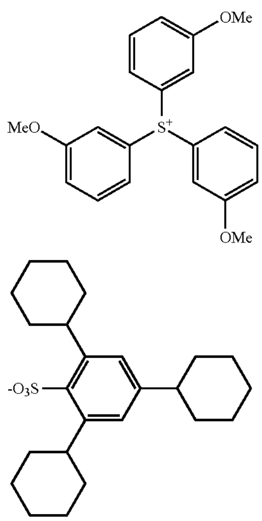
(z65) 437 Å$^3$
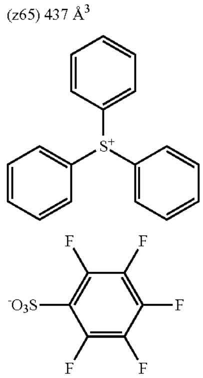
(z66) 127 Å$^3$
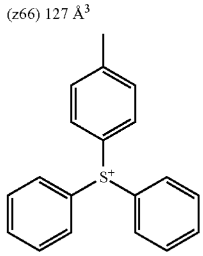

TABLE 2-continued

| (Electron Beam Exposure; Positive) | | | | |
|---|---|---|---|---|
| Composition | Polymer Compound | Acid Generator | Basic Compound | Solvent |

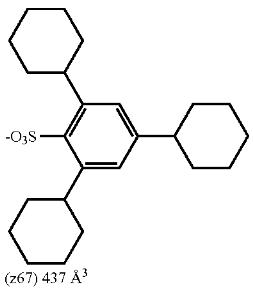

(z67) 437 Å$^3$

[Basic Compound]

B1: Tetrabutylammonium hydroxide

B2: Tri-n-octylamine

B3: 2,4,5-Triphenylimidazole

B4:

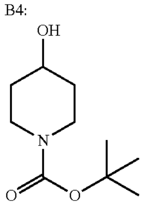

B5:

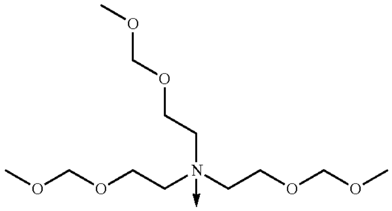

B6:

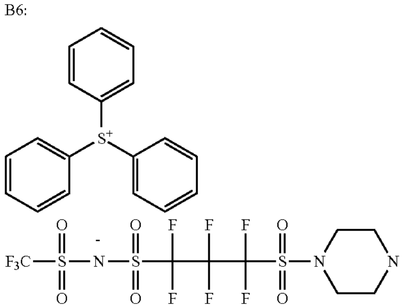

[Solvent]

S1: Propylene glycol monomethyl ether acetate (1-methoxy-2-acetoxypropane)

S2: Propylene glycol monomethyl ether (1-methoxy-2-propanol)

S3: 2-Heptanone

S4: Ethyl lactate

S5: Cyclohexanone

S6: Propylene carbonate

The evaluation results are shown in Table 3.

TABLE 3

| (Electron Beam Exposure; Positive) | | | | | | | |
|---|---|---|---|---|---|---|---|
| Example | Composition | Sensitivity ($\mu C/cm^2$) | LS Resolution (nm) | IL Resolution (nm) | Pattern Profile | LER (nm) | Dry Etching Resistance |
| 1P | P1 | 10.8 | 50 | 45 | rectangle | 4.5 | very good |
| 2P | P2 | 10.8 | 50 | 45 | rectangle | 4.5 | good |
| 3P | P3 | 10.8 | 50 | 45 | rectangle | 4.5 | very good |

TABLE 3-continued

| (Electron Beam Exposure; Positive) | | | | | | | |
|---|---|---|---|---|---|---|---|
| Example | Composition | Sensitivity ($\mu C/cm^2$) | LS Resolution (nm) | IL Resolution (nm) | Pattern Profile | LER (nm) | Dry Etching Resistance |
| 4P | P4 | 10.7 | 50 | 45 | rectangle | 4.5 | very good |
| 5P | P5 | 10.8 | 50 | 45 | rectangle | 4.5 | good |
| 6P | P6 | 10.8 | 50 | 45 | rectangle | 4.5 | good |
| 7P | P7 | 10.7 | 50 | 45 | rectangle | 5.0 | very good |
| 8P | P8 | 10.8 | 50 | 45 | rectangle | 5.0 | very good |
| 9P | P9 | 10.9 | 50 | 45 | rectangle | 4.5 | very good |
| 10P | P10 | 9.5 | 50 | 45 | rectangle | 4.5 | very good |
| 11P | P11 | 9.4 | 50 | 45 | rectangle | 5.0 | very good |
| 12P | P12 | 10.8 | 55 | 55 | rectangle | 4.5 | very good |
| 13P | P13 | 10.7 | 55 | 55 | rectangle | 4.5 | very good |
| 14P | P14 | 10.8 | 50 | 45 | rectangle | 4.5 | very good |
| 15P | P15 | 10.8 | 55 | 55 | rectangle | 4.5 | very good |
| 16P | P16 | 10.6 | 50 | 45 | rectangle | 4.5 | very good |
| 17P | P17 | 10.8 | 50 | 45 | rectangle | 4.5 | very good |
| 18P | P18 | 10.6 | 50 | 45 | rectangle | 4.5 | very good |
| 19P | P19 | 10.5 | 55 | 55 | rectangle | 4.5 | very good |
| 20P | P20 | 10.5 | 50 | 45 | rectangle | 4.5 | very good |
| 21P | P21 | 11.5 | 50 | 45 | rectangle | 4.5 | good |
| 22P | P22 | 10.5 | 50 | 45 | rectangle | 4.5 | good |
| Comparative Example 1P | Comparative Composition P1 | 12.9 | 70 | 80 | forward taper | 6.0 | bad |
| Comparative Example 2P | Comparative Composition P2 | 12.9 | 70 | 80 | slightly forward taper | 6.0 | Bad |

It is seen from the results shown in Table 3 that the composition according to the present invention is excellent in the sensitivity, resolution, pattern profile, LER and dry etching resistance.

(II) Example as Chemical Amplification Positive Resist (EUV)

Examples 1Q to 7Q and Comparative Examples 1Q and 2Q

Preparation of Resist Solution

The positive resist composition shown in Table 4 below was filtered through a polytetrafluoroethylene filter having a pore size of 0.04 μm to prepare a positive resist solution.

(Evaluation of Resist)

The positive resist solution prepared was uniformly applied on a hexamethyldisilazane-treated silicon substrate by using a spin coater and dried under heating on a hot plate at 100° C. for 60 seconds to form a resist film having a thickness of 0.05 μm.

The obtained resist film was evaluated for the sensitivity, resolution, pattern profile, line edge roughness (LER) and dry etching resistance by the following methods.

[Sensitivity]

The obtained resist film was exposed to EUV light (wavelength: 13 nm) through a 6% halftone mask having a 1:1 line-and-space pattern with a line width of 100 nm by changing the exposure dose in steps of 0.1 $mJ/cm^2$ in the range of 0 to 20.0 $mJ/cm^2$, then baked at 110° C. for 90 seconds and developed with an aqueous 2.38 mass % tetramethylammonium hydroxide (TMAH) solution.

The exposure dose when reproducing a line-and-space (L/S=1/1) mask pattern with a line width of 100 nm was taken as the sensitivity. A smaller value indicates higher sensitivity.

[Resolution (LS)]

The limiting resolution (the minimum line width when the line and the space (line:space=1:1) were separated and resolved) at the exposure dose giving the sensitivity above was taken as the LS resolution (nm).

[Evaluation of Pattern Profile]

The cross-sectional profile of the line pattern (L/S=1/1) with a line width of 100 nm at the exposure dose giving the sensitivity above was observed by a scanning electron microscope (S-4300, manufactured by Hitachi, Ltd.). The cross-sectional profile of the line pattern was rated "forward taper" when the ratio represented by [line width in the bottom part (base part) of line pattern/line width in the middle of line pattern (the position of half the height of line pattern)] is 1.5 or more, rated "slightly forward taper" when the ratio above is from 1.2 to less than 1.5, and rated "rectangle" when the ratio is less than 1.2.

[Line Edge Roughness (LER)]

At arbitrary 30 points included in the longitudinal 50 μm region of a line pattern (L/S=1/1) having a line width of 100 nm at the exposure dose giving the sensitivity above, the distance from the reference line where the edge should be present was measured using a scanning electron microscope (S-9220, manufactured by Hitachi, Ltd.). The standard deviation thereof was determined, and 3σ was computed. A smaller value indicates better performance.

[Evaluation of Dry Etching Resistance]

An unexposed resist film was subjected to dry etching for 15 seconds by using an $Ar/C_4F_6/O_2$ gas (a mixed gas in a volume ratio of 100/4/2) in HITACHI U-621. Thereafter, the residual resist film ratio was measured and used as an indicator of dry etching resistance.

Very Good: Residual film ratio of 95% or more.

Good: From 90% to less than 95%.

Bad: Less than 90%.

The evaluation results are shown in Table 4.

TABLE 4

| (EUV Exposure; Positive) | | | | | | |
|---|---|---|---|---|---|---|
| Example | Composition | Sensitivity ($mJ/cm^2$) | Resolution (nm) | Pattern Profile | LER (nm) | Dry Etching Resistance |
| 1Q | P1 | 10.8 | 45 | rectangle | 4.5 | very good |
| 2Q | P2 | 10.8 | 45 | rectangle | 4.5 | good |
| 3Q | P3 | 10.8 | 45 | rectangle | 4.5 | very good |
| 4Q | P7 | 11.5 | 45 | rectangle | 5.0 | very good |
| 5Q | P9 | 10.8 | 45 | rectangle | 4.5 | very good |
| 6Q | P10 | 9.5 | 45 | rectangle | 4.5 | very good |
| 7Q | P11 | 9.5 | 45 | rectangle | 5.0 | very good |
| Comparative Example 1Q | Comparative Composition P1 | 12.9 | 70 | forward taper | 6.5 | bad |
| Comparative Example 2Q | Comparative Composition P2 | 12.9 | 70 | slightly forward taper | 6.0 | bad |

It is seen from the results shown in Table 4 that the composition according to the present invention is excellent in the sensitivity, resolution, pattern profile, line edge roughness (LER) and dry etching resistance.

INDUSTRIAL APPLICABILITY

According to the present invention, a positive resist composition capable of forming a pattern satisfying high sensitivity, high resolution property (for example, high resolution, excellent pattern profile and small line edge roughness (LER)) and good dry etching resistance all at the same time, and a resist film, a resist-coated mask blank, a resist pattern forming method and a photomask each using the composition can be provided.

This application is based on Japanese patent application No. JP 2011-107702 filed on May 12, 2011, the entire content of which is hereby incorporated by reference, the same as if set forth at length.

The invention claimed is:

1. A positive resist composition, comprising:

(A) a polymer compound having a structure where a hydrogen atom of a phenolic hydroxyl group is replaced by an acid labile group represented by the following formula (I):

(I)

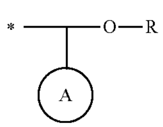

wherein R represents a monovalent organic group;

A represents a group having a polycyclic hydrocarbon ring structure or a group having a polycyclic heterocyclic structure; and

* represents a bonding position to an oxygen atom of the phenolic hydroxyl group.

2. The positive resist composition according to claim 1, wherein the group represented by A in formula (I) has a structure represented by the following formula (III) as the polycyclic hydrocarbon ring structure or polycyclic heterocyclic structure:

(III)

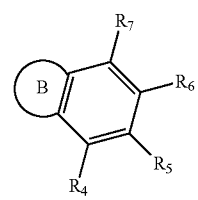

wherein B represents an aliphatic hydrocarbon ring, an aliphatic heterocyclic ring, an aromatic hydrocarbon ring or an aromatic heterocyclic ring; and each of $R_4$ to $R_7$ independently represents a hydrogen atom or a substituent.

3. The positive resist composition according to claim 1, wherein the polymer compound (A) contains a repeating unit represented by the following formula (II):

(II)

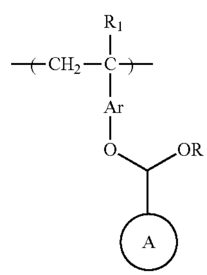

wherein $R_1$ represents a hydrogen atom, an alkyl group or a halogen atom;

Ar represents a divalent aromatic group;

R represents a monovalent organic group; and

A represents a group having a polycyclic hydrocarbon ring structure or a group having a polycyclic heterocyclic structure.

4. The positive resist composition according to claim 3, wherein the group represented by A in formula (II) has a structure represented by the following formula (III) as the polycyclic hydrocarbon ring structure or polycyclic heterocyclic structure:

(III)

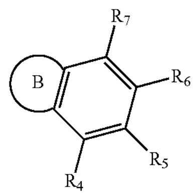

wherein B represents an aliphatic hydrocarbon ring, an aliphatic heterocyclic ring, an aromatic hydrocarbon ring or an aromatic heterocyclic ring; and each of $R_4$ to $R_7$ independently represents a hydrogen atom or a substituent.

5. The positive resist composition according to claim 1, wherein the polymer compound (A) further contains a repeating unit represented by the following formula (VII):

(VII)

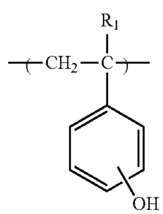

wherein $R_2$ represents a hydrogen atom, an alkyl group or a halogen atom.

6. The positive resist composition according to claim 1, wherein a polydispersity of the polymer compound (A) is from 1.0 to 1.2.

7. The positive resist composition according to claim 1, which is for electron beam or extreme-ultraviolet exposure.

8. A resist film, which is formed from the positive resist composition according to claim 1.

9. A resist-coated mask blank, which is coated with the resist film according to claim 8.

10. A resist pattern forming method, comprising:

exposing the resist film according to claim 8, so as to form an exposed film; and developing the exposed film.

11. A resist pattern forming method, comprising:

exposing the resist-coated mask blank according to claim 9, so as to form an exposed resist-coated mask blank; and developing the exposed resist-coated mask blank.

12. The resist pattern forming method according to claim 10, wherein the exposure is performed using an electron beam or an extreme-ultraviolet ray.

13. A photomask, which is obtained by exposing and developing the resist-coated mask blank according to claim 9.

* * * * *